(12) United States Patent
Yao et al.

(10) Patent No.: US 12,382,805 B2
(45) Date of Patent: Aug. 5, 2025

(54) DISPLAY SUBSTRATE WITH MULTIPLE SIGNAL LINES ARRANGED IN ONE SHIFT REGISTER UNIT AND DISPLAY DEVICE

(71) Applicants: Beijing BOE Technology Development Co., Ltd., Beijing (CN); BOE TECHNOLOGY GROUP CO., LTD., Beijing (CN)

(72) Inventors: Xing Yao, Beijing (CN); Xueguang Hao, Beijing (CN); Yong Qiao, Beijing (CN); Jingquan Wang, Beijing (CN); Xinyin Wu, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/682,189

(22) PCT Filed: Jan. 31, 2023

(86) PCT No.: PCT/CN2023/073963
§ 371 (c)(1),
(2) Date: Feb. 8, 2024

(87) PCT Pub. No.: WO2023/098927
PCT Pub. Date: Jun. 8, 2023

(65) Prior Publication Data
US 2024/0373701 A1 Nov. 7, 2024

(30) Foreign Application Priority Data
Dec. 3, 2021 (CN) .......................... 202111465296.0

(51) Int. Cl.
G11C 19/28 (2006.01)
H10K 59/131 (2023.01)
(Continued)

(52) U.S. Cl.
CPC ......... *H10K 59/131* (2023.02); *G11C 19/287* (2013.01); *G09G 3/3266* (2013.01);
(Continued)

(58) Field of Classification Search
CPC ......... G09G 2310/0286; G09G 3/3266; G09G 3/3674; G11C 19/287
See application file for complete search history.

(56) References Cited

U.S. PATENT DOCUMENTS

2007/0195043 A1    8/2007  Furuic et al.
2008/0252622 A1*  10/2008  Tai ........................ G09G 3/3674
                                                                    345/204
(Continued)

FOREIGN PATENT DOCUMENTS

CN    103941507 A    7/2014
CN    104680990 A    6/2015
(Continued)

*Primary Examiner* — Yuzhen Shen
(74) *Attorney, Agent, or Firm* — Muncy, Geissler, Olds & Lowe, P.C.

(57) ABSTRACT

A display substrate includes a base substrate including a display area and a peripheral area on at least one side of the display area; a pixel array, located in the display area and including multiple pixel units; and, a scan driving module, located in a driving circuit area of the peripheral area, and including multiple shift register units, multiple signal lines being arranged in one shift register units, and extending along a first direction; wherein a ratio of a sum W1 of widths of the multiple signal lines in a second direction to a width W2 of the shift register unit in the second direction is W1/W2, and a length of at least one pixel unit along the first direction is a pixel pitch value; the first direction intersects the second direction; a product of W1/W2 and the pixel pitch value is greater than 18 um and less than 40 um.

20 Claims, 45 Drawing Sheets

(51) Int. Cl.
 *G09G 3/3266* (2016.01)
 *H10K 59/121* (2023.01)
(52) U.S. Cl.
 CPC ........... *G09G 2300/0426* (2013.01); *G09G 2310/0286* (2013.01); *H10K 59/1213* (2023.02)

(56) References Cited

U.S. PATENT DOCUMENTS

| | | | |
|---|---|---|---|
| 2017/0249916 A1* | 8/2017 | Jen | H10D 86/441 |
| 2021/0407426 A1* | 12/2021 | Zeng | G11C 19/28 |
| 2022/0302240 A1* | 9/2022 | Zhang | H10K 59/131 |

FOREIGN PATENT DOCUMENTS

| | | | | |
|---|---|---|---|---|
| CN | 206619595 U | | 11/2017 | |
| CN | 108649063 A | | 10/2018 | |
| CN | 109994069 A | | 7/2019 | |
| CN | 110767665 A | * | 2/2020 | ........... G09G 3/3233 |
| CN | 112599067 A | | 4/2021 | |
| CN | 112771599 A | * | 5/2021 | ........... G02F 1/1343 |
| CN | 214541584 U | | 10/2021 | |
| CN | 113724667 A | | 11/2021 | |
| CN | 214588040 U | | 11/2021 | |
| CN | 113870796 A | | 12/2021 | |
| JP | 2012168359 A | | 9/2012 | |
| WO | WO2021031166 A1 | | 2/2021 | |
| WO | WO2021031167 A1 | | 2/2021 | |
| WO | WO2021097710 A1 | | 5/2021 | |

* cited by examiner

FIG. 7F

DISPLAY SUBSTRATE WITH MULTIPLE SIGNAL LINES ARRANGED IN ONE SHIFT REGISTER UNIT AND DISPLAY DEVICE

CROSS-REFERENCE TO RELATED APPLICATION

This application is the U.S. national phase of PCT Application No. PCT/CN2023/073963 filed on Jan. 31, 2023, which claims priorities of the Chinese patent application No. 202111465296.0 filed on Dec. 3, 2021, which are incorporated herein by reference in their entireties.

TECHNICAL FIELD

The present disclosure relates to the field of display technology, in particular to a display substrate and a display device.

BACKGROUND

In Organic Light Emitting Diode (OLED) display products in the related art, the shift register unit is coupled to a gate scan control signal terminal or a light emitting control scan signal terminal in the pixel unit, to provide a gate scan driving signal or a light emitting control scan signal. As the pixel resolution is gradually increased, the pixel pitch value is gradually reduced, and the layout space for setting the shift register unit is also gradually reduced. Related display products cannot achieve narrow bezels while achieving high resolution.

SUMMARY

The object of the present disclosure is to provide a display panel and a display device, so as to solve the problem that related display products cannot achieve narrow bezels while achieving high resolution.

In order to achieve this object, an embodiment of the present disclosure provides a display substrate, including: a base substrate including a display area and a peripheral area located on at least one side of the display area; a pixel array, located in the display area and including a plurality of pixel units; and, a scan driving module, located in a driving circuit area of the peripheral area, and including a plurality of shift register units, a plurality of signal lines being arranged in one shift register unit of the plurality of shift register units, and the plurality of signal lines extending along a first direction; wherein a ratio of a sum W1 of widths of the plurality of signal lines in a second direction to a width W2 of the shift register unit in the second direction is W1/W2, and a length of at least one pixel unit along the first direction is a pixel pitch value; the first direction intersects the second direction; a product of W1/W2 and the pixel pitch value is greater than 18 um and less than 40 um.

Optionally, the plurality of signal lines include all signal lines in the shift register unit.

Optionally, the plurality of signal lines include all signal lines overlapping an orthographic projection of the shift register unit on the base substrate.

Optionally, W1/W2 is greater than 0.4 and less than 0.7.

Optionally, a product of W1/W2 and the pixel pitch value is greater than 27 um and less than 36 um.

Optionally, a product of W1/W2 and the pixel pitch value is greater than 18 um and less than or equal to 27 um.

Optionally, a product of W1/W2 and the pixel pitch value is greater than or equal to 36 um and less than 40 um.

Optionally, a product of W1/W2 and the pixel pitch value is greater than 29 um and less than 35 um.

Optionally, the display substrate comprises a first conductive layer, an insulating layer, and a second conductive layer, and the insulating layer is arranged between the first conductive layer and the second conductive layer; at least one signal line of the plurality of signal lines is arranged on the first conductive layer, and at least one signal line of the plurality of signal lines is arranged on the second conductive layer.

Optionally, the shift register unit includes at least one transistor arranged in the driving circuit area, a first electrode of the transistor, a second electrode of the transistor and the plurality of signals lines are arranged on a same layer.

Optionally, the shift register unit includes at least one transistor arranged in the driving circuit area, a first electrode of the transistor and a second electrode of the transistor are arranged on a same layer, and the plurality of signal lines and the first electrode of the transistor are arranged at different layers.

Optionally, the shift register unit includes at least one signal line arranged in the driving circuit area, the at least one signal line is configured to provide a DC power signal; a ratio W3/W2 of a width W3 of the at least one signal line in the second direction to the width W2 of the shift register unit in the second direction is greater than or equal to 0.15.

Optionally, the shift register unit includes at least one signal line arranged in the driving circuit area, the at least one signal line is configured to provide the DC power signal; the ratio W3/W2 of the width W3 of the at least one signal line in the second direction to the width W2 of the shift register unit in the second direction is greater than or equal to 0.3.

Optionally, the shift register unit comprises at least one signal line arranged in the driving circuit area, the at least one signal line is configured to provide a clock signal; a ratio W4/W2 of a width W4 of the at least one signal line in the second direction to the width W2 of the shift register unit in the second direction is greater than or equal to 0.015.

Optionally, the shift register unit comprises at least one signal line arranged in the driving circuit area, the at least one signal line is configured to provide the clock signal; the ratio W4/W2 of the width W4 of the at least one signal line in the second direction to the width W2 of the shift register unit in the second direction is greater than or equal to 0.03.

Optionally, the shift register unit comprises at least two transistors arranged in the driving circuit area; active layers of the at least two transistors are formed by a continuous semiconductor layer, and an orthographic projection of one signal line of the plurality of signal lines on the base substrate partially overlaps an orthographic projection of the semiconductor layer on the base substrate.

Optionally, the shift register unit comprises a fourth transistor, a fifth transistor, an eighth transistor and a thirteenth transistor; a second electrode of the fourth transistor is coupled to a second electrode of the fifth transistor, a second electrode of the eighth transistor, a first electrode of the fifth transistor, and a first electrode of the thirteenth transistor are coupled to each other; an active layer of the fourth transistor, an active layer of the fifth transistor, an active layer of the thirteenth transistor, and an active layer of the eighth transistor are formed by a continuous first semiconductor layer; an orthographic projection of the active layer of the fourth transistor on the base substrate, an orthographic projection of the active layer of the fifth transistor on the base substrate, an orthographic projection of the active layer of the eighth transistor on the base substrate and an orthographic projection of a part of the active layer of the thirteenth transistor on the base substrate together form an E-type pattern or an F-type pattern; the orthographic projection of the active layer of the fourth transistor on the base substrate and the orthographic projection of the active layer of the fifth transistor on the base substrate together form an L-type pattern.

Optionally, the shift register unit comprises a plurality of signal lines, and the plurality of signal lines comprises a first voltage line; an orthographic projection of the first voltage line on the base substrate partially overlaps an orthographic projection of the first semiconductor layer on the base substrate.

Optionally, the shift register unit comprises the plurality of signal lines, and the plurality of signal lines comprises a second clock signal line; an orthographic projection of the second clock signal line on the base substrate partially overlaps the orthographic projection of the first semiconductor layer on the base substrate.

Optionally, a channel of the fourth transistor extends along the second direction, a channel of the fifth transistor extends along the first direction, a channel of the thirteenth transistor extends along the second direction, and a channel of the eighth transistor extends along the first direction.

Optionally, the shift register unit comprises a second transistor and a third transistor; a second electrode of the second transistor is coupled to a second electrode of the third transistor; an active layer of the second transistor and an active layer of the third transistor are formed by a continuous fourth semiconductor layer, and an orthographic projection of the active layer of the second transistor on the base substrate and an orthographic projection of the active layer of the third transistor on the base substrate together form an I-type pattern.

Optionally, a channel of the second transistor extends along the first direction, and a channel of the third transistor extends along the first direction.

Optionally, the shift register unit comprises a second transistor, a third transistor and an eleventh transistor; a second electrode of the second transistor is coupled to a second electrode of the third transistor; a first electrode of the eleventh transistor is coupled to a second electrode of the third transistor; an active layer of the second transistor, an active layer of the third transistor and an active layer of the eleventh transistor are formed by a continuous fifth semiconductor layer, and an orthographic projection of the active layer of the second transistor on the base substrate, an orthographic projection of the active layer of the third transistor on the base substrate, and an orthographic projection of the active layer of the eleventh transistor on the base substrate together form a T-type pattern.

Optionally, the plurality of signal lines comprises a third start signal line; an orthographic projection of the fifth semiconductor layer on the base substrate partially overlaps an orthographic projection of the third start signal line on the base substrate.

Optionally, both a channel of the second transistor and a channel of the third transistor extend along the first direction, and a channel of the eleventh transistor extends along the second direction.

Optionally, the shift register unit comprises a sixth transistor, a seventh transistor and an eighth transistor; a second electrode of the sixth transistor is coupled to a first electrode of the seventh transistor, and a first electrode of the eighth transistor is coupled to a second electrode of the seventh transistor; an orthographic projection of the active layer of the eighth transistor on the base substrate, an orthographic projection of the active layer of the seventh transistor on the base substrate, and an orthographic projection of the active layer of the sixth transistor on the base substrate together form an n-type pattern.

Optionally, the shift register unit further comprises a fourth transistor, a fifth transistor, an eighth transistor, and a thirteenth transistor; a second electrode of the fourth transistor is coupled to a second electrode of the fifth transistor, a second electrode of the eighth transistor, a first electrode of the fifth transistor, and a first electrode of the thirteenth transistor are coupled to each other; an active layer of the fourth transistor, an active layer of the fifth transistor, an active layer of the thirteenth transistor, an active layer of the eighth transistor, an active layer of the seventh transistor and an active layer of the sixth transistor are formed by a continuous second semiconductor layer.

Optionally, the shift register unit comprises a plurality of signal lines, and the plurality of signal lines comprises a first voltage line; an orthographic projection of the first voltage line on the base substrate partially overlaps an orthographic projection of the second semiconductor layer on the base substrate.

Optionally, a channel of the fourth transistor extends along the second direction, a channel of the fifth transistor extends along the first direction, a channel of the thirteenth transistor extends along the second direction, a channel of the eighth transistor extends along the first direction, a channel of the seventh transistor extends along the first direction, and a channel of the sixth transistor extends along the second direction.

Optionally, the shift register unit comprises a first transistor, a fifth transistor, an eighth transistor, a twelfth transistor and a thirteenth transistor; a second electrode of the eighth transistor, a first electrode of the fifth transistor, and a first electrode of the thirteenth transistor are coupled to each other; a first electrode of the twelfth transistor is coupled to a second electrode of the first transistor, a second electrode of the twelfth transistor is coupled to a second electrode of the thirteenth transistor; an orthographic projection of the active layer of the first transistor on the base substrate, an orthographic projection of the active layer of the fifth transistor on the base substrate, and an orthographic projection of the active layer of the eighth transistor on the base substrate, an orthographic projection of the active layer of the twelfth transistor on the base substrate, and an orthographic projection of the active layer of the thirteenth transistor on the base substrate together form an H-type pattern.

Optionally, the shift register unit further comprises a fourth transistor, a seventh transistor and a sixth transistor; a second electrode of the fourth transistor is coupled to a second electrode of the fifth transistor; a first electrode of the sixth transistor is coupled to a first electrode of the seventh transistor; a first electrode of the fourth transistor is coupled to a first electrode of the sixth transistor; an active layer of the first transistor, an active layer of the fourth transistor, an active layer of the fifth transistor, an active layer of the thirteenth transistor, an active layer of the twelfth transistor, an active layer of the eighth transistor, an active layer of the seventh transistor and an active layer of the sixth transistor are formed by a continuous third semiconductor layer.

Optionally, the shift register unit comprises a plurality of signal lines, and the plurality of signal lines comprises a first voltage line; an orthographic projection of the first voltage line on the base substrate partially overlaps an orthographic projection of the third semiconductor layer on the base substrate.

Optionally, a channel of the fourth transistor extends along the second direction, a channel of the fifth transistor extends along the first direction, a channel of the thirteenth transistor extends along the second direction, a channel of the twelfth transistor and a channel of the first transistor extend along the first direction, a channel of the eighth transistor and a channel of the seventh transistor extend along the first direction, and a channel of the sixth transistor extends along a second direction.

Optionally, the shift register unit includes at least two transistors arranged in the driving circuit area; active layers of the at least two transistors are formed by a continuous semiconductor layer; a shape of at least part of semiconductor pattern included in the semiconductor layer is a π-type.

Optionally, the shift register unit comprises a plurality of signal lines, a plurality of transistors and a plurality of capacitors; the plurality of signal lines include: a first voltage line, a second voltage line, a first clock signal line, a second clock signal line, and a third clock signal line, and the plurality of transistors include: a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor and a thirteenth transistor; the plurality of capacitors include: a first capacitor, a second capacitor and a third capacitor; a gate electrode of the first transistor is coupled to the third clock signal line, a first electrode of the first transistor is coupled to an input terminal, a second electrode of the first transistor is coupled to a gate electrode of the second transistor; a first electrode of the second transistor is coupled to the third clock signal line, and a second electrode of the second transistor is coupled to a second electrode of the third transistor; a gate electrode of the third transistor is coupled to the third clock signal line, and a first electrode of the third transistor is coupled to the second voltage line; a gate electrode of the fourth transistor is coupled to a gate electrode of the tenth transistor, a first electrode of the fourth transistor is coupled to the first clock signal line, a second electrode of the fourth transistor is coupled to a second electrode of the fifth transistor; a gate electrode of the fifth transistor is coupled to the second electrode of the third transistor, and a first electrode of the fifth transistor is coupled to the first voltage line; a gate electrode of the sixth transistor is coupled to a second electrode of the eleventh transistor, a first electrode of the sixth transistor is coupled to the first clock signal line, and a second electrode of the sixth transistor is coupled to a first electrode of the seventh transistor; a gate electrode of the seventh transistor is coupled to the first clock signal line, and a second electrode of the seventh transistor is coupled to a gate electrode of the ninth transistor; a gate electrode of the eighth transistor is coupled to a gate electrode of the thirteenth transistor, a first electrode of the eighth transistor is coupled to a gate electrode of the ninth transistor, and a second electrode of the eighth transistor is coupled to the first voltage line; a first electrode of the ninth transistor is coupled to the first voltage line, and a second electrode of the ninth transistor is coupled to a driving signal output terminal; a first electrode of the tenth transistor is coupled to the driving signal output terminal, and a second electrode of the tenth transistor is coupled to the second voltage line; a gate electrode of the eleventh transistor is coupled to the second voltage line, and a first electrode of the eleventh transistor is coupled to the gate electrode of the fifth transistor; a gate electrode of the twelfth transistor is coupled to the second voltage line, a first electrode of the twelfth transistor is coupled to the second electrode of the first transistor, and a second electrode of the twelfth transistor is electrically connected to the gate electrode of the tenth transistor; a gate electrode of the thirteenth transistor is coupled to the second clock signal line, a first electrode of the thirteenth transistor is coupled to the first voltage line, a second electrode of the thirteenth transistor is coupled to the gate electrode of the second transistor; a first electrode plate of the first capacitor is coupled to the gate electrode of the sixth transistor, and a second electrode plate of the first capacitor is coupled to the second electrode of the sixth transistor; a first electrode plate of the second capacitor is coupled to the gate electrode of the ninth transistor, and a second electrode plate of the second capacitor is coupled to the first voltage line; a first electrode plate of the third capacitor is coupled to the gate electrode of the tenth transistor, and a second electrode plate of the third capacitor is coupled to the second electrode of the fourth transistor.

Optionally, the shift register unit may include a plurality of signal lines, a plurality of transistors, and a plurality of capacitors; the plurality of signal lines include a first voltage line, a second voltage line, a first clock signal line and a second clock signal line, and the plurality of transistors include: a first transistor, a second transistor, a third transistor, a fourth transistor, a fifth transistor, a sixth transistor, a seventh transistor, an eighth transistor, a ninth transistor, a tenth transistor, an eleventh transistor and a twelfth transistor; the plurality of capacitors include: a first capacitor, a second capacitor, and a third capacitor; a gate electrode of the first transistor is coupled to the first clock signal line, a first electrode of the first transistor is coupled to an input terminal, and a second electrode of the first transistor is coupled to a gate electrode of the second transistor; a first electrode of the second transistor is coupled to the first clock signal line, and a second electrode of the second transistor is coupled to a second electrode of the third transistor; a gate electrode of the third transistor is coupled to the first clock signal line, and a first electrode of the third transistor is coupled to the second voltage line; a gate electrode of the fourth transistor is coupled to the second clock signal line, a first electrode of the fourth transistor is coupled to a second electrode of the fifth transistor, and a second electrode of the fourth transistor is coupled to the gate electrode of the second transistor; a gate electrode of the fifth transistor is coupled to the second electrode of the third transistor, and a first electrode of the fifth transistor is coupled to the first voltage line; a gate electrode of the sixth transistor is coupled to a second electrode of the eleventh transistor, a first electrode of the sixth transistor is coupled to the second clock signal line, and a second electrode of the sixth transistor is coupled to a first electrode of the seventh transistor; a gate electrode of the seventh transistor is coupled to the second clock signal line, and a second electrode of the seventh transistor is coupled to a gate electrode of the ninth transistor; a gate electrode of the eighth transistor is coupled to the gate electrode of the second transistor, a first electrode of the eighth transistor is coupled to the first voltage line, and a second electrode of the eighth transistor is coupled to the gate electrode of the ninth transistor; a first electrode of the ninth transistor is coupled to the first voltage line, and a second electrode of the ninth transistor is coupled to a driving signal output terminal; a gate electrode of the tenth transistor is coupled to the second electrode of the twelfth transistor, a first electrode of the tenth transistor is coupled to the second voltage line, and a second electrode of the tenth transistor is coupled to the driving signal output terminal; a gate electrode of the eleventh transistor is coupled to the second voltage line, and a first electrode of the eleventh transistor is coupled to the second electrode of the second transistor; a gate electrode of the twelfth transistor is coupled to the second voltage line, and a first electrode of the twelfth transistor is coupled to the gate electrode of the second transistor; a first electrode plate of the first capacitor is coupled to the gate electrode of the sixth transistor, and a second electrode plate of the first capacitor is coupled to the second electrode of the sixth transistor; a first electrode plate of the second capacitor is coupled to the gate electrode of the ninth transistor, and a second electrode plate of the second capacitor is coupled to the first voltage line; a first electrode plate of the third capacitor is coupled to the gate electrode of the tenth transistor, and a second electrode plate of the third capacitor is coupled to the second clock signal line.

An embodiment of the present disclosure provides a display device including the display substrate.

The display panel and the display device according to an embodiment of the present disclosure may achieve narrow bezels in high resolution.

BRIEF DESCRIPTION OF THE DRAWINGS

FIG. 7F is a layout diagram of the second source-drain metal layer in FIG. 7A;

DETAILED DESCRIPTION

Figure 1:
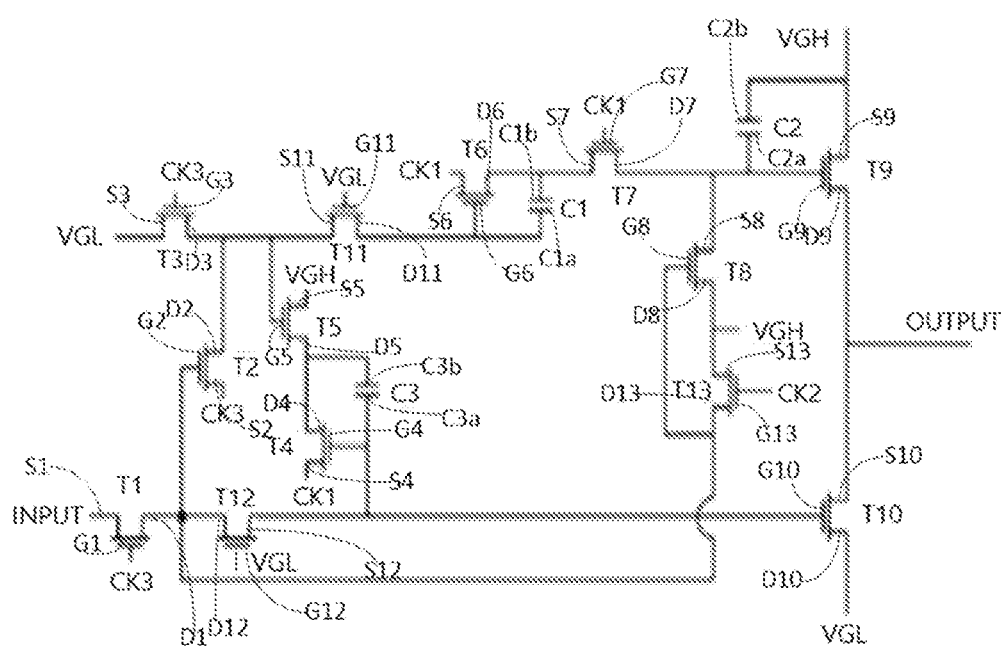
FIG. 1 is a circuit diagram of a shift register unit according to at least one embodiment.

The following will clearly and completely describe the technical solutions in the embodiments of the present disclosure with reference to the accompanying drawings. Obviously, the described embodiments are only some of the embodiments of the present disclosure, not all of them. Based on the embodiments in the present disclosure, all other embodiments obtained by those ordinary skill in the art without making creative work belong to the protection scope of the present disclosure.

The transistors used in all the embodiments of the present disclosure may be thin film transistors or field effect transistors or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a triode, a thin film transistor, a field effect transistor or any other components having the similar characteristics, in an embodiment of the present disclosure, in order to distinguish two electrodes other than the control electrode, one is called a first electrode and the other is called the second electrode.

In actual operation, when the transistor is a thin film transistor or a field effect transistor, the first electrode may be a drain electrode, and the second electrode may be a source electrode; or, the first electrode may be a source electrode, and the second electrode may be a drain electrode.

The display substrate described in the embodiment of the present disclosure includes:
  a base substrate including a display area and a peripheral area located on at least one side of the display area;
  a pixel array, located in the display area and including a plurality of pixel units; and,
  a scan driving module, located in a driving circuit area of the peripheral area, and including a plurality of shift register units, a plurality of signal lines being arranged in one shift register unit of the plurality of shift register units, and the plurality of signal lines extending along a first direction;
  wherein a ratio of a sum W1 of widths of the plurality of signal lines in a second direction to a width W2 of the shift register unit in the second direction is W1/W2, and a length of at least one pixel unit along the first direction is a pixel pitch value; the first direction intersects the second direction;
  a product of W1/W2 and the pixel pitch value is greater than 18 um and less than 40 um.

In the related art, in OLED display products, the shift register unit is coupled to the gate scan control signal terminal or the light emitting control scan signal terminal in the pixel unit, to provide the gate scan driving signal or the light emitting control scan signal. As the pixel resolution is gradually increased, the pixel pitch value is gradually reduced, and the layout space for setting the shift register unit is also gradually reduced. In order to achieve narrow bezel design in the case of high resolution, an embodiment of the present disclosure provides a display substrate, the shift register unit is located in the driving circuit area in the peripheral area, and the product of a ratio of the total width of the signal lines arranged in one of the plurality of shift register units in the second direction to the width of the one shift register unit in the second direction and the pixel pitch value is greater than 18 um and less than 40 um, so as to realize a narrow bezel.

In at least one embodiment of the present disclosure, the product of W1/W2 and the pixel pitch value may be greater than 19 um and less than 40 um, greater than 20 um and less than 40 um, greater than 21 um and less than 40 um, greater than 22 um and less than 40 um, greater than 23 um and less than 40 um, greater than 24 um and less than 40 um, greater than 25 um and less than 40 um, greater than 26 um and less than 40 um, greater than 27 um and less than 40 um, greater than 28 um and less than 40 um, greater than 29 um and less than 40 um, greater than 30 um and less than 40 um, greater than 31 um and less than 40 um, greater than 32 um and less than 40 um, greater than 33 um and less than 40 um, greater than 34 um and less than 40 um, greater than 35 um and less than 40 um, greater than 36 um and less than 40 um, greater than 37 um and less than 40 um, greater than 38 um and less than 40 um, greater than 39 um and less than 40 um, greater than 18 um and less than 39 um, greater than 19 um and less than 39 um, greater than 20 um and less than 39 um, greater than 21 um and less than 39 um, greater than 22 um and less than 39 um, greater than 23 um and less than 39 um, greater than 24 um and less than 39 um, greater than 25 um and less than 39 um, greater than 26 um and less than 39 um, greater than 27 um and less than 39 um, greater than 28 um and less than 39 um, greater than 29 um and less than 39 um, greater than 30 um and less than 39 um, greater than 31 um and less than 39 um, greater than 32 um and less than 39 um, greater than 33 um and less than 39 um, greater than 34 um and less than 39 um, greater than 35 um and less than 39 um, greater than 36 um and less than 39 um, greater than 37 um and less than 39 um, greater than 38 um and less than 39 um, greater than 18 um and less than 38 um, greater than 19 um and less than 38 um, greater than 20 um and less than 38 um, greater than 21 um and less than 38 um, greater than 22 um and less than 38 um, greater than 23 um and less than 38 um, greater than 24 um and less than 38 um, greater than 25 um and less than 38 um, greater than 26 um and less than 38 um, greater than 27 um and less than 38 um, greater than 28 um and less than 38 um, greater than 29 um and less than 38 um, greater than 30 um and less than 38 um, greater than 31 um and less than 38 um, greater than 32 um and less than 38 um, greater than 33 um and less than 38 um, greater than 34 um and less than 38 um, greater than 35 um and less than 38 um, greater than 36 um and less than 38 um, greater than 37 um and less than 38 um, greater than 18 um and less than 37 um, greater than 19 um and less than 37 um, greater than 20 um and less than 37 um, greater than 21 um and less than 37 um, greater than 22 um and less than 37 um, greater than 23 um and less than 37 um, greater than 24 um and less than 37 um, greater than 25 um and less than 37 um, greater than 26 um and less than 37 um, greater than 27 um and Less than 37 um, greater than 28 um and less than 37 um, greater than 29 um and less than 37 um, greater than 30 um and less than 37 um, greater than 31 um and less than 37 um, greater than 32 um and less than 37 um, greater than 33 um and less than 37 um, greater than 34 um and less than 37 um, greater than 35 um and less than 37 um, greater than 36 um and less than 37 um, greater than 18 um and less than 36 um, greater than 19 um and less than 36 um, greater than 20 um and less than 36 um, greater than 21 um and less than 36 um, greater than 22 um and less than 36 um, greater than 23 um and less than 36 um, greater than 24 um and less than 36 um, greater than 25 um and less than 36 um, greater than 26 um and less than 36 um, greater than 27 um and less than 36 um, greater than 28 um and less than 36 um, greater than 29 um and less than 36 um, greater than 30 um and less than 36 um, greater than 31 um and less than 36 um, greater than 32 um and less than 36 um, greater than 33 um and less than 36 um, greater than 34 um and less than 36 um, greater than 35 um and less than 36 um, greater than 18 um and less than 35 um, greater than 19 um and less than 35 um, greater than 20 um and less than 35 um, greater than 21 um and less than 35 um, greater than 22 um and less than 35 um, greater than 23 um and less than 35 um, greater than 24 um and less than 35 um, greater than 25 um and less than 35 um, greater than 26 um and less than 35 um, greater than 27 um and less than 35 um, greater than 28 um and less than 35 um, greater than 29 um and less than 35 um, greater than 30 um and less than 35 um, greater than 31 um and less than 35 um, greater than 32 um and less than 35 um, greater than 33 um and less than 35 um, greater than 34 um and less than 35 um, greater than 18 um and less than 34 um, greater than 19 um and less than 34 um, greater than 20 um and less than 34 um, greater than 21 um and less than 34 um, greater than 22 um and less than 34 um, greater than 23 um and less than 34 um, greater than 24 um and less than 34 um, greater than 25 um and less than 34 um, greater than 26 um and less than 34 um, greater than 27 um and less than 34 um, greater than 28 um and less than 34 um, greater than 29 um and less than 34 um, greater than 30 um and less than 34 um, greater than 31 um and less than 34 um, greater than 32 um and less than 34 um, greater than 33 um and less than 34 um, greater than 18 um and less than 33 um, greater than 19 um and less than 33 um, greater than 20 um and less than 33 um, greater than 21 um and less than 33 um, greater than 22 um and less than 33 um, greater than 23 um and less than 33 um, greater than 24 um and less than 33 um, greater than 25 um and less than 33 um, greater than 26 um and less than 33 um, greater than 27 um and less than 33 um, greater than 28 um and less than 33 um, greater than 29 um and less than 33 um, greater than 30 um and less than 33 um, greater than 31 um and less than 33 um, greater than 32 um and less than 33 um, greater than 18 um and less than 32 um, greater than 19 um and less than 32 um, greater than 20 um and less than 32 um, greater than 21 um and less than 32 um, greater than 22 um and less than 32 um, greater than 23 um and less than 32 um, greater than 24 um and less than 32 um, greater than 25 um and less than 32 um, greater than 26 um and less than 32 um, greater than 27 um and less than 32 um, greater than 28 um and less than 32 um, greater than 29 um and less than 32 um, greater than 30 um and less than 32 um, greater than 31 um and less than 32 um, greater than 18 um and less than 31 um, greater than 19 um and less than 31 um, greater than 20 um and less than 31 um, greater than 21 um and less than 31 um, greater than 22 um and less than 31 um, greater than 23 um and less than 31 um, greater than 24 um and less than 31 um, greater than 25 um and less than 31 um, greater than 26 um and less than 31 um, greater than 27 um and less than 31 um, greater than 28 um and Less than 31 um, greater than 29 um and less than 31 um, greater than 30 um and less than 31 um, greater than 18 um and less than 30 um, greater than 19 um and less than 30 um, greater than 20 um and less than 30 um, greater than 21 um and less than 30 um, greater than 22 um and less than 30 um, greater than 23 um and less than 30 um, greater than 24 um and less than 30 um, greater than 25 um and less than 30 um, greater than 26 um and less than 30 um, greater than 27 um and less than 30 um, greater than 28 um and less than 30 um, greater than 29 um and less than 30 um, greater than 18 um and less than 29 um, greater than 19 um and less than 29 um, greater than 20 um and less than 29 um, greater than 21 um and less than 29 um, greater than 22 um and less than 29 um, greater than 23 um and less than 29 um, greater than 24 um and less than 29 um, greater than 25 um and less than 29 um, greater than 26 um and less than 29 um, greater than 27 um and less than 29 um, greater than 28 um and Less than 29 um, greater than 18 um and less than 28 um, greater than 19 um and less than 28 um, greater than 20 um and less than 28 um, greater than 21 um and less than 28 um, greater than 22 um and less than 28 um, greater than 23 um and less than 28 um, greater than 24 um and less than 28 um, greater than 25 um and less than 28 um, greater than 26 um and less than 28 um, greater than 27 um and less than 28 um, greater than 18 um and less than 27 um, greater than 19 um and less than 27 um, greater than 20 um and less than 27 um, greater than 21 um and less than 27 um, greater than 22 um and less than 27 um, greater than 23 um and less than 27 um, greater than 24 um and less than 27 um, greater than 25 um and less than 27 um, greater than 26 um and less than 27 um, greater than 19 um and less than 26 um, greater than 20 um and less than 26 um, greater than 21 um and less than 26 um, greater than 22 um and less than 26 um, greater than 23 um and less than 26 um, greater than 24 um and less than 26 um, greater than 25 um and less than 26 um, greater than 18 um and less than 25 um, greater than 19 um and less than 25 um, greater than 20 um and less than 25 um, greater than 21 um and less than 25 um, greater than 22 um and less than 25 um, greater than 23 um and less than 25 um, greater than 24 um and less than 25 um, greater than 18 um and less than 24 um, greater than 19 um and less than 24 um, greater than 20 um and less than 24 um, greater than 21 um and less than 24 um, greater than 22 um and less than 24 um, greater than 23 um and less than 24 um, greater than 18 um and less than 23 um, greater than 19 um and less than 23 um, greater than 20 um and less than 23 um, greater than 21 um and less than 23 um, greater than 22 um and less than 23 um, greater than 18 um and less than 22 um, greater than 19 um and less than 22 um, greater than 20 um and less than 22 um, greater than 21 um and less than 22 um, greater than 18 um and less than 21 um, greater than 19 um and less than 21 um, greater than 20 um and less than 21 um, greater than 18 um and less than 20 um, greater than 18 um and less than 19 um, or greater than 19 um and less than 20 um, but not limited thereto. For example, the product of W1/W2 and the pixel pitch value can be equal to 18.5 um, 19 um, 19.5 um, 20 um, 20.5 um, 21 um, 22.5 um, 23 um, 23.5 um, 24 um, 24.5 um, 25 um, 25.5 um, 26 um, 26.5 um, 27 um, 27.5 um, 28 um, 28.5 um, 29 um, 29.5 um, 30 um, 30.5 um, 31 um, 31.5 um, 32 um, 32.5 um, 33 um, 33.5 um, 34 um, 34.5 um, 35 um, 35.5 um, 36 um, 36.5 um, 37 um, 37.5 um, 38 um, 38.5 um, 39 um or 39.5 um, but not limited thereto.

In at least one embodiment of the present disclosure, "one shift register unit among the plurality of shift register units is provided with a plurality of signal lines" does not mean that only one shift register unit among the plurality of shift register units is provided with a plurality of signal lines;

"One shift register unit among the plurality of shift register units is provided with a plurality of signal lines" may refer to: each in at least one shift register unit among the plurality of shift register units is provided with a plurality of signal lines.

In at least one embodiment of the present disclosure, when the orthographic projections of different signal lines among the plurality of signal lines on the base substrate overlap each other, the sum W1 of the width of the plurality of signal lines in the second direction is: the sum of widths of different signal lines in the plurality of signal lines in the second direction.

Optionally, in the driving circuit area, a plurality of shift register units may be arranged along the second direction, and the product of the ratio of the sum of the width of each signal line in each shift register unit of the plurality of shift register units arranged along the second direction to the width of each shift register unit in the second direction and the pixel pitch value are greater than 18 um and less than 40 um.

Optionally, the plurality of signal lines may include all signal lines in one shift register unit among the plurality of shift register units.

In at least one embodiment of the present disclosure, the plurality of signal lines include all signal lines overlapping an orthographic projection of one of the plurality of shift register units on the base substrate.

Optionally, the type of the shift register unit included in the scan driving module may include: a first shift register unit providing an n-type driving signal, a second shift register unit providing a p-type driving signal, and a third shift register unit providing a light emitting control signal. When one shift register unit in the plurality of shift register units is the first shift register unit, the plurality of signal lines may include: all signal lines included in the first shift register unit, a second start signal line, and a third start signal line; but not limited thereto.

Wherein, the second start signal line may be a signal line providing an input signal to the second shift register unit, and the third start signal line may be a signal line providing an input signal to the third shift register unit, but not limited to this.

In specific implementation, W1/W2 may be greater than 0.4 and less than 0.7, but not limited thereto. For example, W1/W2 can be greater than 0.45 and less than 0.7, greater than 0.5 and less than 0.7, greater than 0.55 and less than 0.7, greater than 0.6 and less than 0.7, greater than 0.65 and less than 0.7, greater than 0.4 and less than 0.65, greater than 0.45 and less than 0.65, greater than 0.5 and less than 0.65, greater than 0.55 and less than 0.65, greater than 0.6 and less than 0.65, greater than 0.4 and less than 0.6, greater than 0.45 and less than 0.6, greater than 0.5 and less than 0.6, greater than 0.55 and less than 0.6, greater than 0.4 and less than 0.55, greater than 0.45 and less 0.55, greater than 0.5 and less than 0.55, greater than 0.4 and less than 0.5, greater than 0.45 and less than 0.5, or greater than 0.4 and less than 0.45; but not limited thereto. For example, W1/W2 can be equal to 0.41, 0.42, 0.43, 0.44, 0.45, 0.46, 0.47, 0.48, 0.49, 0.5, 0.51, 0.52, 0.53, 0.54, 0.55, 0.56, 0.57, 0.58, 0.59, 0.6, 0.61, 0.62, 0.63, 0.64, 0.65, 0.46, 0.67, 0.68 or 0.69;

Optionally, the product of W1/W2 and the pixel pitch value is greater than 27 um and less than 36 um; for example, the product of W1/W2 and the pixel spacing value can be greater than 27 um and less than 36 um, greater than 28 um and less than 36 um, greater than 29 um and less than 36 um, greater than 30 um and less than 36 um, greater than 31 um and less than 36 um, greater than 32 um and less than 36 um, greater than 33 um and less than 36 um, greater than 34 um and less than 36 um, greater than 35 um and less than 36 um, greater than 27 um and less than 35 um, greater than 28 um and less than 35 um, greater than 29 um and less than 35 um, greater than 30 um and less than 35 um, greater than 31 um and less than 35 um, greater than 32 um and less than 35 um, greater than 33 um and less than 35 um, greater than 34 um and less than 35 um, greater than 27 um and less than 34 um, greater than 28 um and less than 34 um, greater than 29 um and less than 34 um, greater than 30 um and less than 34 um, greater than 31 um and less than 34 um, greater than 32 um and less than 34 um, greater than 27 um and less than 33 um, greater than 28 um and less than 33 um, greater than 29 um and less than 33 um, greater than 30 um and less than 33 um, greater than 31 um and less than 33 um, greater than 32 um and less than 33 um, greater than 27 um and less than 32 um, greater than 28 um and less than 32 um, greater than 29 um and less than 32 um, greater than 30 um and less than 32 um, greater than 31 um and less than 32 um, greater than 27 um and less than 31 um, greater than 28 um and less than 31 um, greater than 29 um and less than 31 um, greater than 30 um and less than 31 um, greater than 27 um and less than 30 um, greater than 28 um and less than 30 um, greater than 29 um and less than 30 um, greater than 27 um and less than 29 um, greater than 28 um and less than 29 um, or greater than 27 um and less than 28 um, but not limited thereto; for example, the product of W1/W2 and the pixel pitch value can be equal to 27.1 um, 27.2 um, 27.3 um, 27.4 um, 27.5 um, 27.6 um, 27.7 um, 27.8 um, 27.9 um, 28 um, 28.1 um, 28.2 um, 28.3 um, 28.4 um, 28.5 um, 28.6 um, 28.7 um, 28.8 um, 28.9 um, 29 um, 29.1 um, 29.2 um, 29.3 um, 29.4 um, 29.5 um, 29.6 um, 29.7 um, 29.8 um, 29.9 um, 31 um, 30.1 um, 30.2 um, 30.3 um, 30.4 um, 30.5 um, 30.6 um, 30.7 um, 30.8 um, 30.9 um, 31 um, 31.1 um, 31.2 um, 31.3 um, 31.4 um, 31.5 um, 31.6 um, 31.7 um, 31.8 um, 31.9 um, 32 um, 32.1 um, 32.2 um, 32.3 um, 32.4 um, 32.5 um, 32.6 um, 32.7 um, 32.8 um, 32.9 um, 33 um, 33.1 um, 33.2 um, 33.3 um, 33.4 um, 33.5 um, 33.6 um, 33.7 um, 33.8 um, 33.9 um, 34 um, 34.1 um, 34.2 um, 34.3 um, 34.4 um, 34.5 um, 34.6 um, 34.7 um, 34.8 um, 34.9 um, 35 um, 35.1 um, 35.2 um, 35.3 um, 35.4 um, 35.5 um, 35.6 um, 35.7 um, 35.8 um or 35.9 um.

Optionally, the product of W1/W2 and the pixel pitch value is greater than 18 um and less than or equal to 27 um; for example, the product of W1/W2 and the pixel pitch value can be greater than 18.5 um and less than or equal to 27 um, greater than 19 um and less than or equal to 27 um, greater than 19.5 um and less than or equal to 27 um, greater than 20 um and less than or equal to 27 um, greater than 20.5 um and less than or equal to 27 um, greater than 21 um and less than or equal to 27 um, greater than 21.5 um and less than or equal to 27 um, greater than 22 um and less than or equal to 27 um, greater than 22.5 um and less than or equal to 27 um, greater than 23 um and less than or equal to 27 um, greater than 23.5 um and less than or equal to 27 um, greater than 24 um and less than or equal to 27 um, greater than 24.5 um and less than or equal to 27 um, greater than 25 um and less than or equal to 27 um, greater than 25.5 um and less than or equal to 27 um, greater than 26 um and less than or equal to 27 um, greater than 26.5 um and less than or equal to 27 um, greater than 18 um and less than or equal to 26.5 um, greater than 18.5 um and less than or equal to 26.5 um, greater than 19 um and less than or equal to 26.5 um, greater than 19.5 um and less than or equal to 26.5 um, greater than 20 um and less than or equal to 26.5 um, greater than 20.5 um and less than or equal to 26.5 um, greater than 21 um and less than or equal to 26.5 um, greater than 21.5 um and less than or equal to 26.5 um, greater than 22 um and less than or equal to 26.5 um, greater than 22.5 um and less than or equal to 26.5 um, greater than 23 um and less than or equal to 26.5 um, greater than 23.5 um and less than or equal to 26.5 um, greater than 24 um and less than or equal to 26.5 um, greater than 24.5 um and less than or equal to 26.5 um, greater than 25 um and less than or equal to 26.5 um, greater than 25.5 um and less than or equal to 26.5 um, greater than 26 um and less than or equal to 26.5 um, greater than 18 um and less than or equal to 26 um, greater than 18.5 um and less than or equal to 26 um, greater than 19 um and less than or equal to 26 um, greater than 19.5 um and less than or equal to 26 um, greater than 20 um and less than or equal to 26 um, greater than 20.5 um and Less than or equal to 26 um, greater than 21 um and less than or equal to 26 um, greater than 21.5 um and less than or equal to 26 um, greater than 22 um and less than or equal to 26 um, greater than 22.5 um and less than or equal to 26 um, greater than 23 um and less than or equal to 26 um, greater than 23.5 um and less than or equal to 26 um, greater than 24 um and less than or equal to 26 um, greater than 24.5 um and less than or equal to 26 um, greater than 25 um and less than or equal to 26 um, greater than 25.5 um and less than or equal to 26 um, greater than 18 um and less than or equal to 25.5 um, greater than 18.5 um and less than or equal to 25.5 um, greater than 19 um and less than Equal to 25.5 um, greater than 19.5 um and less than or equal to 25.5 um, greater than 20 um and less than or equal to 25.5 um, greater than 20.5 um and less than or equal to 25.5 um, greater than 21 um and less than or equal to 25.5 um, greater than 21.5 um and less than or equal to 25.5 um, greater than 22 um and less than or equal to 25.5 um, greater than 22.5 um and less than or equal to 25.5 um, greater than 23 um and less than or equal to 25.5 um, greater than 23.5 um and less than or equal to 25.5 um, greater than 24 um and less than or equal to 25.5 um, greater than 24.5 um and less than or equal to 25.5 um, greater than 25 um and less than or equal to 25.5 um, greater than 18 um and less than or equal to 25 um, greater than 18.5 um and less than or equal to 25 um, greater than 19 um and less than or equal to 25 um, greater than 19.5 um and less than or equal to 25 um, greater than 20 um and less than or equal to 25 um, greater than 20.5 um and less than or equal to 25 um, greater than 21 um and less than or equal to 25 um, greater than 21.5 um and less than or equal to 25 um, greater than 22 um and less than or equal to 25 um, greater than 22.5 um and less than or equal to 25 um, greater than 23 um and less than or equal to 25 um, greater than 23.5 um and less than or equal to 25 um, greater than 24 um and less than or equal to 25 um, greater than 24.5 um and less than or equal to 25 um, greater than 18 um and less than or equal to 24.5 um, greater than 18.5 um and less than or equal to 24.5 um, greater than 19 um and less than or equal to 24.5 um, greater than 19.5 um and less than or equal to 24.5 um, greater than 20 um and less than or equal to 24.5 um, greater than 20.5 um and less than or equal to 24.5 um, greater than 21 um and less than or equal to 24.5 um, greater than 21.5 um and less than or equal to 24.5 um, greater than 22 um and less than or equal to 24.5 um, greater than 22.5 um and less than or equal to 24.5 um, greater than 23 um and less than or equal to 24.5 um, greater than 23.5 um and less than or equal to 24.5 um, greater than 24 um and less than or equal to 24.5 um, greater than 18 um and less than or equal to 24 um, greater than 18.5 um and less than or equal to 24 um, greater than 19 um and less than or equal to 24 um, greater than 19.5 um and less than or equal to 24 um, greater than 20 um and less than or equal to 24 um, greater than 20.5 um and less than or equal to 24 um, greater than 21 um and less than or equal to 24 um, greater than 21.5 um and less than or equal to 24 um, greater than 22 um and less than or equal to 24 um, greater than 22.5 um and less than or equal to 24 um, greater than 23 um and less than or equal to 24 um, greater than 23.5 um and less than or equal to 24 um, greater than 18 um and less than or equal to 23.5 um, greater than 18.5 um and less than or equal to 23.5 um, greater than 19 um and less than or equal to 23.5 um, greater than 19.5 um and less than or equal to 23.5 um, greater than 20 um and less than or equal to 23.5 um, greater than 20.5 um and less than or equal to 23.5 um, greater than 21 um and less than or equal to 23.5 um, greater than 21.5 um and less than or equal to 23.5 um, greater than 22 um and less than or equal to 23.5 um, greater than 22.5 um and less than or equal to 23.5 um, greater than 23 um and less than or equal to 23.5 um, greater than 18 um and less than or equal to 23 um, greater than 18.5 um and less than or equal to 23 um, greater than 19 um and less than or equal to 23 um, greater than 19.5 um and less than or equal to 23 um, greater than 20 um and less than or equal to 23 um, greater than 20.5 um and less than or equal to 23 um, greater than 21 um and less than or equal to 23 um, greater than 21.5 um and less than or equal to 23 um, greater than 22 um and less than or equal to 23 um, greater than 22.5 um and less than or equal to 23 um, greater than 18 um and less than or equal to 22.5 um, greater than 18.5 um and less than or equal to 22.5 um, greater than 19 um and less than or equal to 22.5 um, greater than 19.5 um and less than or equal to 22.5 um, greater than 20 um and less than or equal to 22.5 um, greater than 20.5 um and less than or equal to 22.5 um, greater than 21 um and less than or equal to 22.5 um, greater than 21.5 um and less than or equal to 22.5 um, greater than 22 um and less than or equal to 22.5 um, greater than 18 um and less than or equal to 22 um, greater than 18.5 um and less than or equal to 22 um, greater than 19 um and less than or equal to 22 um, greater than 19.5 um and less than or equal to 22 um, greater than 20 um and less than or equal to 22 um, greater than 20.5 um and less than or equal to 22 um, greater than 21 um and less than or equal to 22 um, greater than 21.5 um and less than or equal to 22 um, greater than 18 um and less than or equal to 21.5 um, greater than 18.5 um and less than or equal to 21.5 um, greater than 19 um and less than or equal to 21.5 um, greater than 19.5 um and less than or equal to 21.5 um, greater than 20 um and less than or equal to 21.5 um, greater than 20.5 um and less than or equal to 21.5 um, greater than 21 um and less than or equal to 21.5 um, greater than 18 um and less than or equal to 21 um, greater than 18.5 um and less than or equal to 21 um, greater than 19 um and less than or equal to 21 um, greater than 19.5 um and less than or equal to 21 um, greater than 20 um and less than or equal to 21 um, greater than 20.5 um and less than or equal to 21 um, greater than 18 um and less than or equal to 20.5 um, greater than 18.5 um and less than or equal to 20.5 um, greater than 19 um and less than or equal to 20.5 um, greater than 19.5 um and less than or equal to 20.5 um, greater than 20 um and less than or equal to 20.5 um, greater than 18 um and less than or equal to 20 um, greater than 18.5 um and less than or equal to 20 um, greater than 19 um and less than or equal to 20 um, greater than 19.5 um and less than or equal to 20 um, greater than 18 um and less than or equal to 19.5 um, greater than 18.5 um and less than or equal to 19.5 um, greater than 19 um and less than or equal to 19.5 um, greater than 18 um and less than or equal to 19 um, greater than 18.5 um and less than or equal to 19 um; or greater than 18 um and less than or equal to 18.5 um. For example, the product of W1/W2 and the pixel pitch value can be equal to 18.1 um, 18.2 um, 18.3 um, 18.4 um, 18.5 um, 18.6 um, 18.7 um, 18.8 um, 18.9 um, 19 um, 19.1 um, 19.2 um, 19.3 um, 19.4 um, 19.5 um, 19.6 um, 19.7 um, 19.8 um, 19.9 um, 20 um, 20.1 um, 20.2 um, 20.3 um, 20.4 um, 20.5 um, 20.6 um, 20.7 um, 20.8 um, 20.9 um, 21 um, 21.1 um, 21.2 um, 21.3 um, 21.4 um, 21.5 um, 21.6 um, 21.7 um, 21.8 um, 21.9 um, 22 um, 22.1 um, 22.2 um, 22.3 um, 22.4 um, 22.5 um, 22.6 um, 22.7 um um, 22.8 um, 22.9 um, 23 um, 23.1 um, 23.2 um, 23.3 um, 23.4 um, 23.5 um, 23.6 um, 23.7 um, 23.8 um, 23.9 um, 24 um, 24.1 um, 24.2 um, 24.3 um, 24.4 um, 24.5 um, 24.6 um, 24.7 um, 24.8 um, 24.9 um, 25 um, 25.1 um, 25.2 um, 25.3 um, 25.4 um, 25.5 um, 25.6 um, 25.7 um, 25.8 um, 25.9 um, 26 um, 26.1 um, 26.2 um, 26.3 um, 26.4 um, 26.5 um, 26.6 um, 26.7 um, 26.8 um, 26.9 um or 27 um.

Optionally, the product of W1/W2 and the pixel pitch value is greater than or equal to 36 um and less than 40 um; for example, the product of W1/W2 and the pixel pitch value can be greater than 36.5 um and less than 40 um, greater than 37 um and less than 40 um, greater than 37.5 um and less than 40 um, greater than 38 um and less than 40 um, greater than 38.5 um and less than 40 um, greater than 39 um and less than 40 um, greater than 39.5 um and less than 40 um, greater than or equal to 36 um and less than 39.5 um, greater than 36.5 um and less than 39.5 um, greater than 37 um and less than 39.5 um, greater than 37.5 um and less than 39.5 um, greater than 38 um and less than 39.5 um, greater than 38.5 um and less than 39.5 um, greater than 39 um and less than 39.5 um, greater than or equal to 36 um and less than 39 um, greater than 36.5 um and less 39 um, greater than 37 um and less than 39 um, greater than 37.5 um and less than 39 um, greater than 38 um and less than 39 um, greater than 38.5 um and less than 39 um, greater than or equal to 36 um and less than 38.5 um, greater than 36.5 um and less than 38.5 um, greater than 37 um and less than 38.5 um, greater than 37.5 um and less than 38.5 um, greater than 38 um and less than 38.5 um, greater than or equal to 36 um and less than 38 um, greater than 36.5 um and less than 38 um, greater than 37 um and less than 38 um, greater than 37.5 um and less than 38 um, greater than or equal to 36 um and less than 37.5 um, greater than 36.5 um and less than 37.5 um, greater than 36.5 um and less than 37.5 um, greater than or equal to 36 um and less than 37 um, greater than 36.5 um and less than 37 um, or greater than or equal to 36 um and less than 36.5 um. For example, the product of W1/W2 and the pixel spacing value can be equal to 36 um, 36.1 um, 36.2 um, 36.3 um, 36.4 um, 36.5 um, 36.6 um, 36.7 um, 36.8 um, 36.9 um, 37 um, 37.1 um, 37.2 um um, 37.3 um, 37.4 um, 37.5 um, 37.6 um, 37.7 um, 37.8 um, 37.9 um, 38 um, 38.1 um, 38.2 um, 38.3 um, 38.4 um, 38.5 um, 38.6 um, 38.7 um, 38.8 um, 38.9 um, 39 um, 39.1 um, 39.2 um, 39.3 um, 39.4 um, 39.5 um, 39.6 um, 39.7 um, 39.8 um or 39.9 um.

Optionally, the product of W1/W2 and the pixel pitch value is greater than 29 um and less than 35 um; for example, the product of W1/W2 and the pixel pitch value may be greater than 29.5 um and less than 35 um, greater than 30 um and less than 35 um, greater than 30.5 um and less than 35 um, greater than 31 um and less than or equal to 35 um, greater than 31.5 um and less than 35 um, greater than 32 um and less than or equal to 35 um, greater than 32.5 um and less than 35 um, greater than 33 um and less than or equal to 35 um, greater than 33.5 um and less than 35 um, greater than 34 um and less than or equal to 35 um, greater than 34.5 um and less than 35 um, greater than 29 um and less than 34.5 um, greater than 29.5 um and less than 34.5 um, greater than 30 um and less than or equal to 34.5 um, greater than 30.5 um and less than 34.5 um, greater than 31 um and less than or equal to 34.5 um, greater than 31.5 um and less than 34.5 um, greater than 32 um and less than or equal to 34.5 um, greater than 32.5 um and less than 34.5 um, greater than 33 um and less than or equal to 34.5 um, greater than 33.5 um and less than 34.5 um, greater than 34 um and less than or equal to 34.5 um, greater than 29 um and less than 34 um, greater than 29.5 um and less than 34 um, greater than 30 um and less than or equal to 34 um, greater than 30.5 um and less than 34 um, greater than 31 um and less than or equal to 34 um, greater than 31.5 um and less than 34 um, greater than 32 um and less than or equal to 34 um, greater than 32.5 um And less than 34 um, greater than 33 um and less than or equal to 34 um, greater than 33.5 um and less than 34 um, greater than 29 um and less than 33.5 um, greater than 29.5 um and less than 33.5 um, greater than 30 um and less than or equal to 33.5 um, greater than 30.5 um and less than 33.5 um, greater than 31 um and less than or equal to 33.5 um, greater than 31.5 um and less than 33.5 um, greater than 32 um and less than or equal to 33.5 um, greater than 32.5 um and less than 33.5 um, greater than 33 um and less than or equal to 33.5 um, greater than 29 um and less than 33 um, greater than 29.5 um and less than 33 um, greater than 30 um and less than or equal to 33 um, greater than 30.5 um and less than 33 um, greater than 31 um and less than or equal to 33 um, greater than 31.5 um and less than 33 um, greater than 32 um and less than or equal to 33 um, greater than 32.5 um and less than 33 um, greater than 29 um and less than 32.5 um, greater than 29.5 um and less than 32.5 um, greater than 30 um and less than or equal to 32.5 um, greater than 30.5 um and less than 32.5 um, greater than 31 um and less than or equal to 32.5 um, greater than 31.5 um and less than 32.5 um, greater than 32 um and less than or equal to 32.5 um, greater than 29 um and less than 32 um, greater than 29.5 um and less than 32 um, greater than 30 um and less than or equal to 32 um, greater than 30.5 um and less than 32 um, greater than 31 um and less than or equal to 32 um, greater than 31.5 um and less than 32 um, greater than 29 um and less than 31.5 um, greater than 29.5 um and less than 31.5 um, greater than 30 um and less than or equal to 31.5 um, greater than 30.5 um and less than 31.5 um, greater than 31 um and less than or equal to 31.5 um, greater than 29 um and less than 31 um, greater than 29.5 um and less than 31 um, greater than 30 um and less than or equal to 31 um, greater than 30.5 um and less than 31 um, greater than 29 um and less than 30.5 um, greater than 29.5 um and less than 30.5 um, greater than 30 um and less than or equal to 30.5 um, greater than 29 um and less than 30 um, greater than 29.5 um and less than 30 um, or greater than 29 um and less than 29.5 um. For example, the product of W1/W2 and the pixel pitch value can be equal to 29.1 um, 29.2 um, 29.3 um, 29.4 um, 29.5 um, 29.6 um, 29.7 um, 29.8 um, 29.9 um, 30 um, 30.1 um, 30.2 um, 30.3 um, 30.4 um, 30.5 um, 30.6 um, 30.7 um, 30.8 um, 30.9 um, 31 um, 31.1 um, 31.2 um, 31.3 um, 31.4 um, 31.5 um, 31.6 um, 31.7 um, 31.8 um, 31.9 um, 32 um, 32.1 um, 32.2 um, 32.3 um, 32.4 um, 32.5 um, 32.6 um, 32.7 um, 32.8 um, 32.9 um, 33 um, 33.1 um, 33.2 um, 33.3 um, 33.4 um, 33.5 um, 33.6 um, 33.7 um um, 33.8 um, 33.9 um, 34 um, 34.1 um, 34.2 um, 34.3 um, 34.4 um, 34.5 um, 34.6 um, 34.7 um, 34.8 um or 34.9 um.

As shown in FIG. 1, at least one embodiment of the shift register unit includes a plurality of signal lines, a plurality of transistors and a plurality of capacitors;

The plurality of signal lines may include: a first voltage line VGH, a second voltage line VGL, a first clock signal line CK1, a second clock signal line CK2, and a third clock signal line CK3, and the plurality of transistors include: a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, a twelfth transistor T12, and a thirteenth transistor T13; the plurality of capacitors include: a first capacitor C1, a second capacitor C2, and a third capacitor C3;

A gate electrode G1 of the first transistor T1 is coupled to the third clock signal line CK3, a first electrode S1 of the first transistor T1 is coupled to the input terminal INPUT, and the second electrode D1 of the first transistor T1 is coupled to a gate electrode G2 of the second transistor T2;

A first electrode S2 of the second transistor T2 is coupled to the third clock signal line CK3, and a second electrode D2 of the second transistor T2 is coupled to a second electrode D3 of the third transistor T3;

A gate electrode G3 of the third transistor T3 is coupled to the third clock signal line CK3, and a first electrode S3 of the third transistor T3 is coupled to the second voltage line VGL;

A gate electrode G4 of the fourth transistor T4 is coupled to a gate electrode G10 of the tenth transistor T10, a first electrode S4 of the fourth transistor T4 is coupled to the first clock signal line CK1, and a second electrode D4 of the fourth transistor T4 is coupled to a second electrode D5 of the fifth transistor T5;

A gate electrode G5 of the fifth transistor T5 is coupled to the second electrode D3 of the third transistor T3, and a first electrode S5 of the fifth transistor T5 is coupled to the first voltage line VGH;

A gate electrode G6 of the sixth transistor T6 is coupled to a second electrode D11 of the eleventh transistor T11, and a first electrode S6 of the sixth transistor T6 is coupled to the first clock signal line CK1, a second electrode D6 of the sixth transistor T6 is coupled to a first electrode S7 of the seventh transistor T7;

A gate electrode G7 of the seventh transistor T7 is coupled to the first clock signal line CK1, and a second electrode D7 of the seventh transistor T7 is coupled to a gate electrode G9 of the ninth transistor T9;

A gate electrode G8 of the eighth transistor T8 is coupled to a second electrode D13 of the thirteenth transistor T13, and a first electrode S8 of the eighth transistor T8 is coupled to a gate electrode G9 of the ninth transistor T9, a second electrode D8 of the eighth transistor T8 is coupled to the first voltage line VGH;

A first electrode S9 of the ninth transistor T9 is coupled to the first voltage line VGH, and a second electrode D9 of the ninth transistor T9 is coupled to the driving signal output terminal OUTPUT;

A first electrode S10 of the tenth transistor T10 is coupled to the driving signal output terminal OUT, and a second electrode D10 of the tenth transistor T10 is coupled to the second voltage line VGL;

A gate electrode G11 of the eleventh transistor T11 is coupled to the second voltage line VGL, and a first electrode S11 of the eleventh transistor T11 is coupled to the gate electrode G5 of the fifth transistor T5;

A gate electrode G12 of the twelfth transistor T12 is coupled to the second voltage line VGL, a first electrode S12 of the twelfth transistor T12 is coupled to the second electrode D1 of the first transistor T1, a second electrode D12 of the twelfth transistor T12 is electrically connected to the gate electrode G10 of the tenth transistor T10;

A gate electrode G13 of the thirteenth transistor is coupled to the second clock signal line CK2, a first electrode S13 of the thirteenth transistor T13 is coupled to the first voltage line VGH, and a second electrode D13 of the thirteenth transistor T13 is coupled to the gate electrode G2 of the second transistor T2;

A first electrode plate C1a of the first capacitor C1 is coupled to the gate electrode G6 of the sixth transistor T6, and a second electrode plate C1b of the first capacitor C1 is coupled to the second electrode D6 of the sixth transistor T6;

A first electrode plate C2a of the second capacitor C2 is coupled to the gate electrode G9 of the ninth transistor T9, and a second electrode plate C2b of the second capacitor C2 is coupled to the first voltage line VGH;

A first electrode plate C3a of the third capacitor C3 is coupled to the gate electrode G10 of the tenth transistor T10, a second electrode plate C3b of the third capacitor C3 is coupled to the second electrode D4 of the fourth transistor T4.

In at least one embodiment of the present disclosure, the first voltage line may be a high voltage line, and the second voltage line may be a low voltage line, but not limited thereto.

In at least one embodiment of the shift register unit shown in FIG. 1, all transistors may be low temperature polysilicon thin film transistors, but not limited thereto. At least one embodiment of the shift register unit shown in FIG. 1 is a shift register unit for providing an n-type driving signal.

Figure 2A:
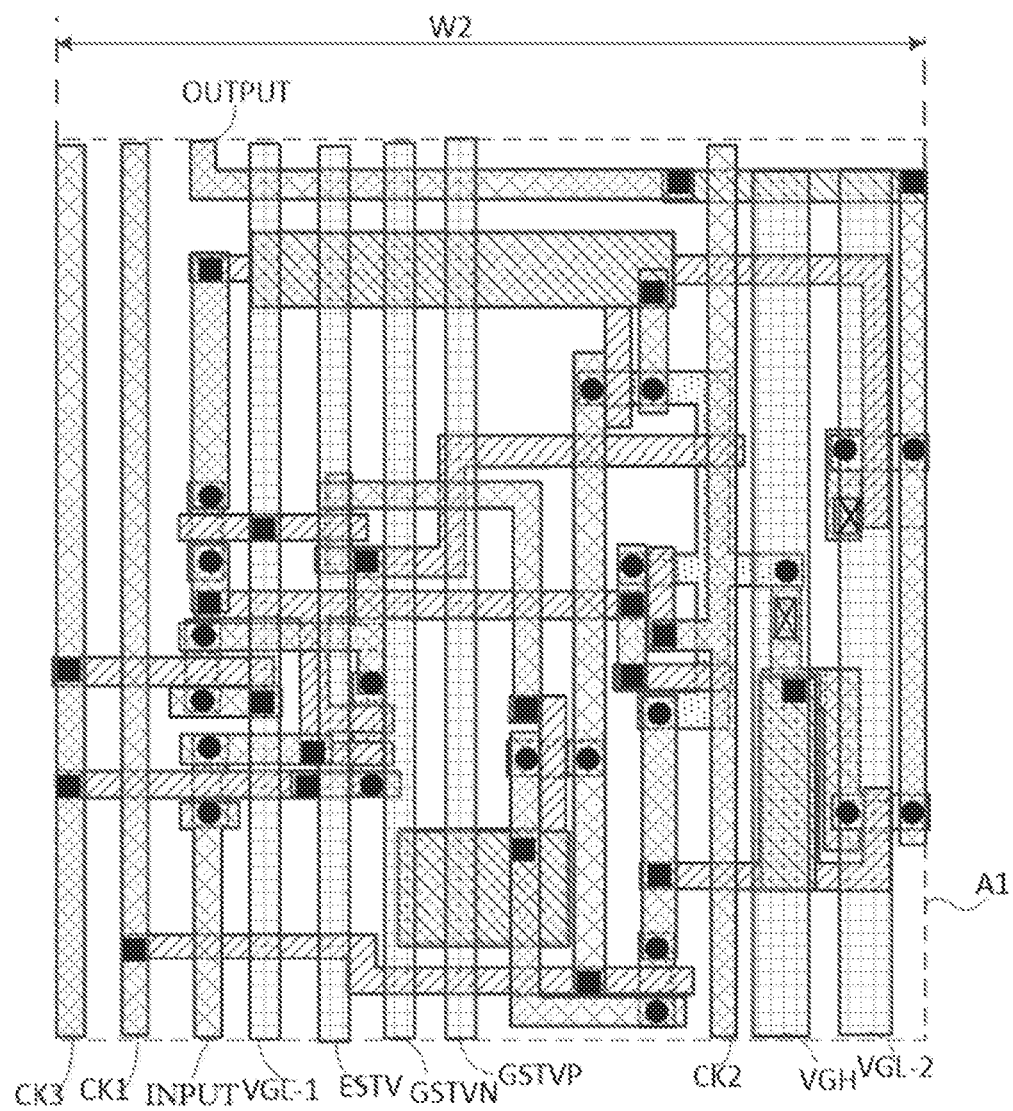
FIG. 2A is a schematic layout diagram corresponding to the shift register unit shown in FIG. 1.
Figure 3A:
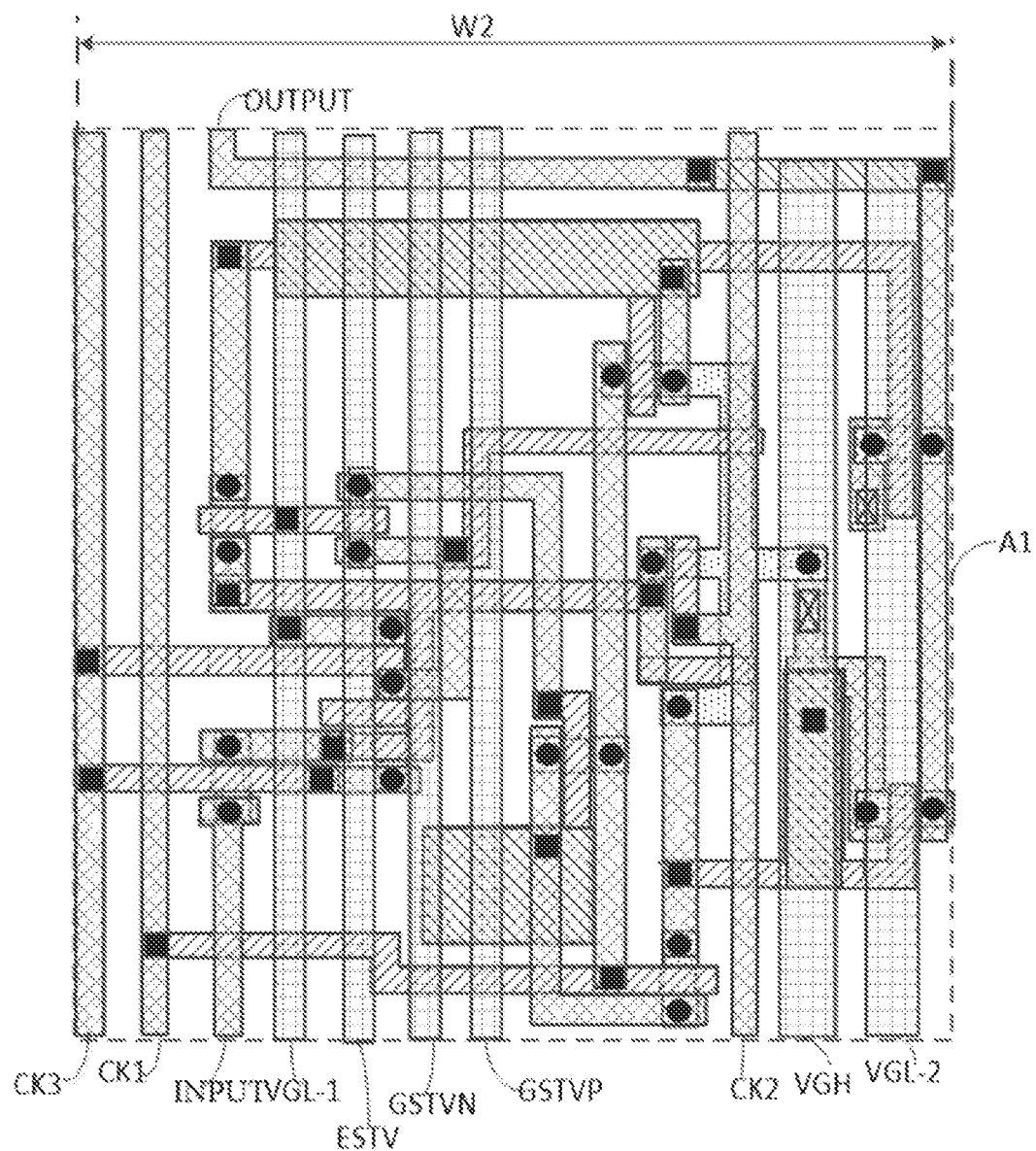
FIG. 3A is a schematic layout diagram corresponding to the shift register unit shown in FIG. 1.
Figure 4A:
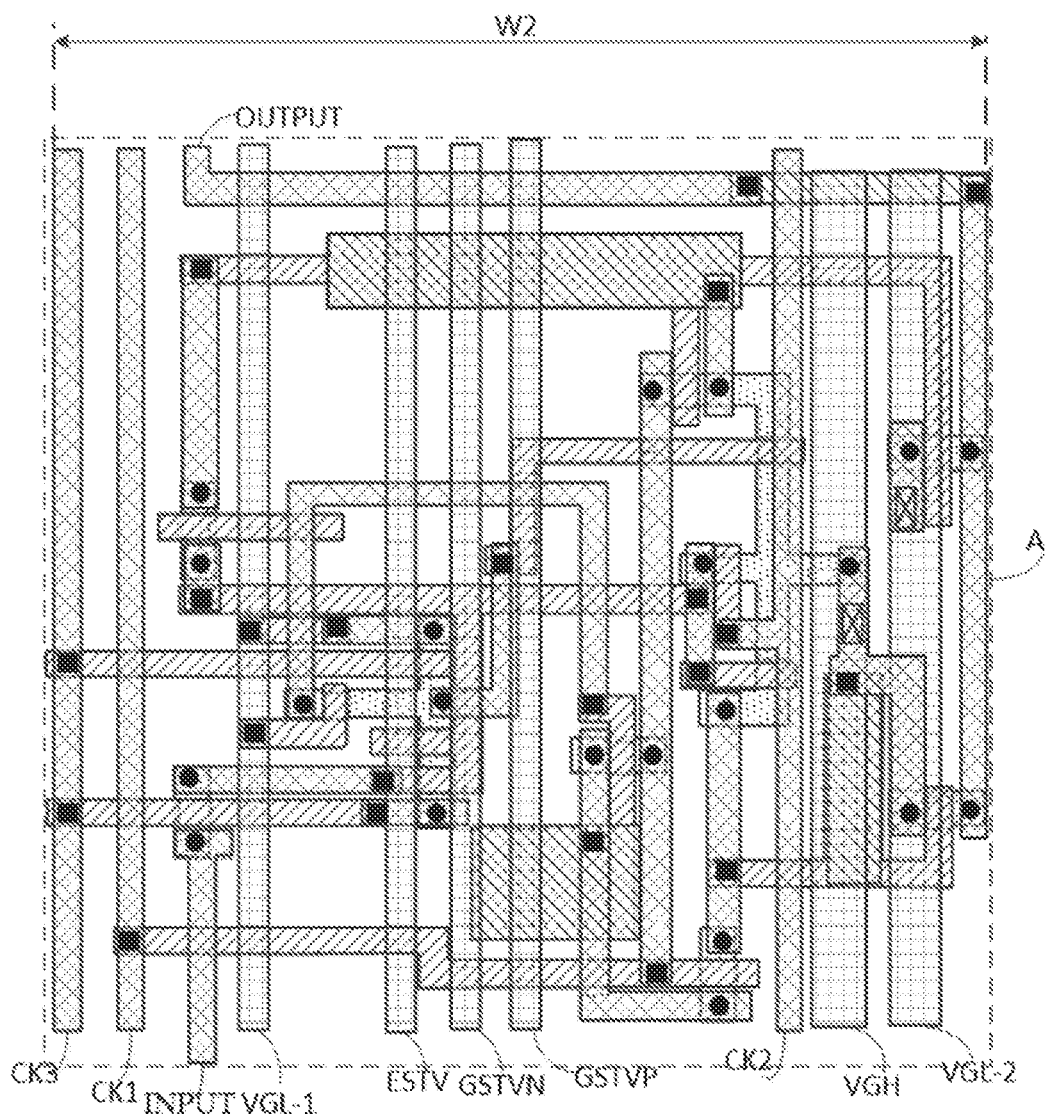
FIG. 4A is a schematic layout diagram corresponding to the shift register unit shown in FIG. 1.
Figure 5A:
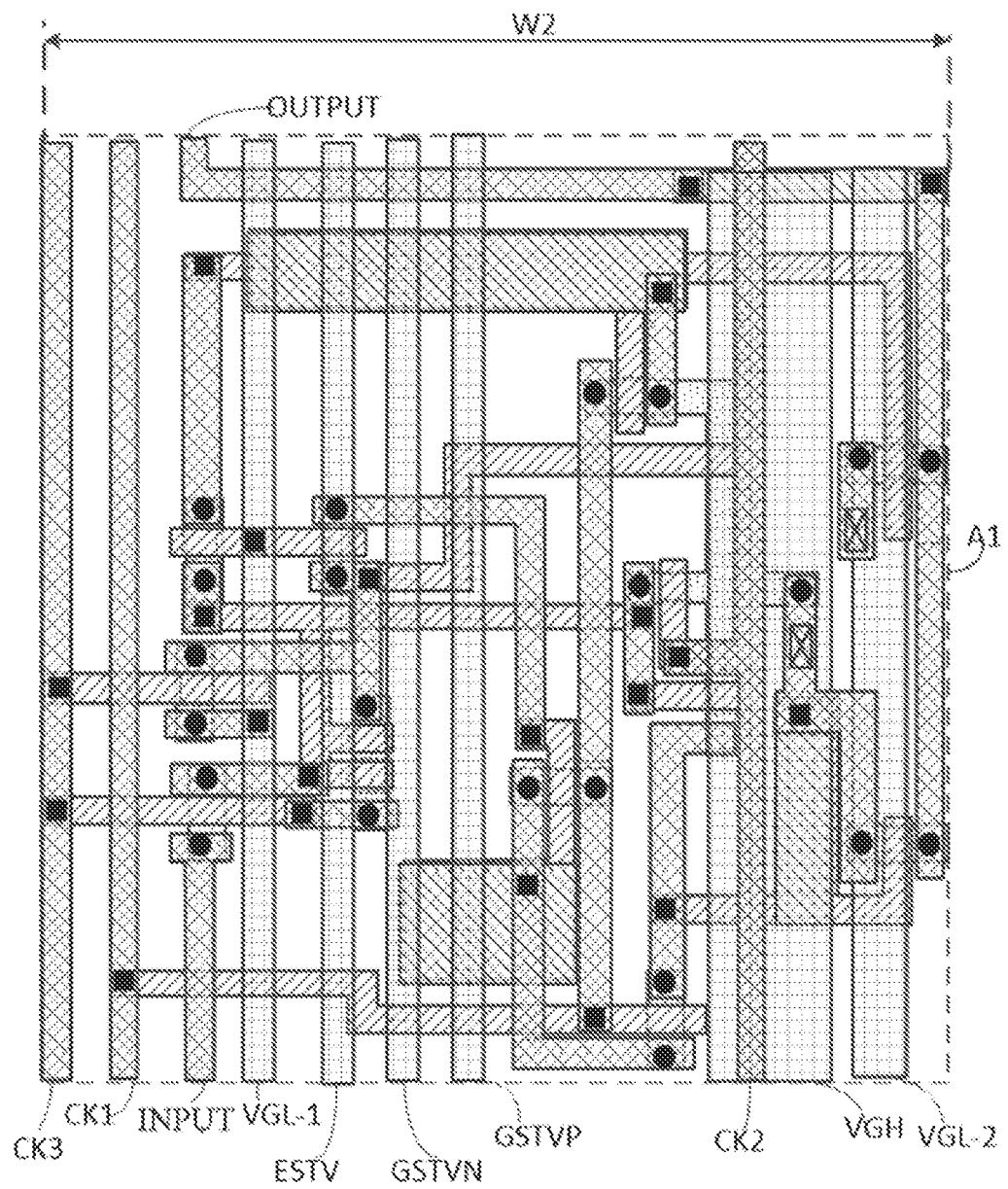
FIG. 5A is a schematic layout diagram corresponding to the shift register unit shown in FIG. 1.
Figure 7A:
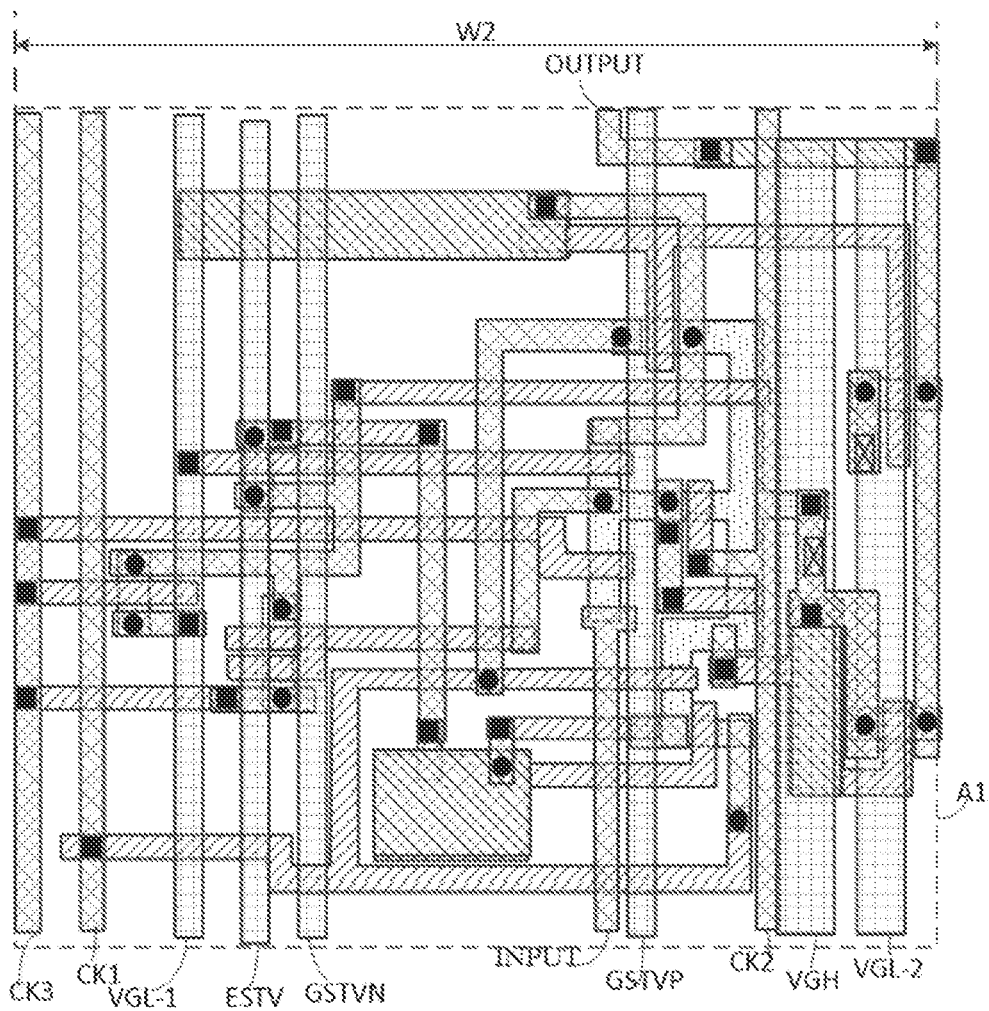
FIG. 7A is a schematic layout diagram corresponding to the shift register unit shown in FIG. 1.

FIG. 2A is a schematic layout diagram of the shift register unit shown in FIG. 1; FIG. 3A is a schematic layout diagram of the shift register unit shown in FIG. 1; FIG. 4A is a schematic layout diagram of the shift register unit shown in FIG. 1; FIG. 5A is a schematic layout diagram of the shift register unit shown in FIG. 1; FIG. 7A is a schematic layout diagram of the shift register unit shown in FIG. 1.

In FIG. 2A, FIG. 3A, FIG. 4A, FIG. 5A, FIG. 6A and FIG. 7A, the first direction may be a vertical direction, and the second direction may be a horizontal direction, but not limited thereto.

In FIG. 2A, FIG. 3A, FIG. 4A, FIG. 5A, FIG. 6A and FIG. 7A, the one labeled A1 is the first driving circuit area, and a shift register unit, a second start signal line GSTVP and a third start signal line ESTV are arranged on the first driving circuit area A1, the width of the shift register unit in the horizontal direction is W2.

In at least one embodiment of the present disclosure, the first driving circuit area A1 is included in the driving circuit area.

In FIG. 2G, FIG. 3G, FIG. 4G, FIG. 5G, FIG. 6G and FIG. 7G, the pixel pitch value is labeled P0.

Figure 2B:
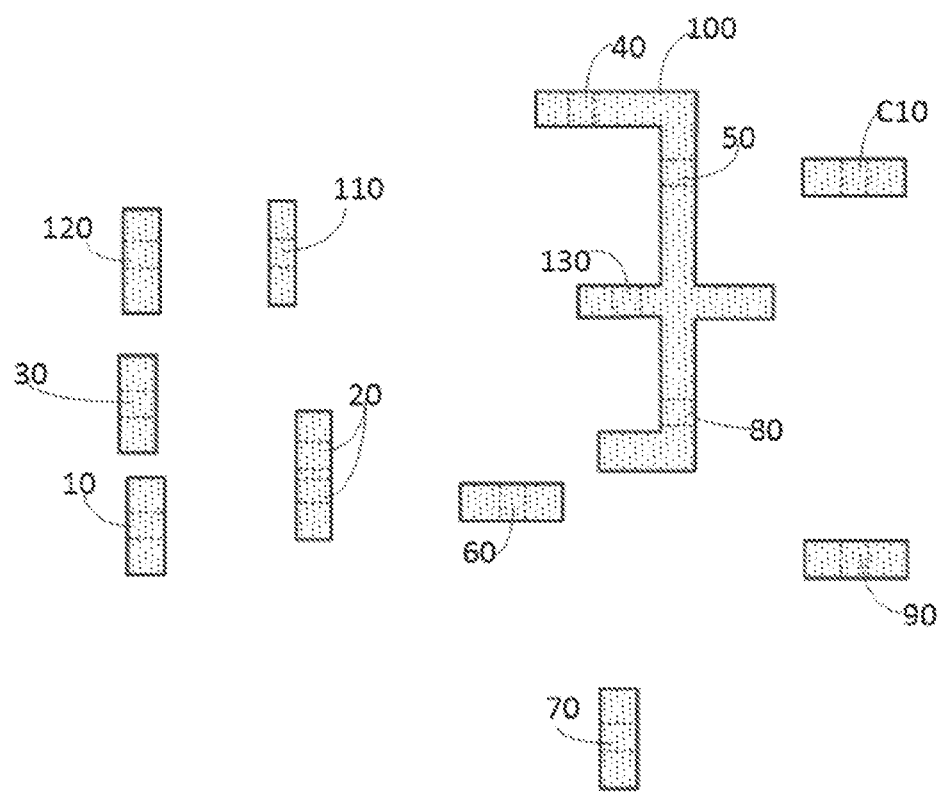
FIG. 2B is a layout diagram of the active layer in FIG. 2A.
Figure 2C:
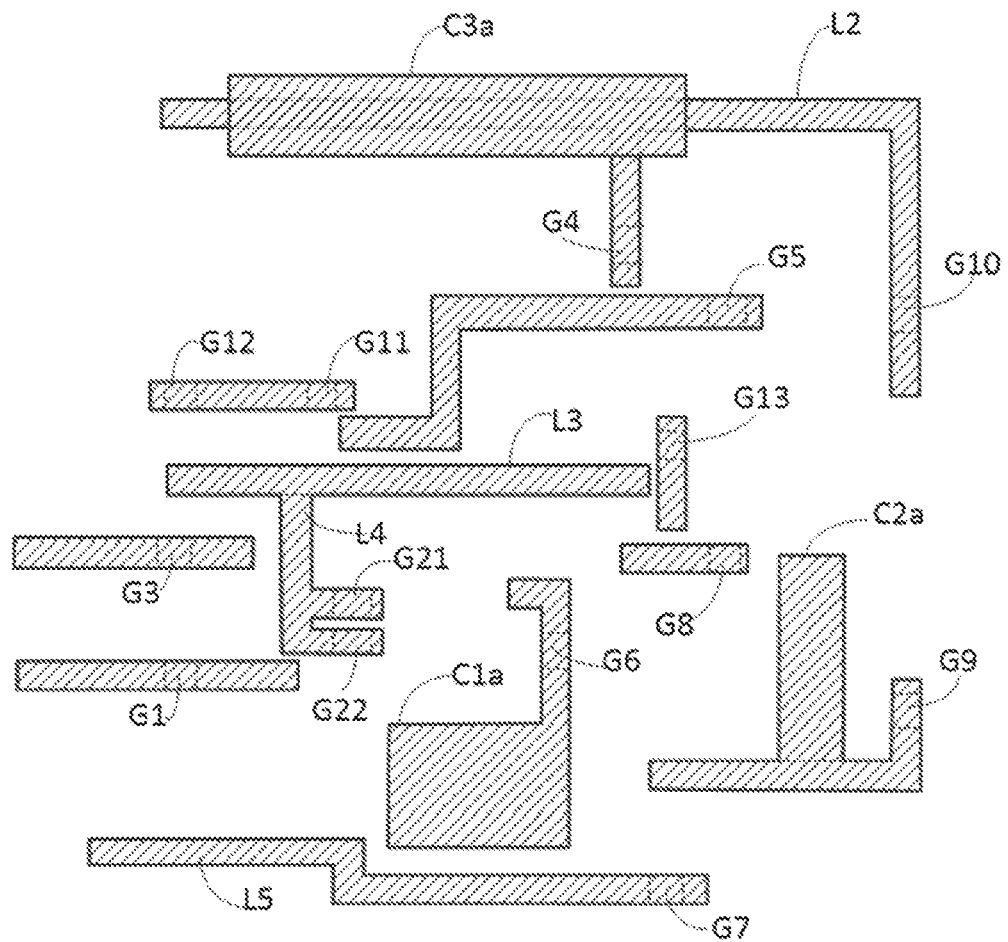
FIG. 2C is a layout diagram of the first gate metal layer in FIG. 2A.
Figure 2D:
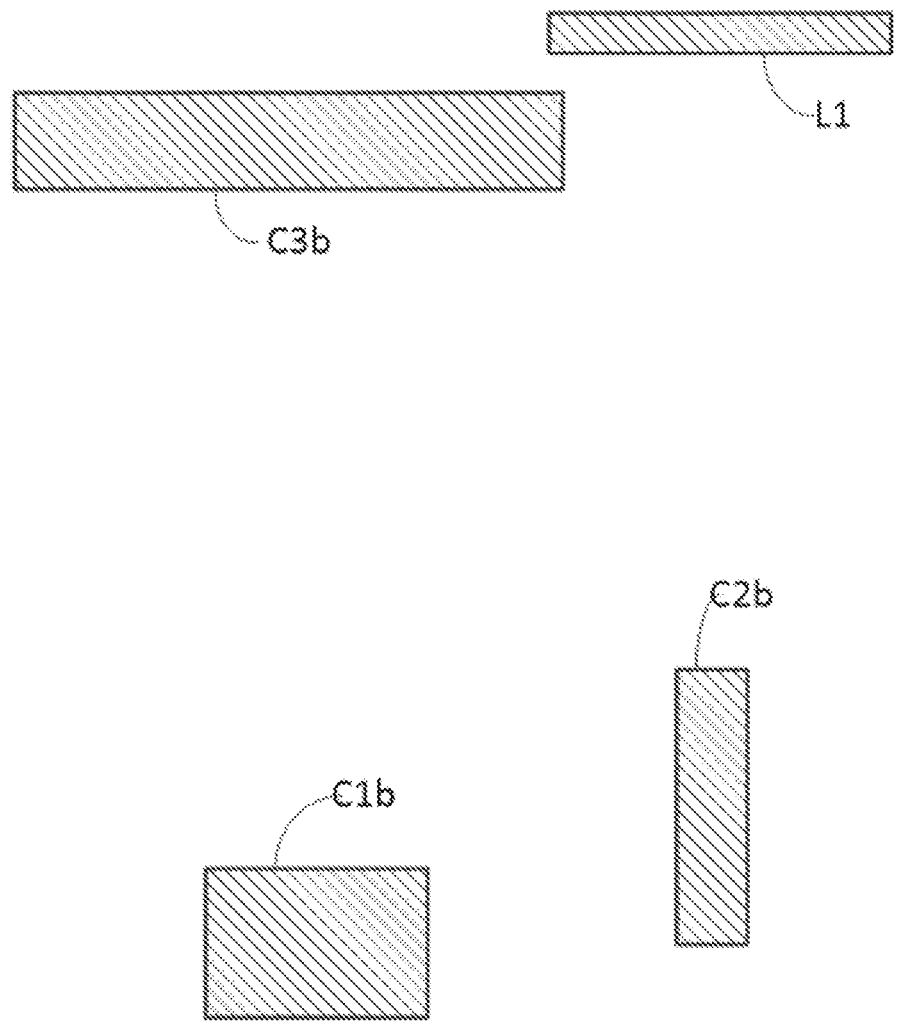
FIG. 2D is a layout diagram of the second gate metal layer in FIG. 2A.
Figure 2E:
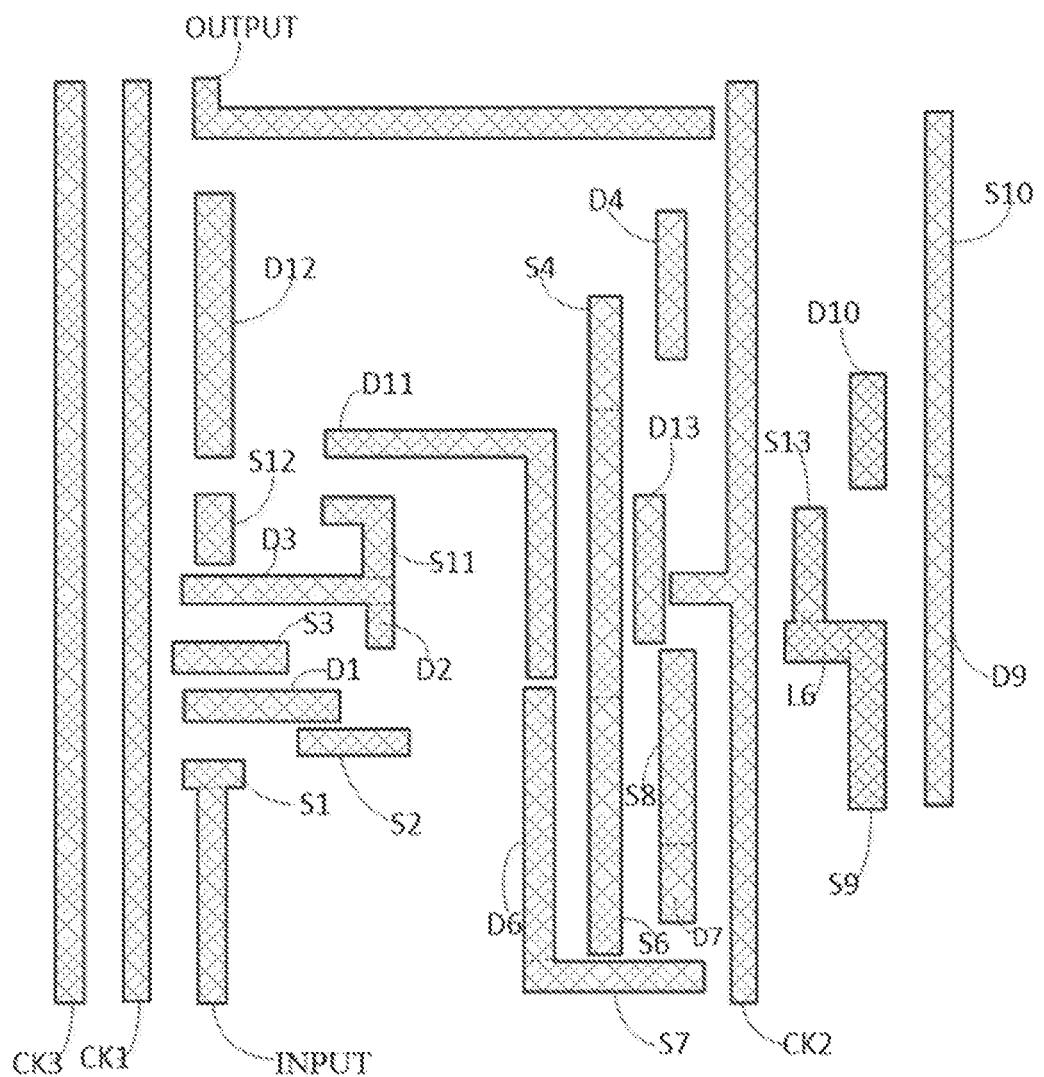
FIG. 2E is a layout diagram of the first source-drain metal layer in FIG. 2A.
Figure 2F:
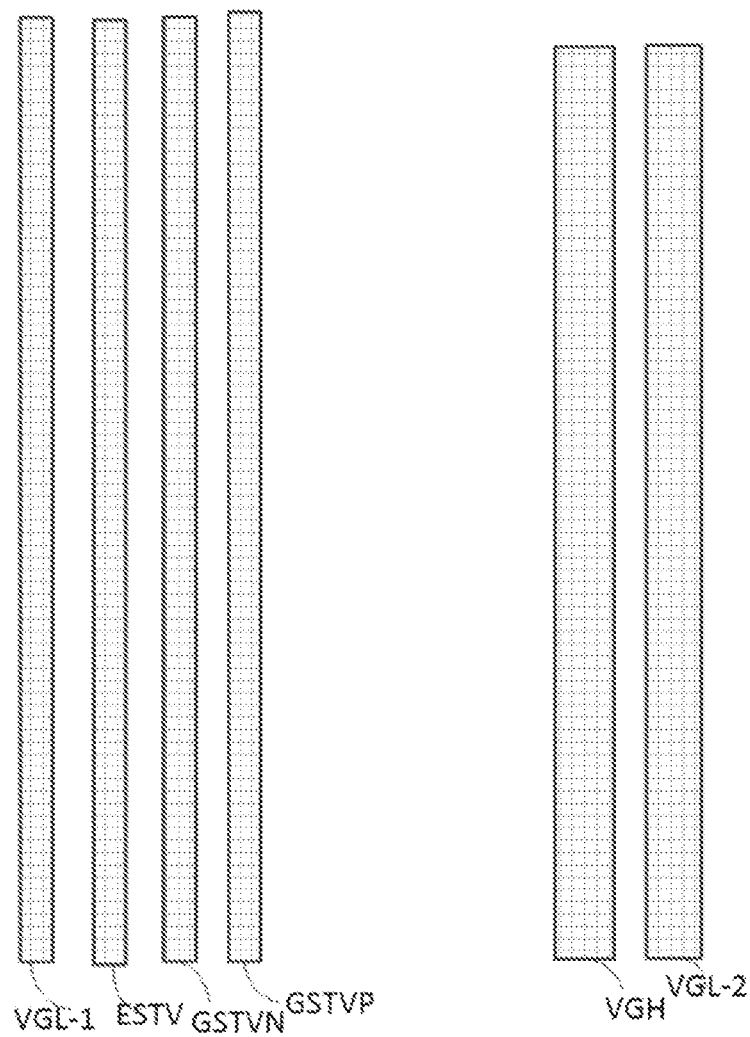
FIG. 2F is a layout diagram of the second source-drain metal layer in FIG. 2A.
Figure 2G:
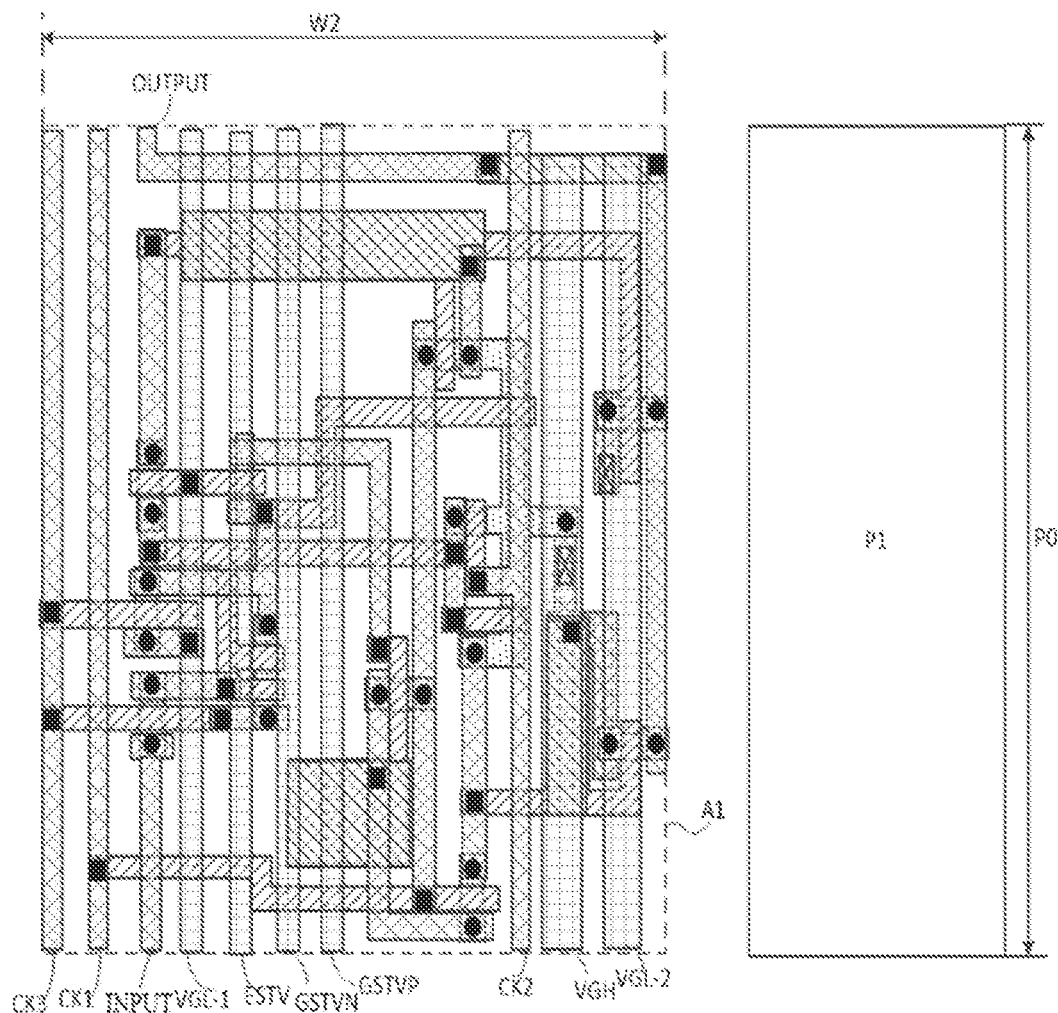
FIG. 2G is a schematic diagram of adding a pixel unit P1 on the basis of FIG. 2A.
Figure 3B:
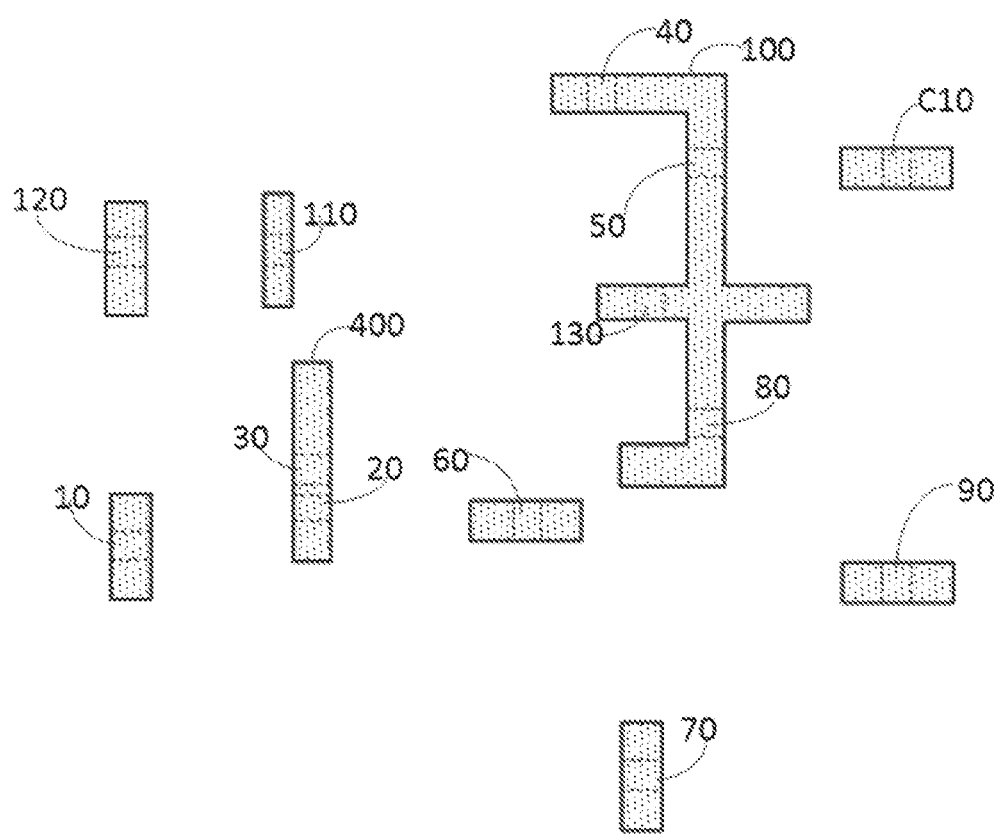
FIG. 3B is a layout diagram of the active layer in FIG. 3A.
Figure 3C:
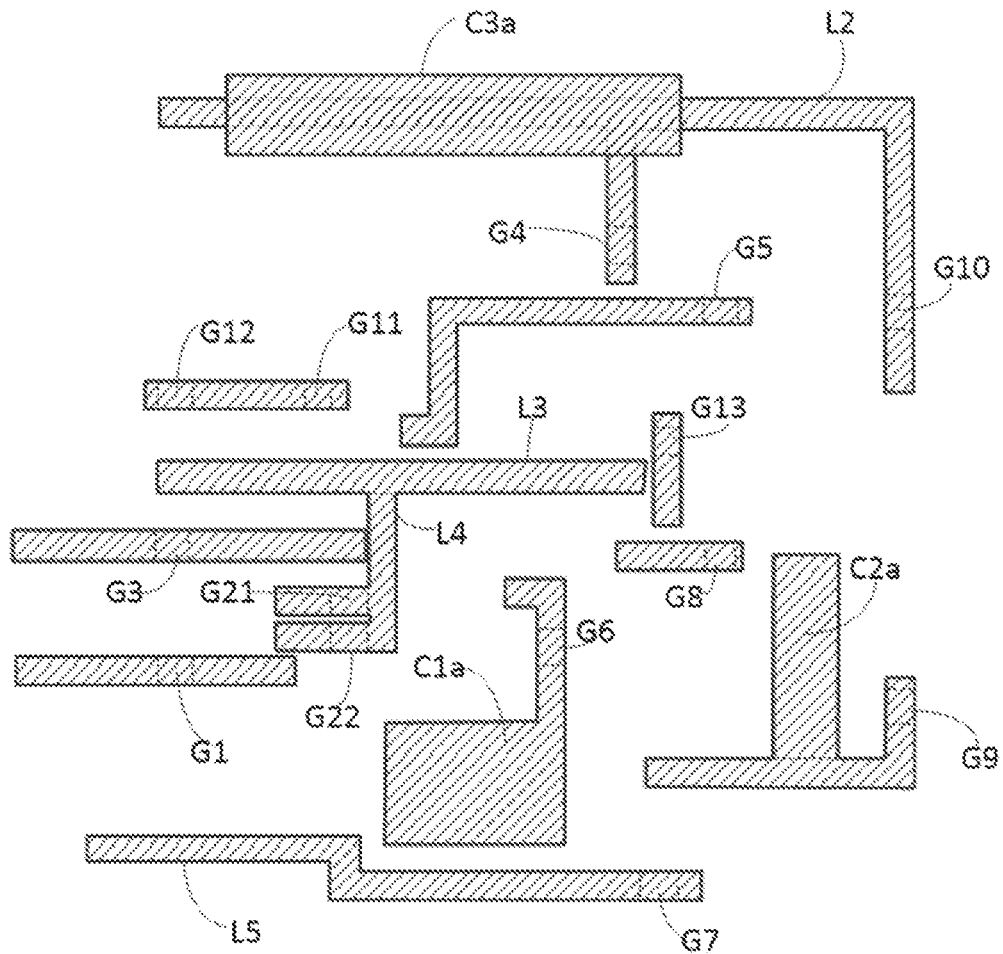
FIG. 3C is a layout diagram of the first gate metal layer in FIG. 3A.
Figure 3D:
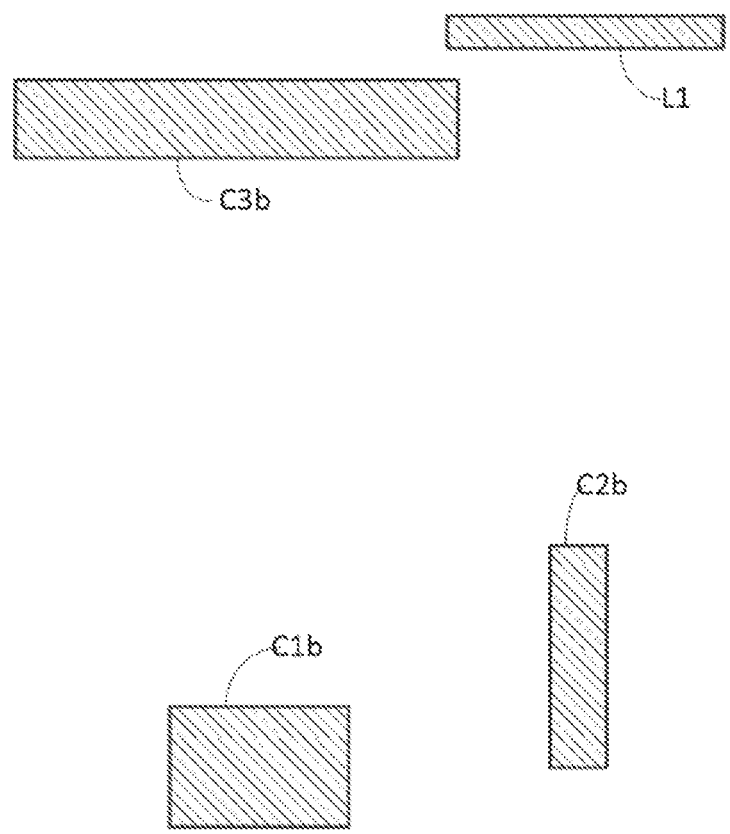
FIG. 3D is a layout diagram of the second gate metal layer in FIG. 3A.
Figure 3E:
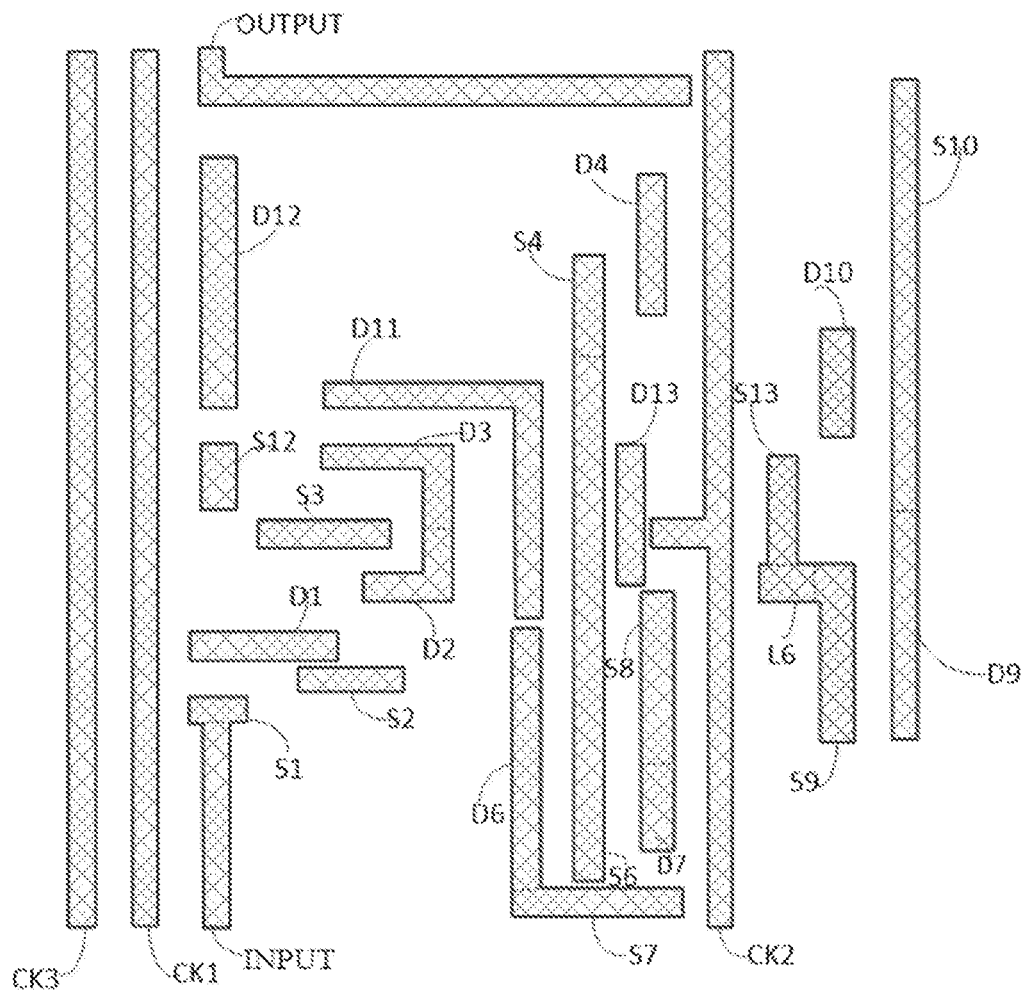
FIG. 3E is a layout diagram of the first source-drain metal layer in FIG. 3A.
Figure 3F:
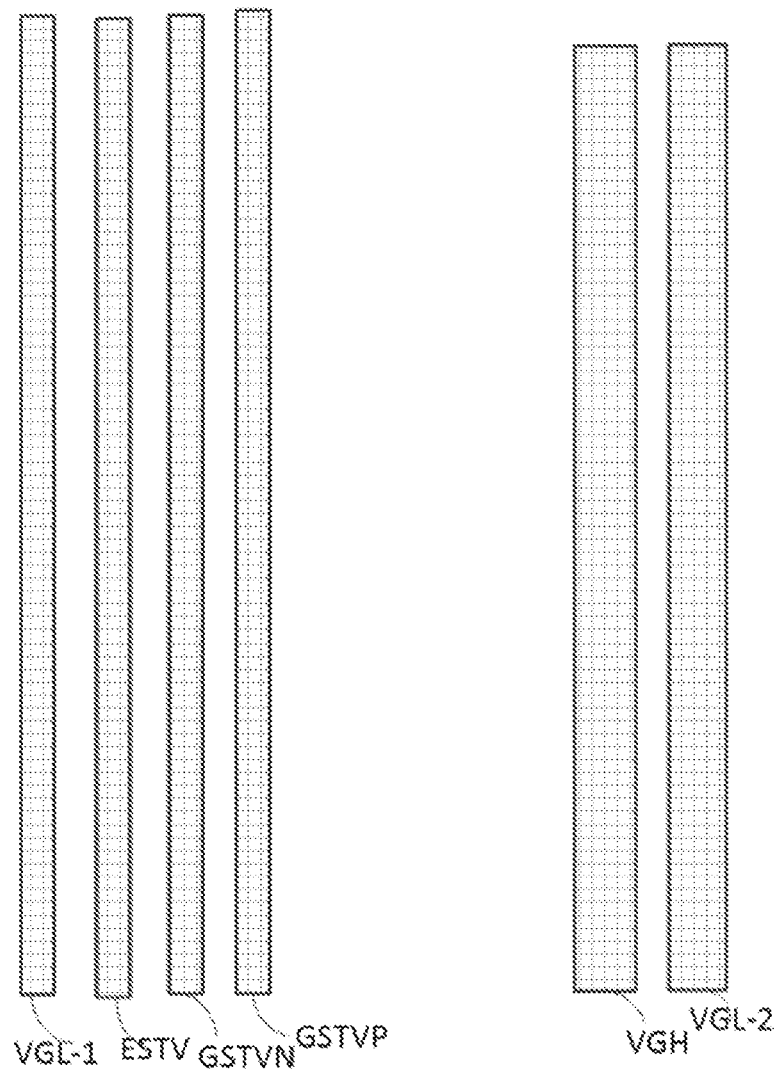
FIG. 3F is a layout diagram of the second source-drain metal layer in FIG. 3A.
Figure 3G:
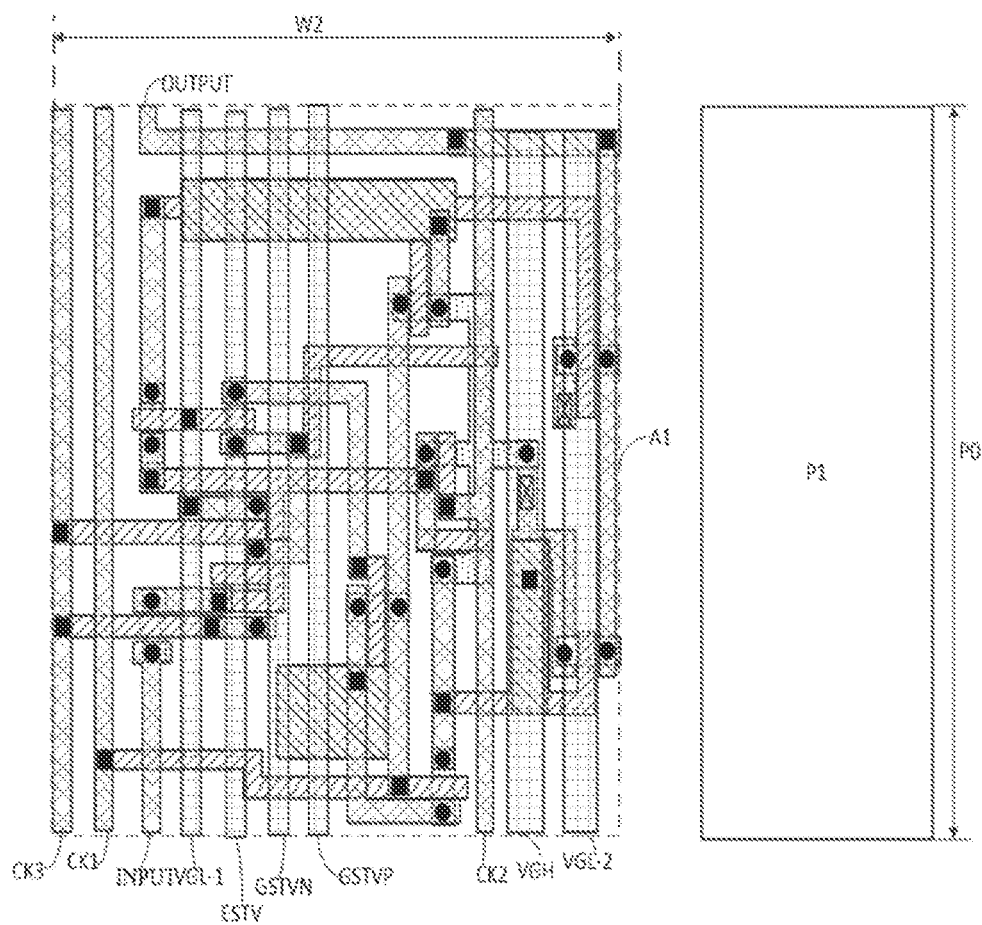
FIG. 3G is a schematic diagram of adding a pixel unit P1 on the basis of FIG. 3A.
Figure 4B:
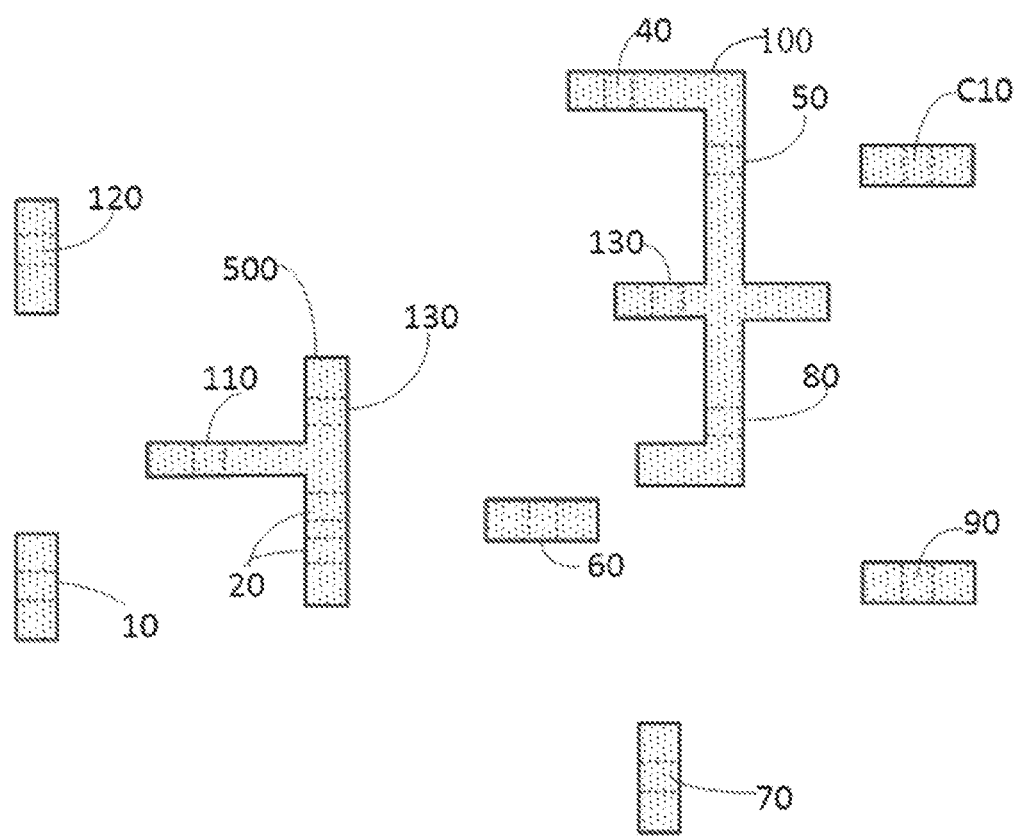
FIG. 4B is a layout diagram of the active layer in FIG. 4A.
Figure 4C:
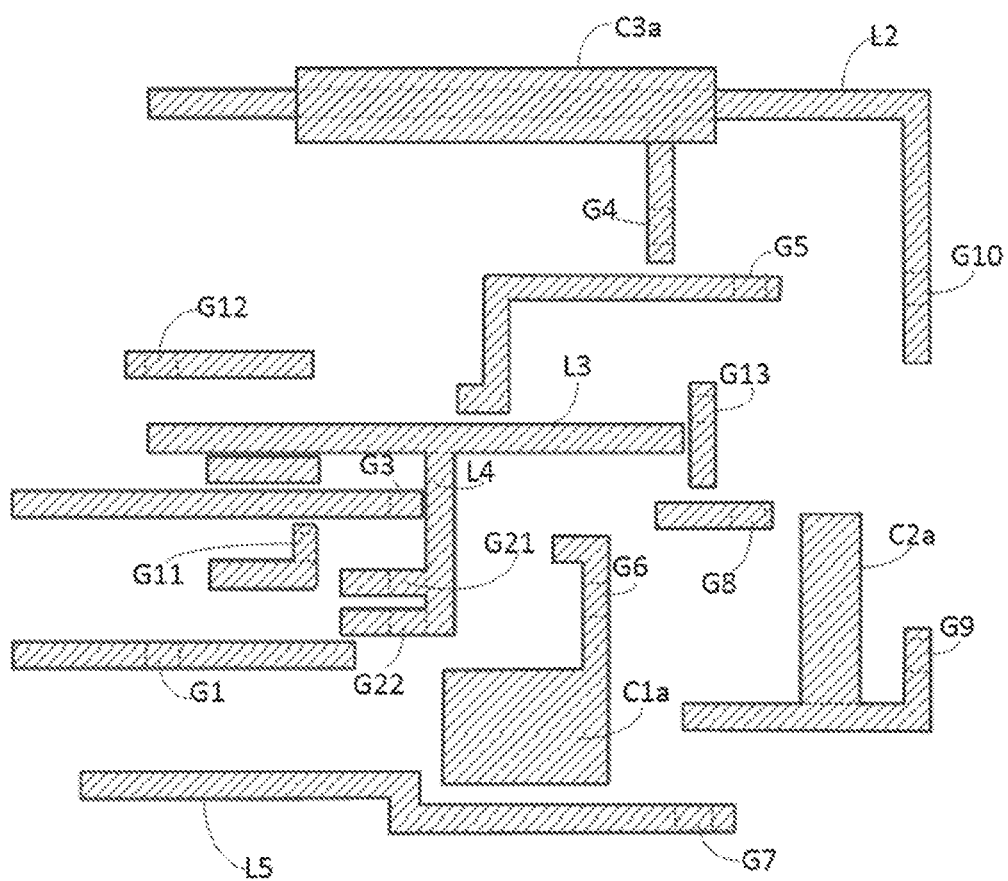
FIG. 4C is a layout diagram of the first gate metal layer in FIG. 4A.
Figure 4D:
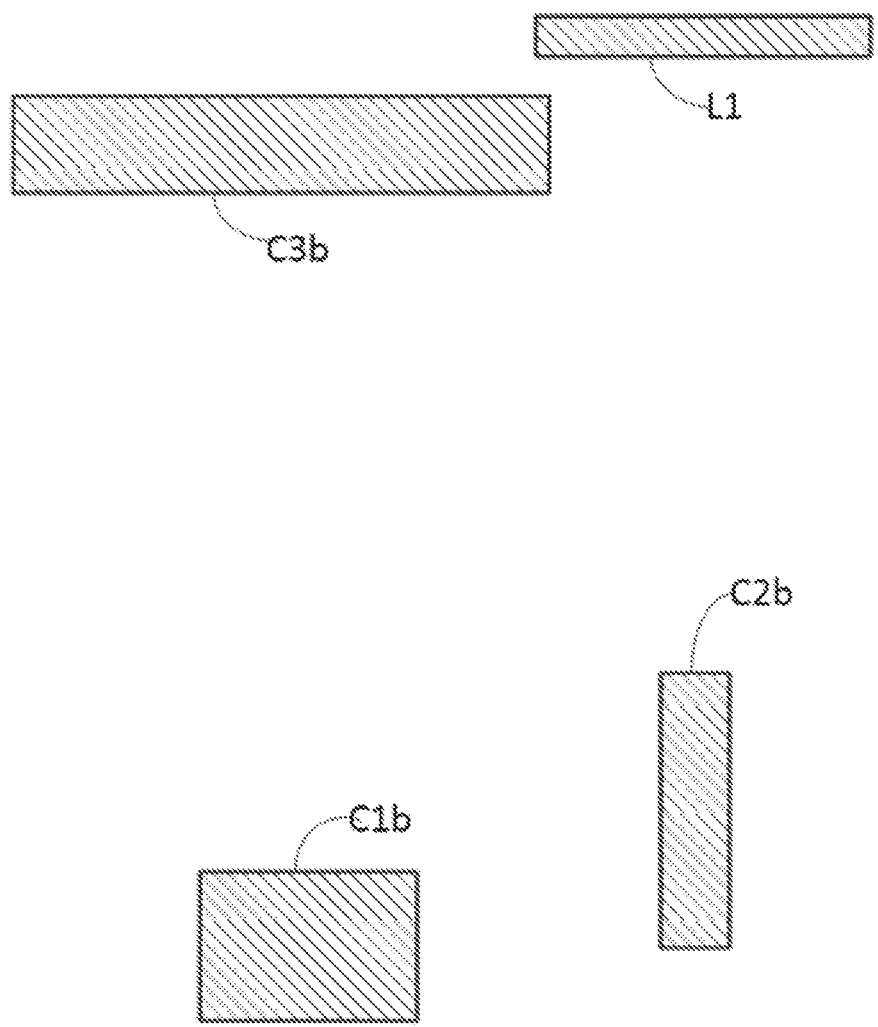
FIG. 4D is a layout diagram of the second gate metal layer in FIG. 4A.
Figure 4E:
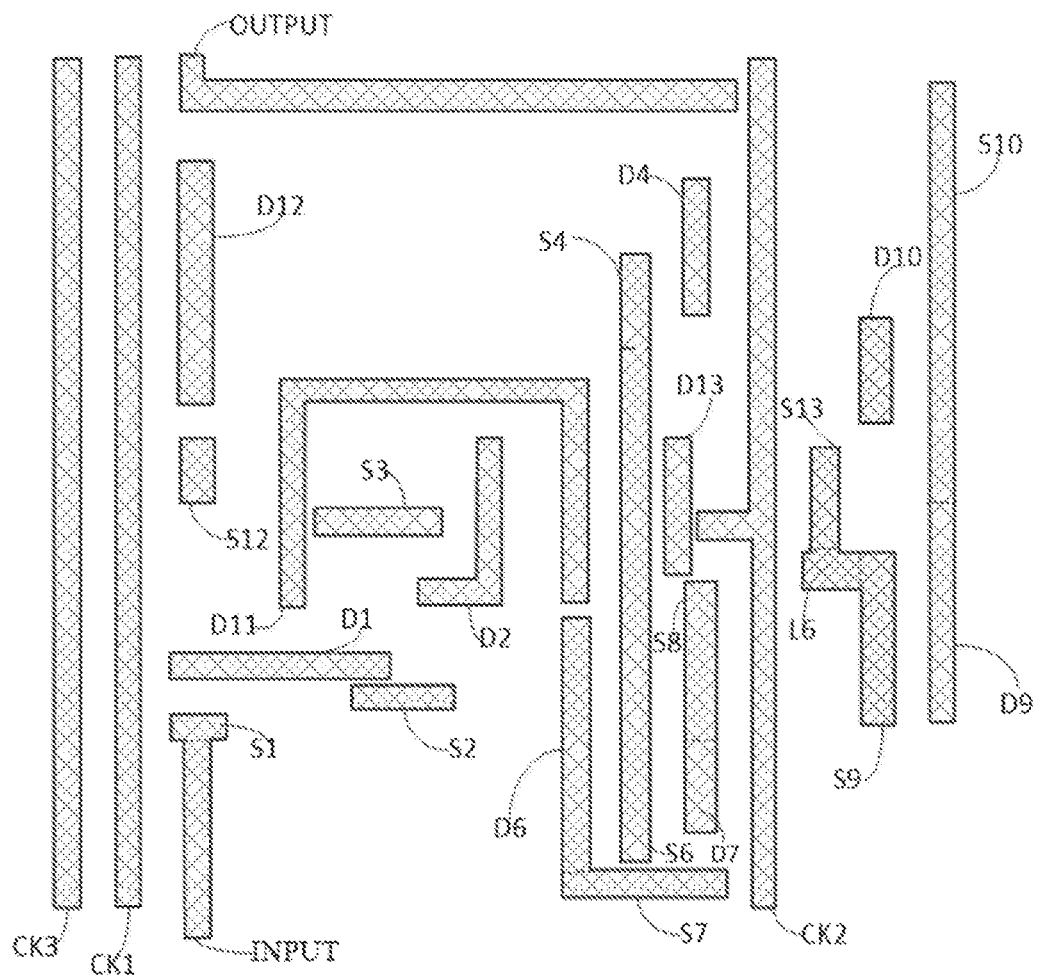
FIG. 4E is a layout diagram of the first source-drain metal layer in FIG. 4A.
Figure 4F:
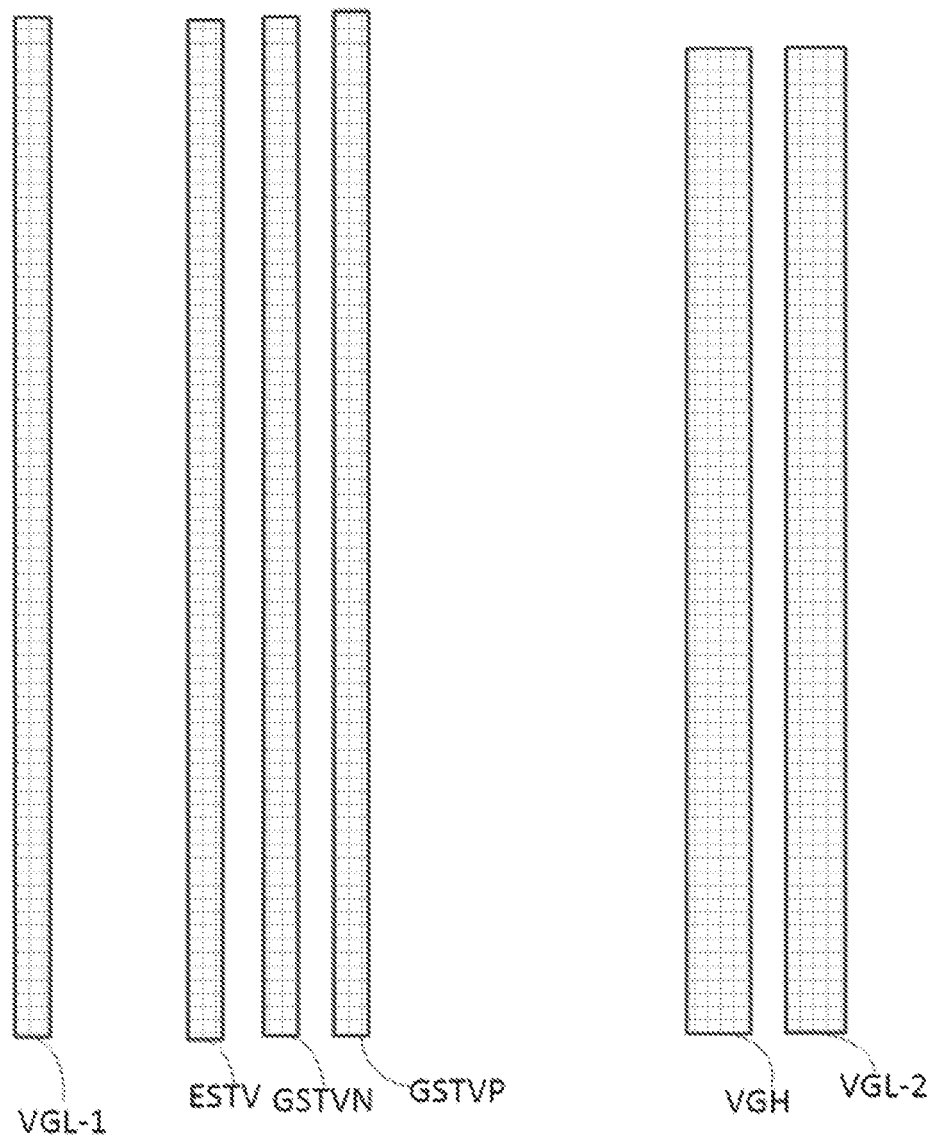
FIG. 4F is a layout diagram of the second source-drain metal layer in FIG. 4A.
Figure 4G:
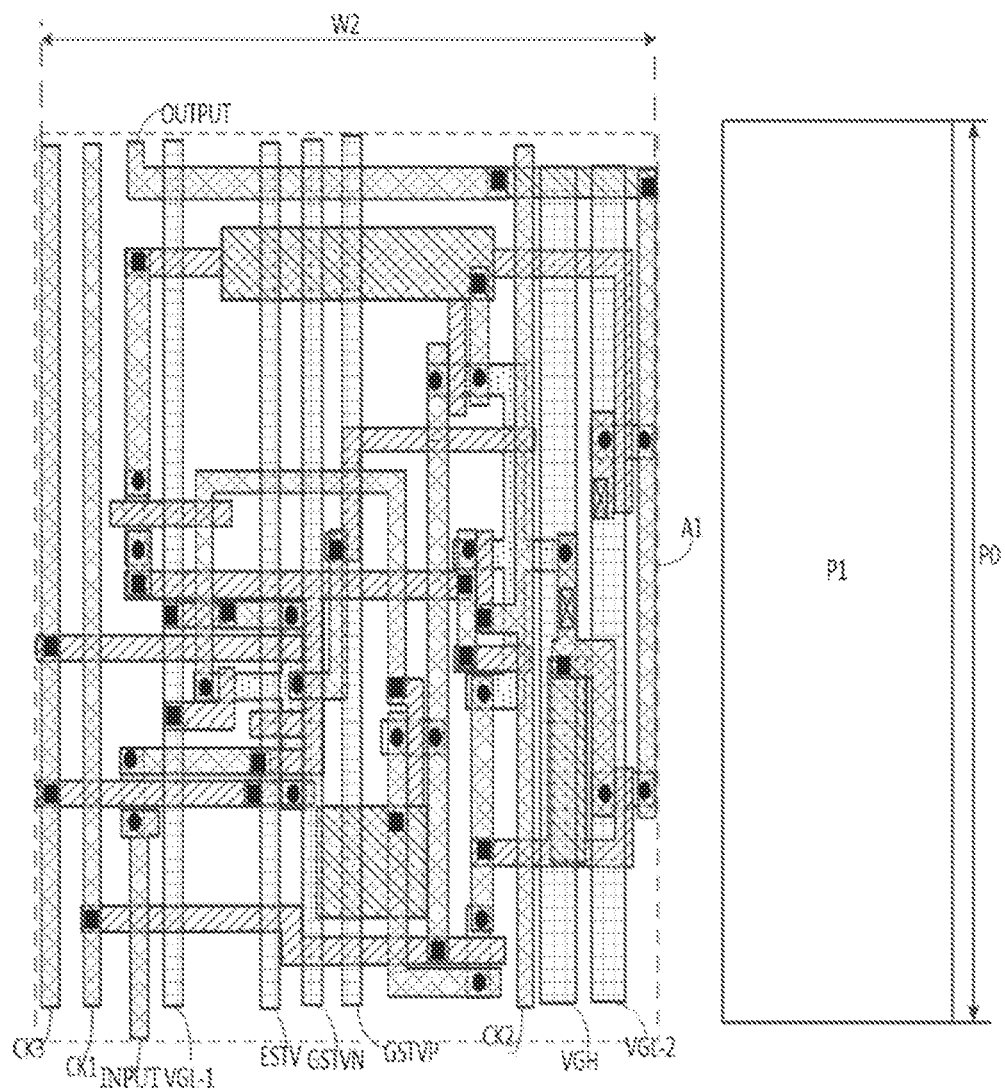
FIG. 4G is a schematic diagram of adding a pixel unit P1 on the basis of FIG. 4A.
Figure 5B:
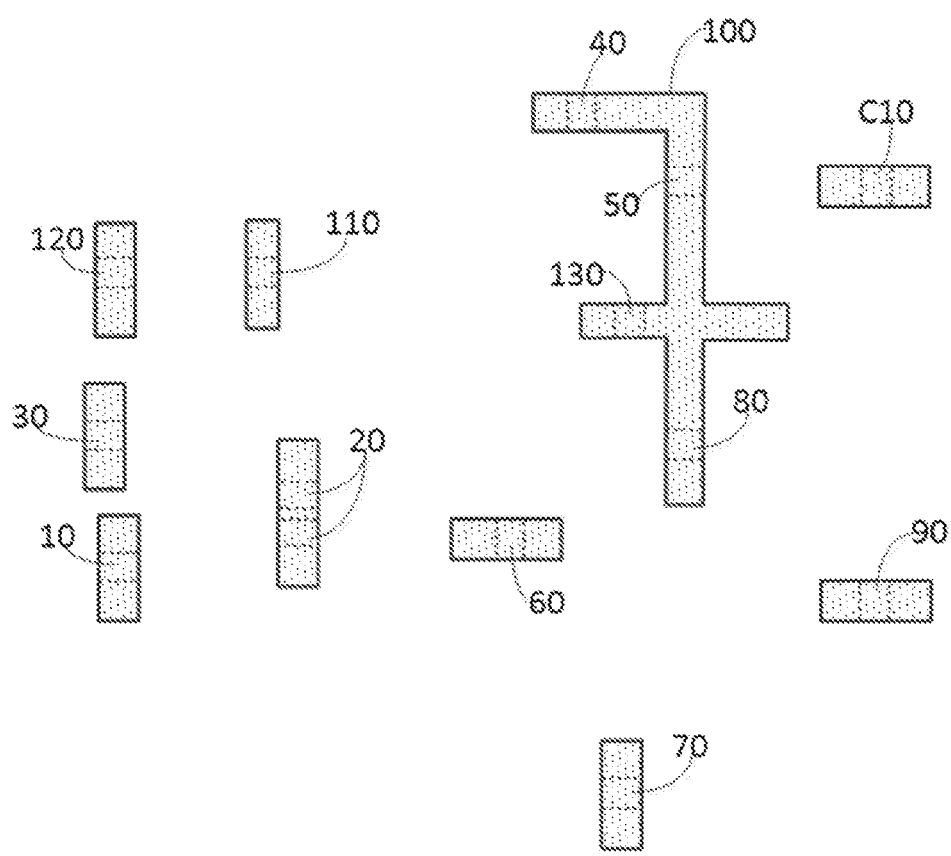
FIG. 5B is a layout diagram of the active layer in FIG. 5A.
Figure 5C:
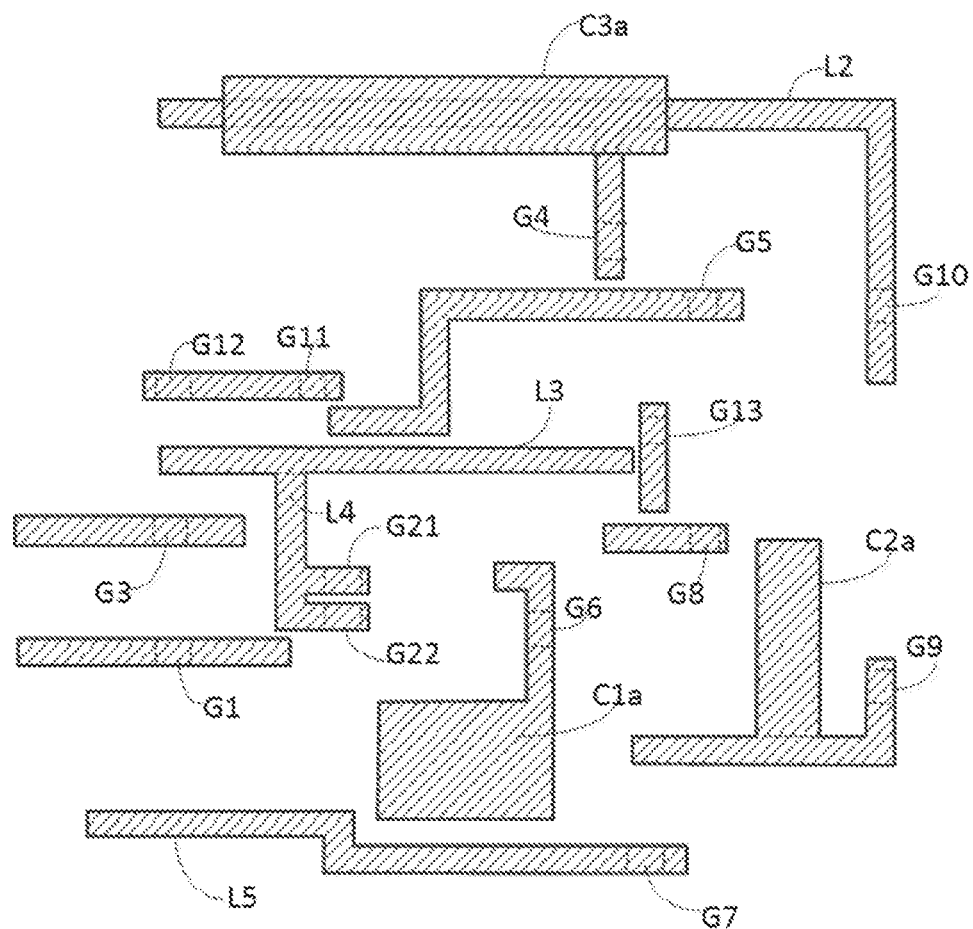
FIG. 5C is a layout diagram of the first gate metal layer in FIG. 5A.
Figure 5D:
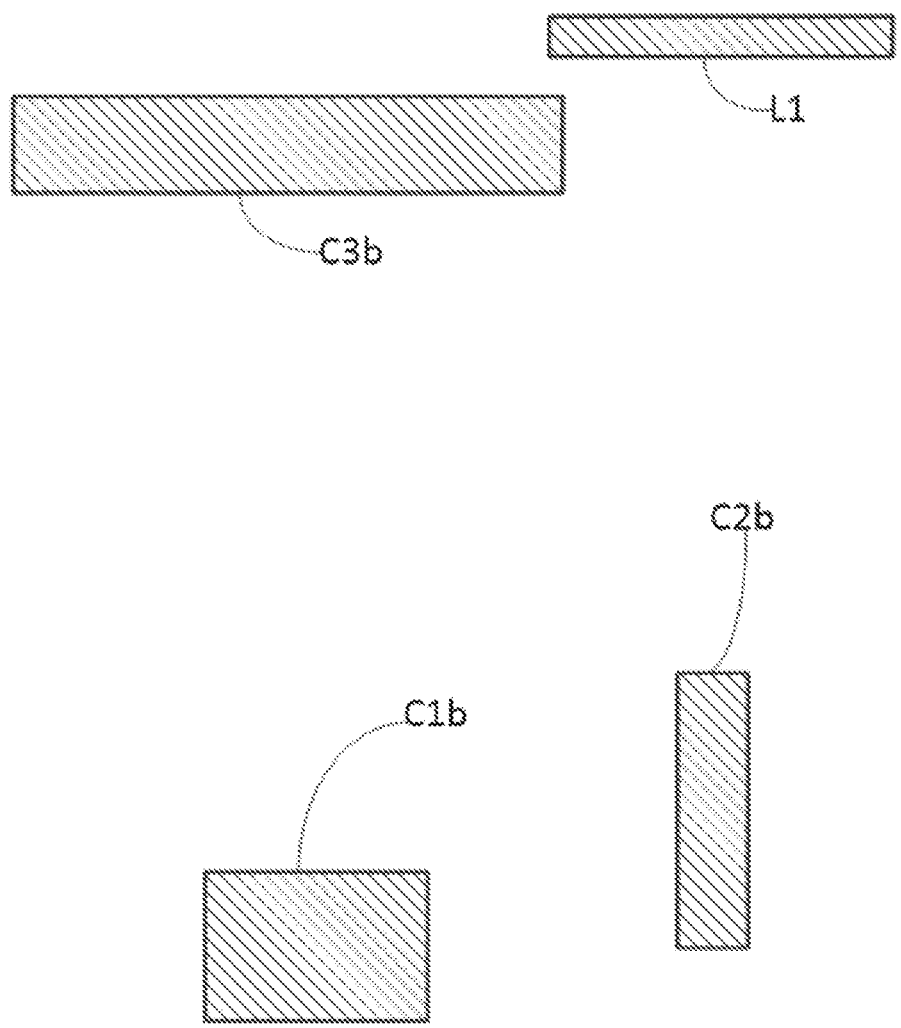
FIG. 5D is a layout diagram of the second gate metal layer in FIG. 5A.
Figure 5E:
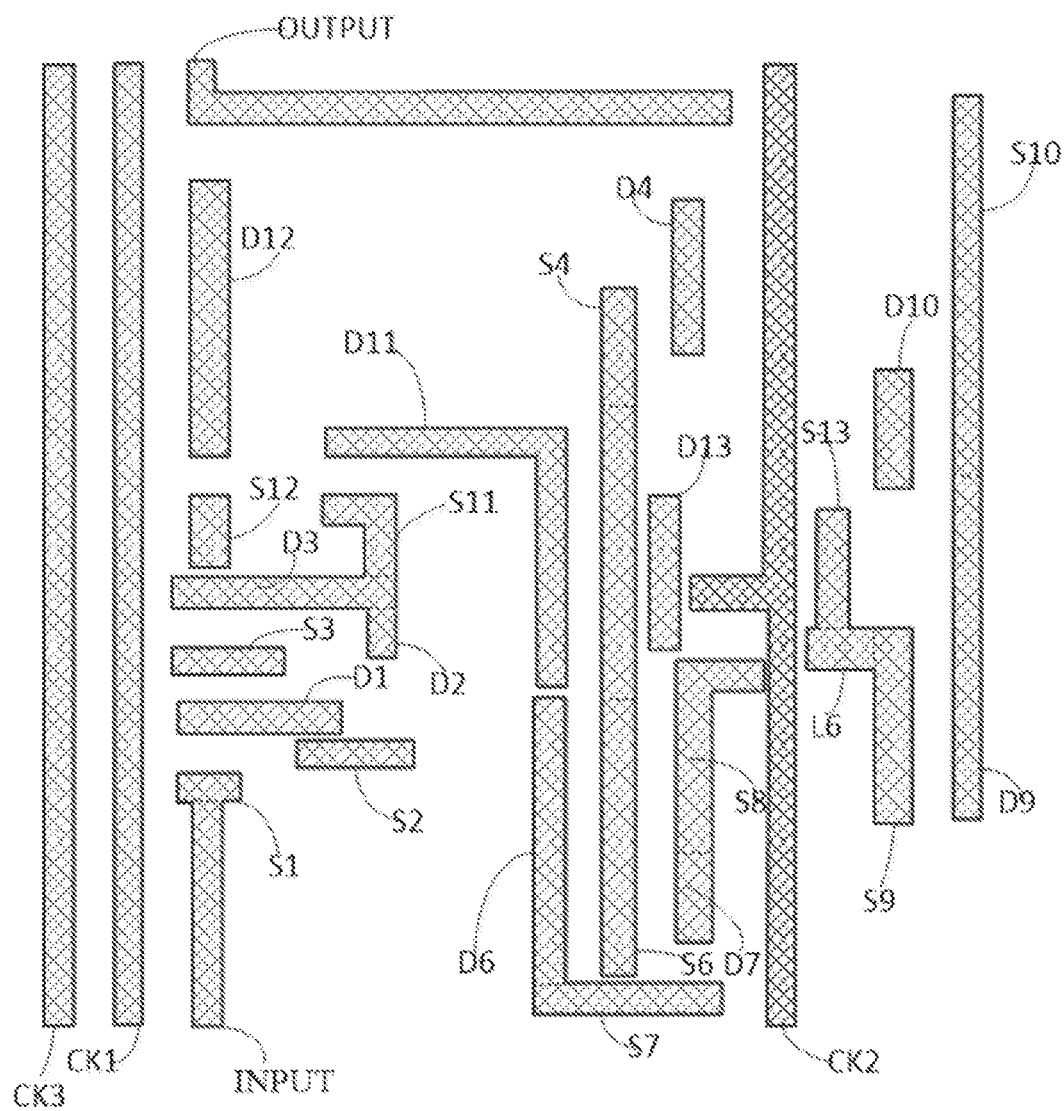
FIG. 5E is a layout diagram of the first source-drain metal layer in FIG. 5A.
Figure 5F:
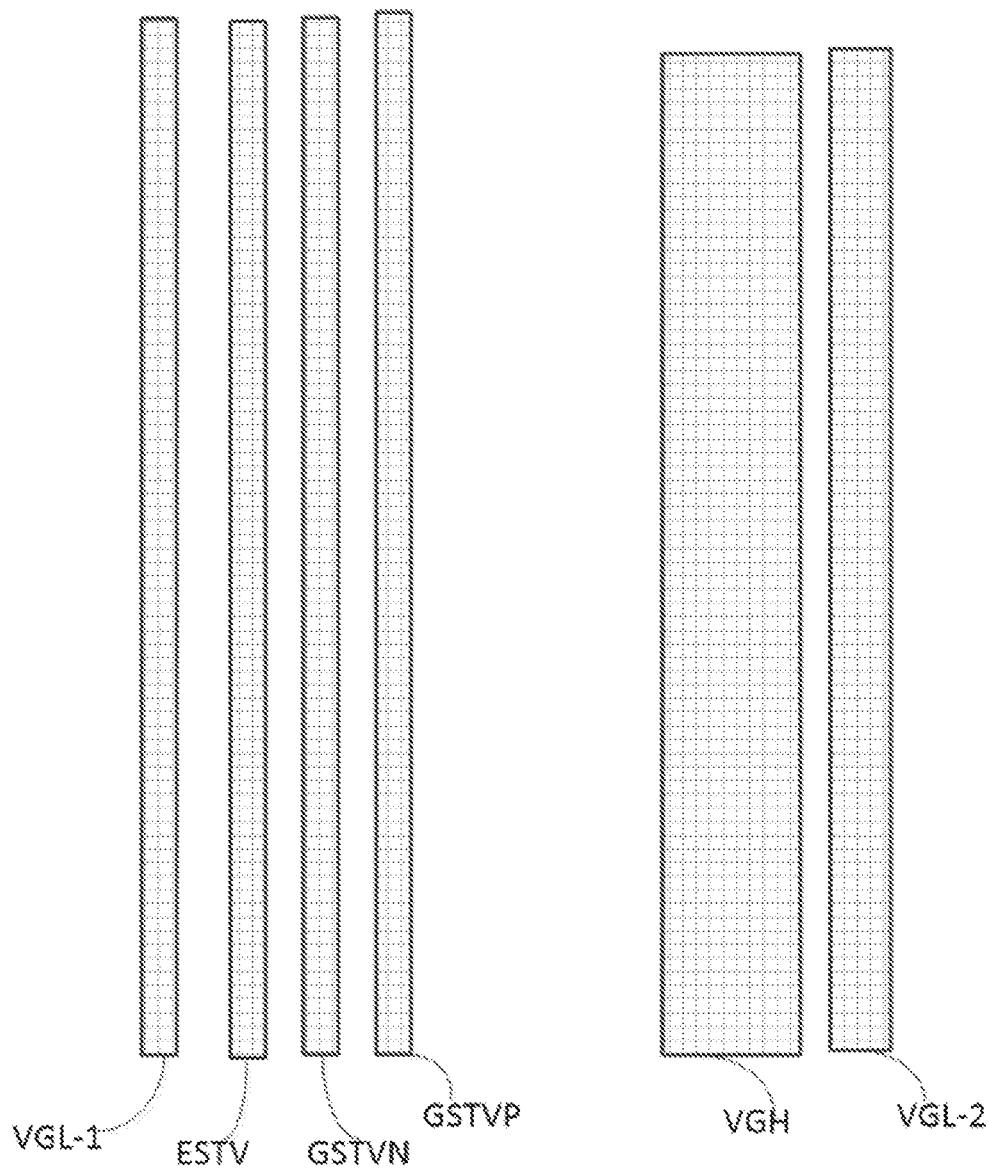
FIG. 5F is a layout diagram of the second source-drain metal layer in FIG. 5A.
Figure 5G:
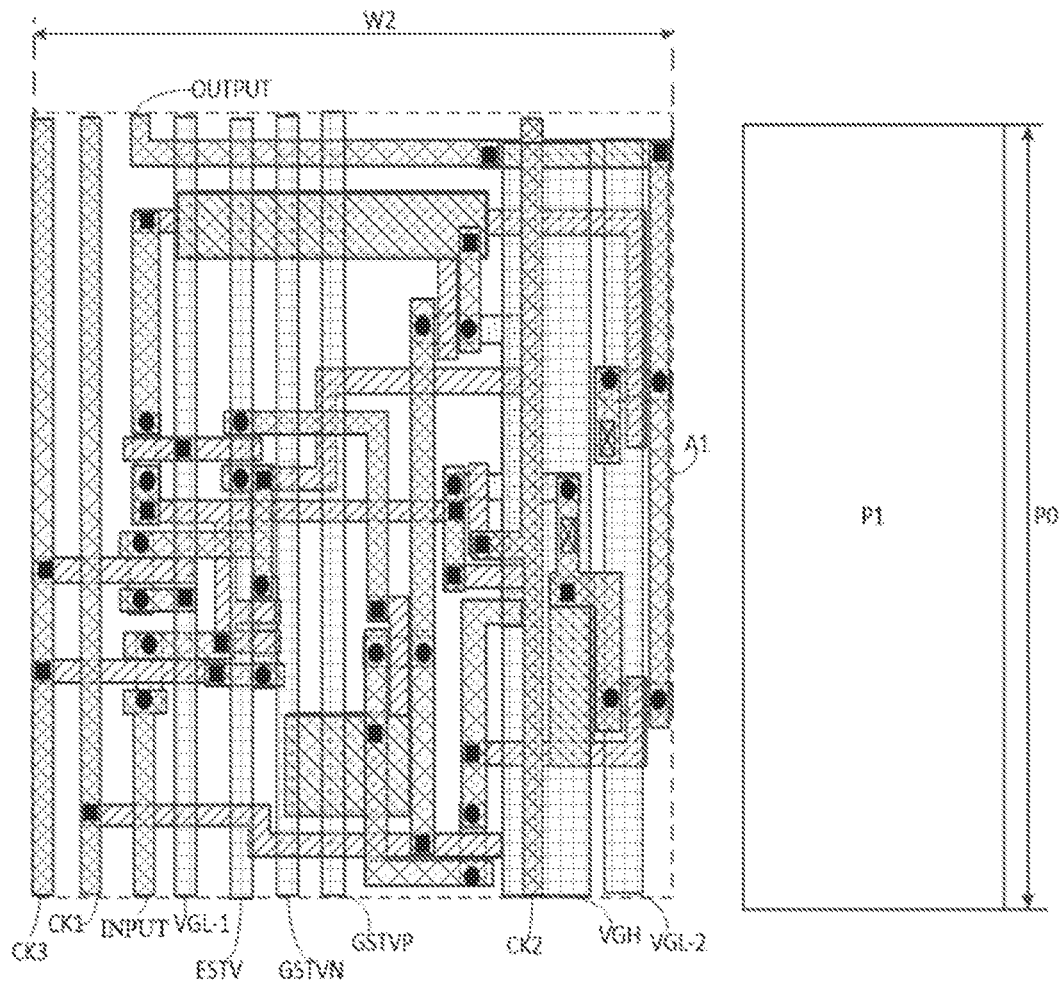
FIG. 5G is a schematic diagram of adding a pixel unit P1 on the basis of FIG. 5A.
Figure 6A:
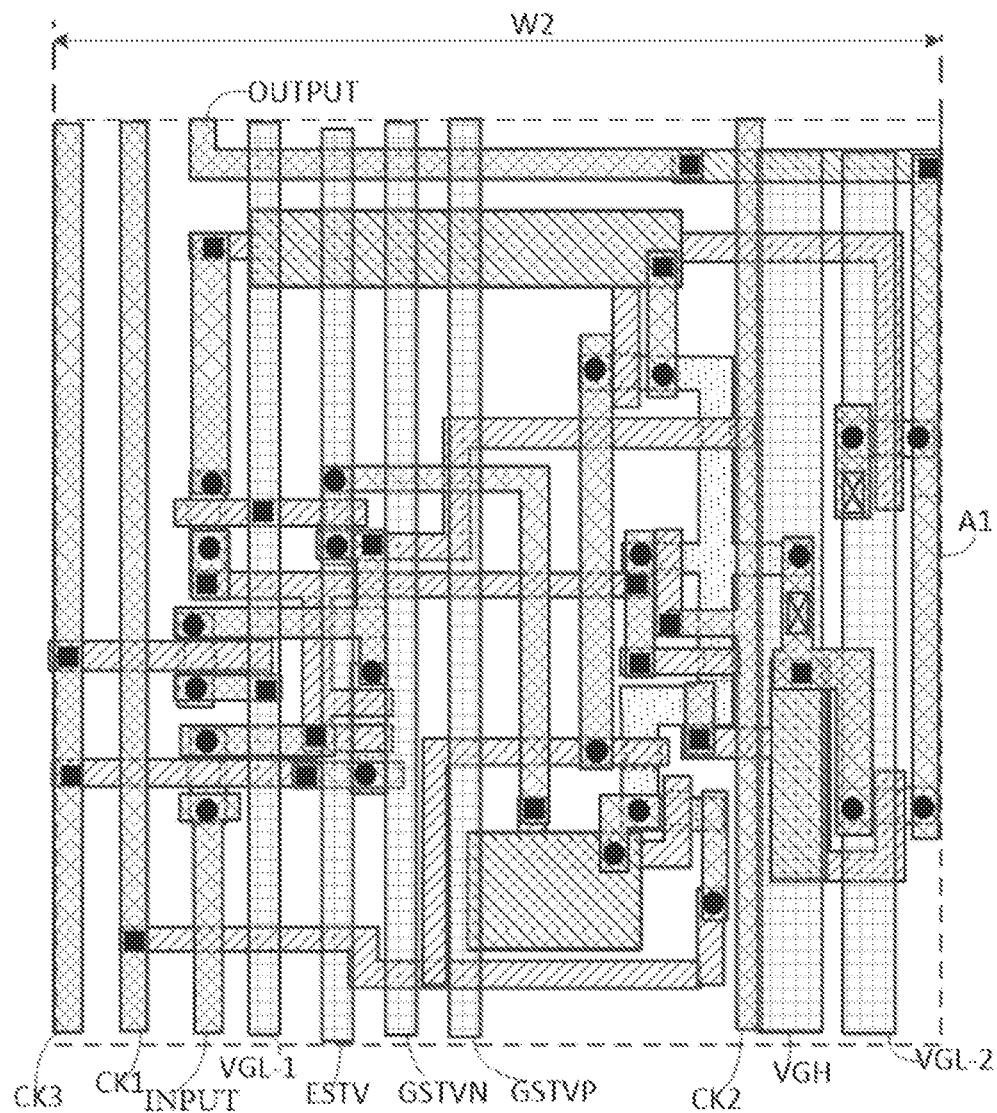
FIG. 6A is a schematic layout diagram corresponding to the shift register unit shown in FIG. 1.
Figure 6B:
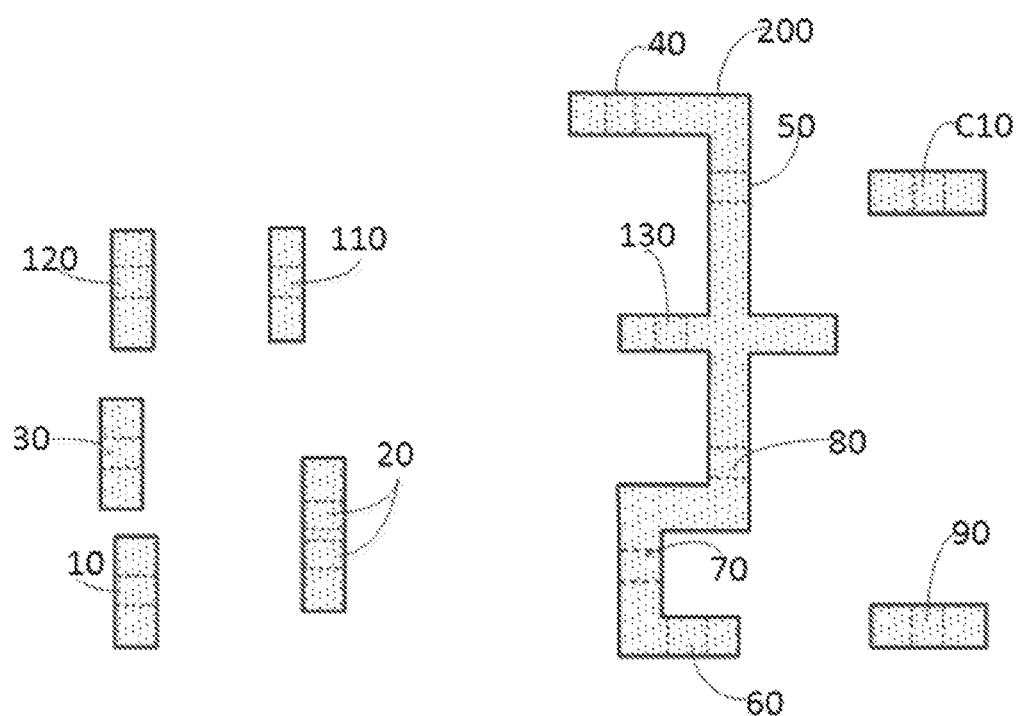
FIG. 6B is a layout diagram of the active layer in FIG. 6A.
Figure 6C:
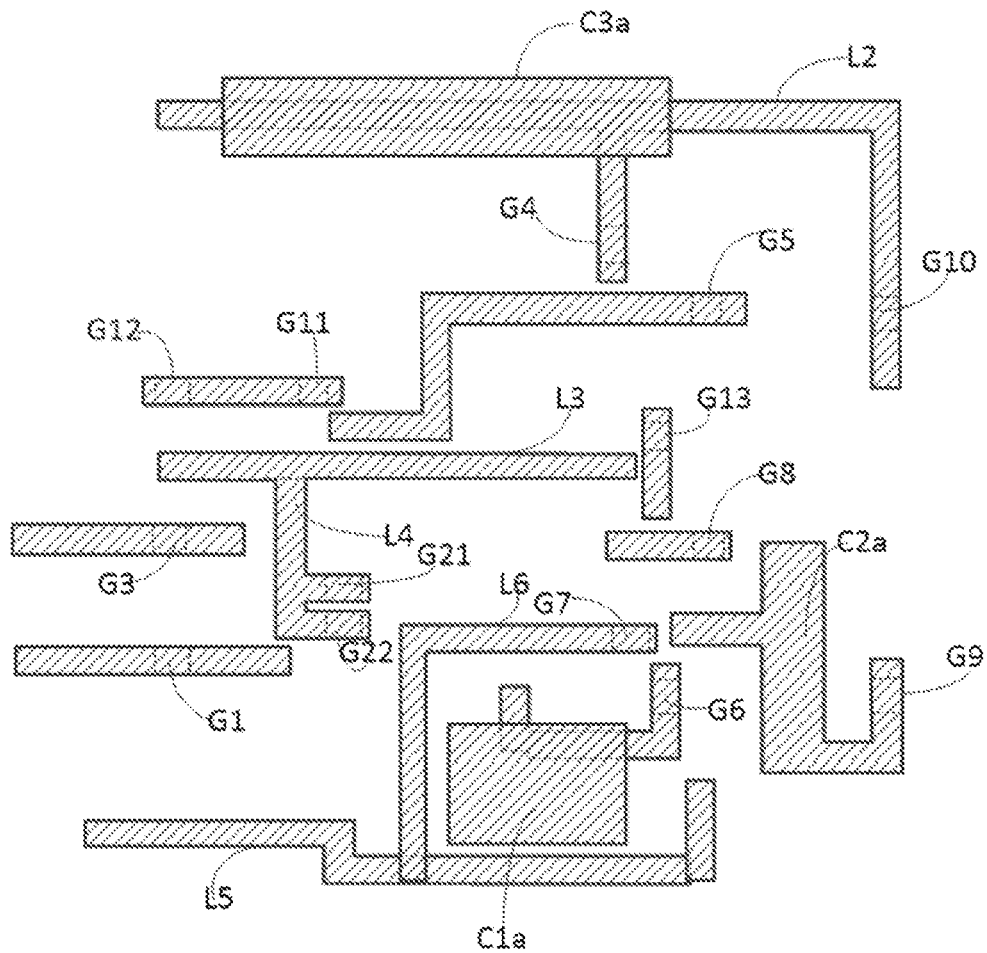
FIG. 6C is a layout diagram of the first gate metal layer in FIG. 6A.
Figure 6D:
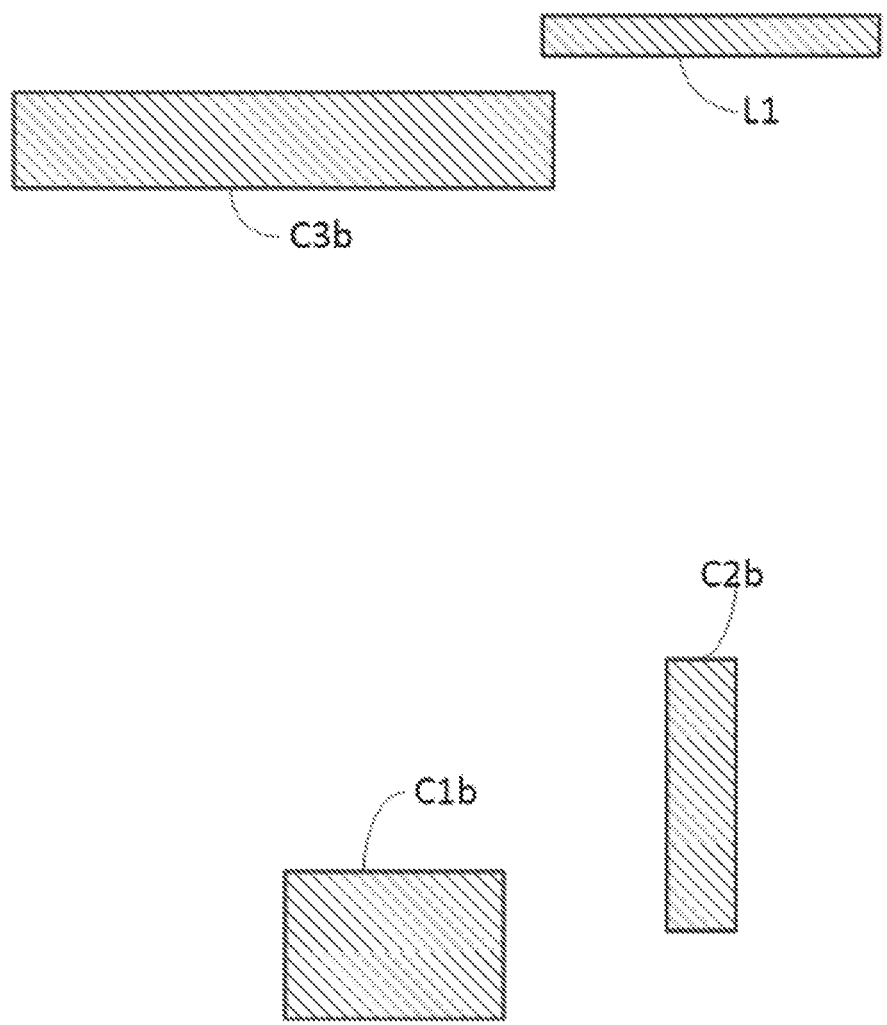
FIG. 6D is a layout diagram of the second gate metal layer in FIG. 6A.
Figure 6E:
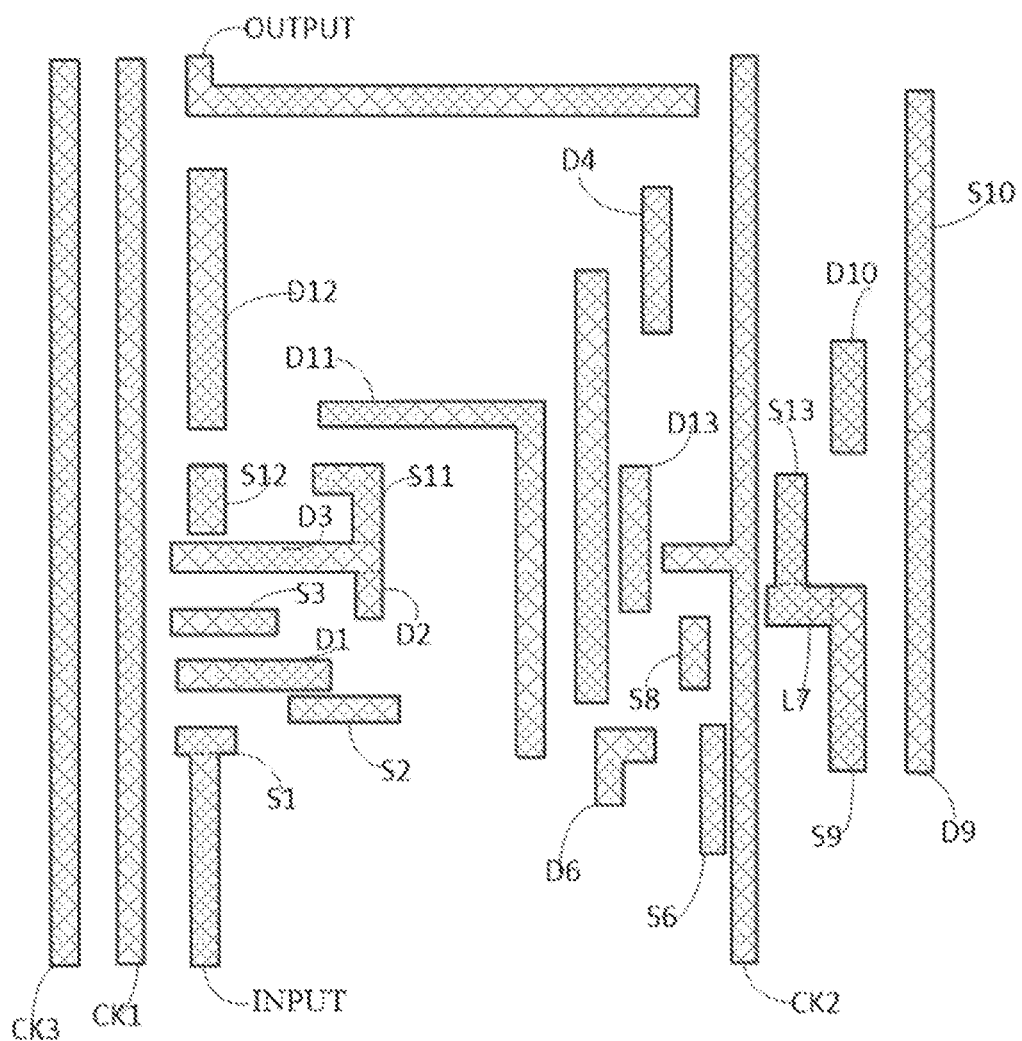
FIG. 6E is a layout diagram of the first source-drain metal layer in FIG. 6A.
Figure 6F:
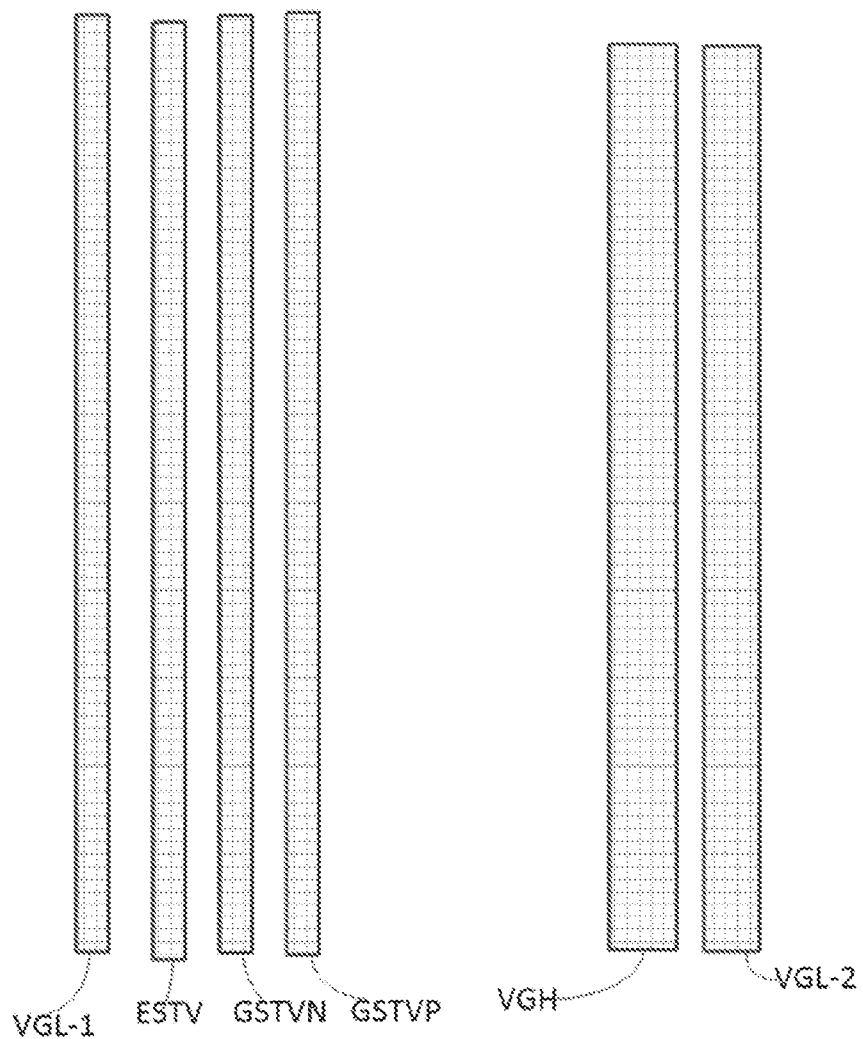
FIG. 6F is a layout diagram of the second source-drain metal layer in FIG. 6A.
Figure 6G:
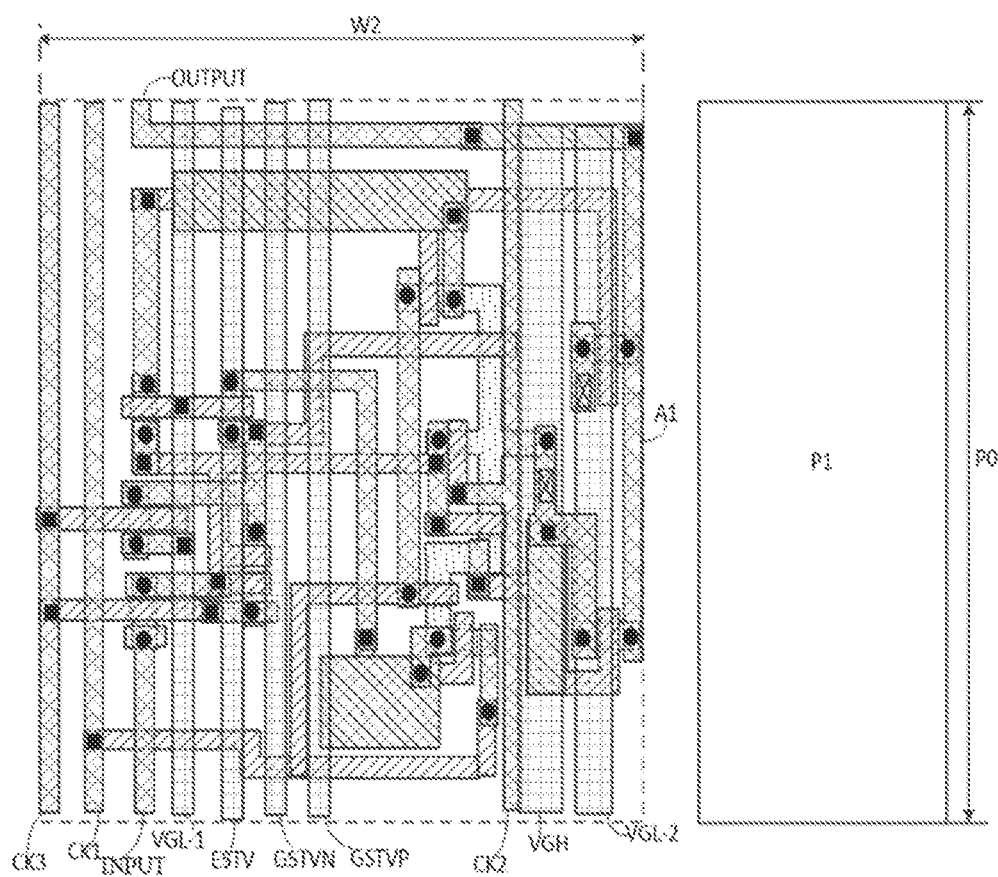
FIG. 6G is a schematic diagram of adding a pixel unit P1 on the basis of FIG. 6A.
Figure 7B:
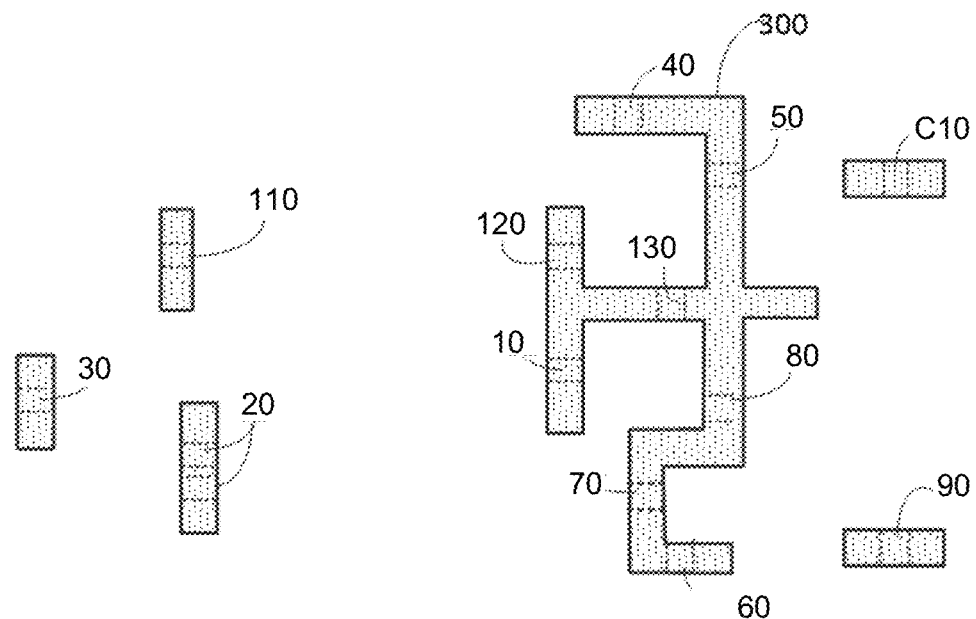
FIG. 7B is a layout diagram of the active layer in FIG. 7A.
Figure 7C:
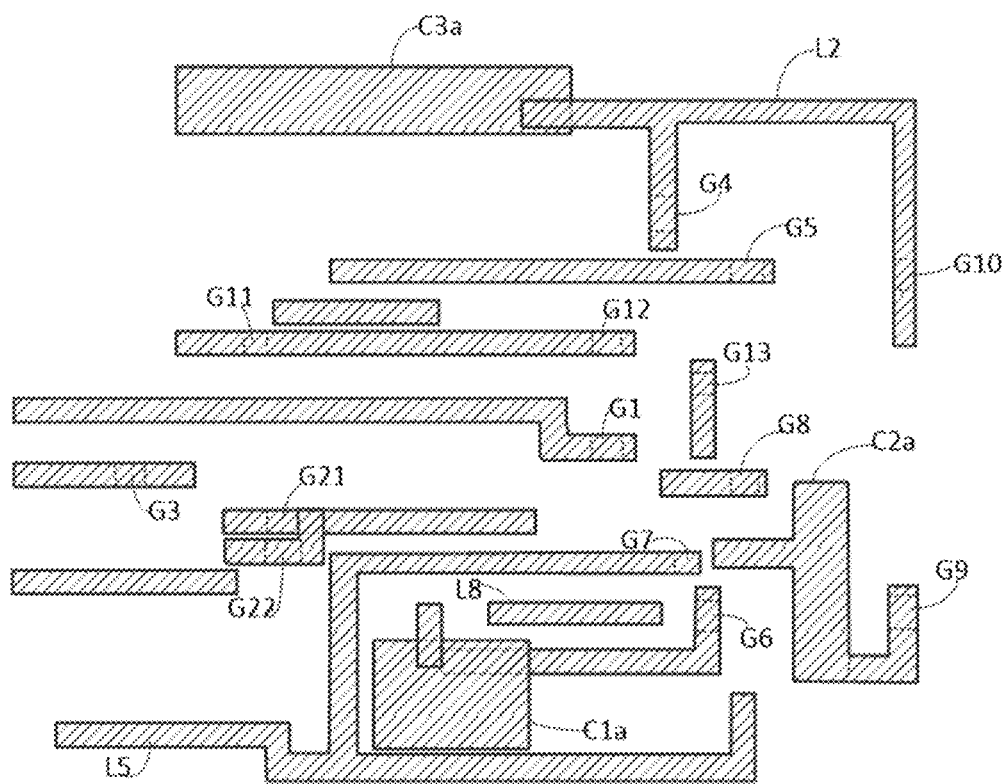
FIG. 7C is a layout diagram of the first gate metal layer in FIG. 7A.
Figure 7D:
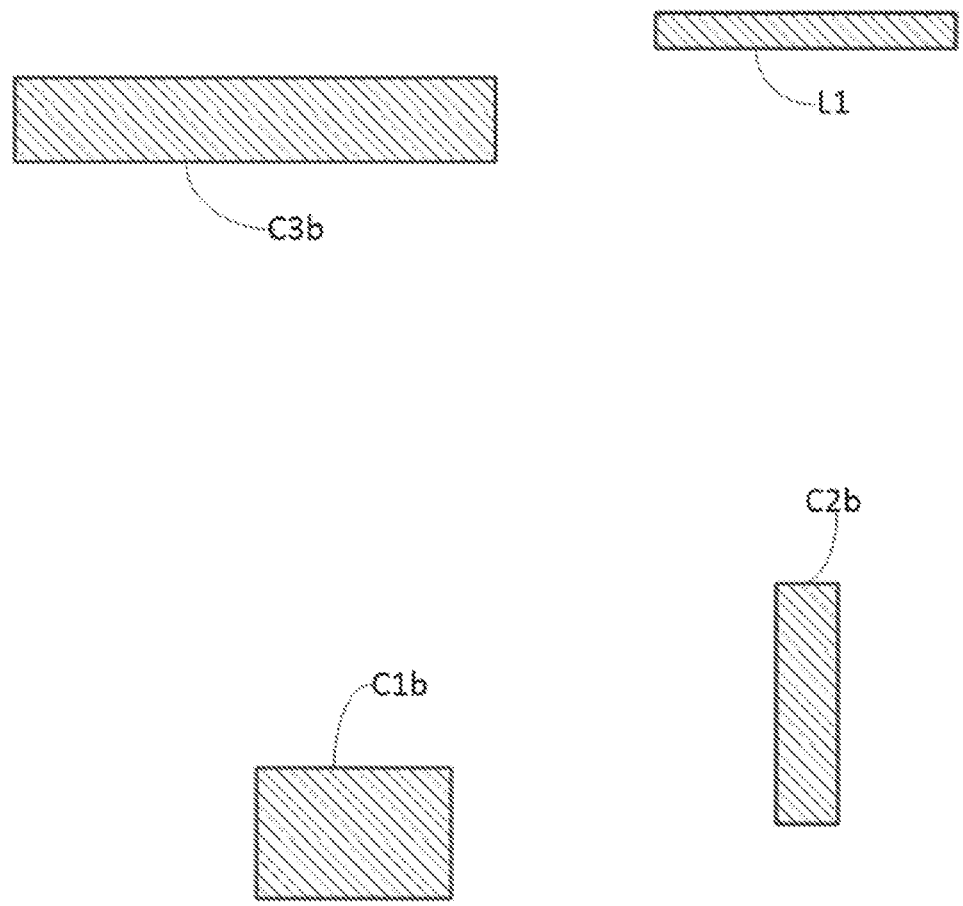
FIG. 7D is a layout diagram of the second gate metal layer in FIG. 7A.
Figure 7E:
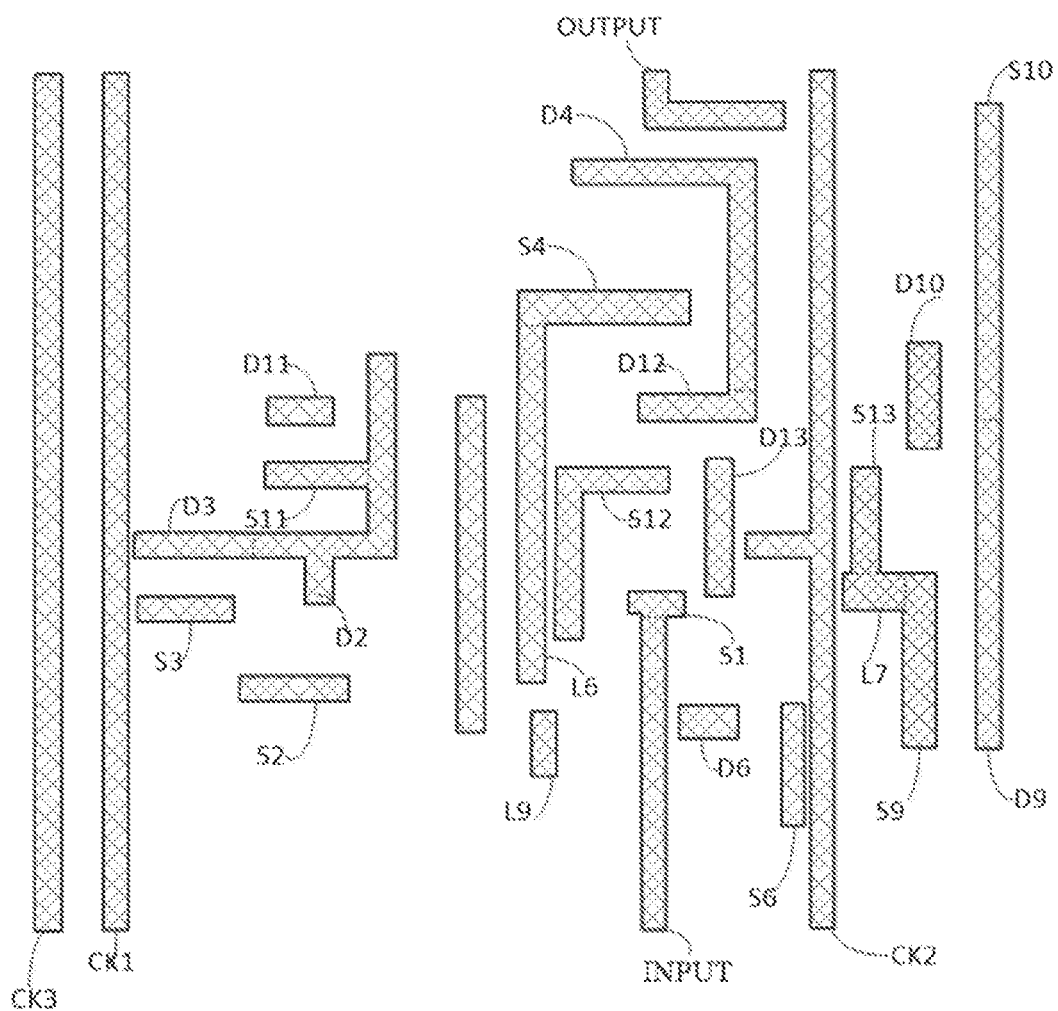
FIG. 7E is a layout diagram of the first source-drain metal layer in FIG. 7A.
Figure 7F:
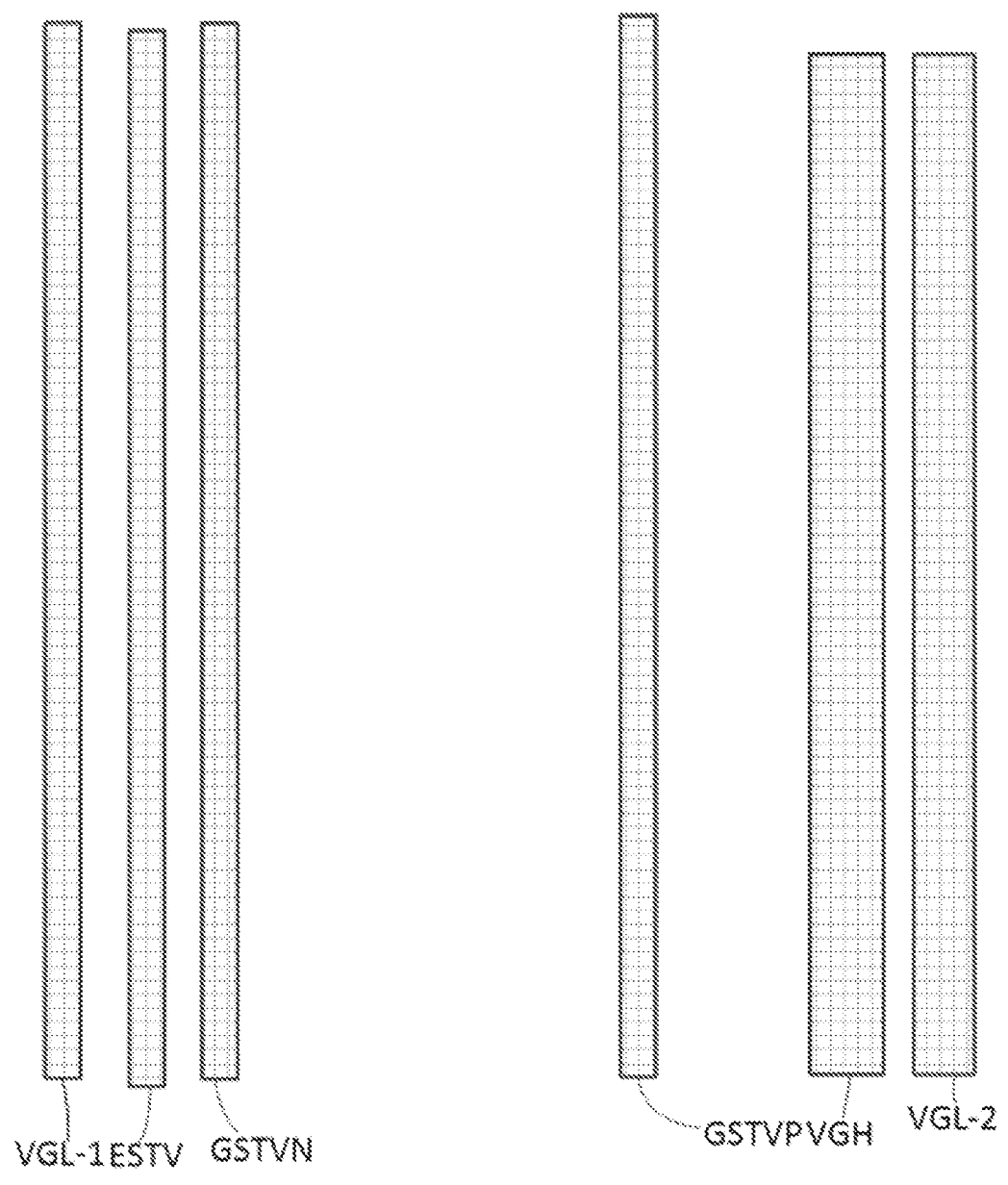
Figure 7G:
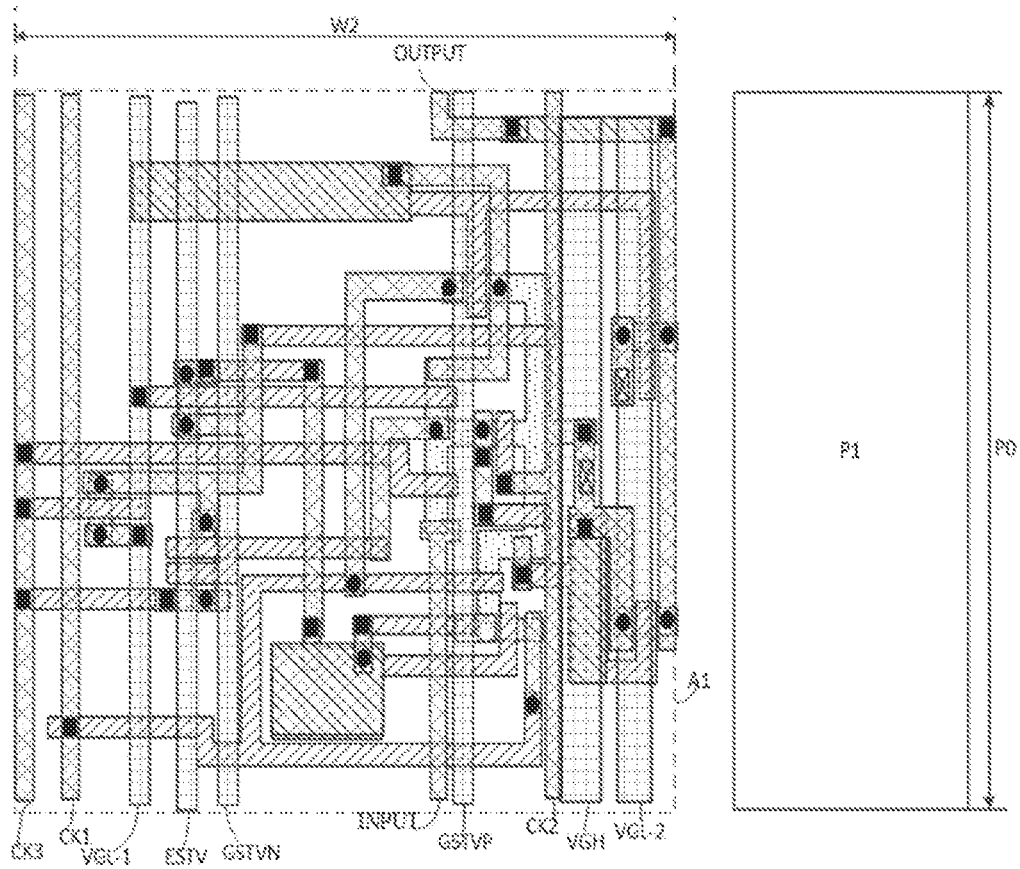
FIG. 7G is a schematic diagram of adding a pixel unit P1 on the basis of FIG. 7A.

FIG. 2G is a schematic diagram of adding the pixel unit P1 on the basis of FIG. 2A, FIG. 3G is a schematic diagram of adding the pixel unit P1 on the basis of FIG. 3A, FIG. 4G is a schematic diagram of adding the pixel unit P1 on the basis of FIG. 4A, FIG. 5G is a schematic diagram of adding the pixel unit P1 on the basis of FIG. 5A, FIG. 6G is a schematic diagram of adding the pixel unit P1 on the basis of FIG. 6A, and FIG. 7G is a schematic diagram of adding the pixel unit P1 on the basis of FIG. 7A.

As shown in FIG. 2G, FIG. 3G, FIG. 4G, FIG. 5G, FIG. 6G and FIG. 7G, the pixel pitch value P0 is the length of the pixel unit P1 along the first direction (the first direction may be, for example, a vertical direction).

As shown in FIG. 2A, FIG. 3A, FIG. 4A and FIG. 5A, the orthographic projection of the second start signal line GSTVP on the base substrate partially overlaps the orthographic projection of an electrode plate of the first capacitor C1 included in the shift register unit on the base substrate, and the orthographic projection of the electrode plate of the third capacitor C3 included in the shift register unit on the base substrate; the orthographic projection of the third start signal line ESTV on the base substrate partially overlaps the orthographic projection of the electrode plate of the third capacitor C3 on the base substrate.

As shown in FIG. 6A and FIG. 7A, the orthographic projection of the second start signal line GSTVP on the base substrate, the orthographic projection of the third start signal line ESTV on the base substrate, and the orthographic projection of the electrode plate of the third capacitor C3 on the base substrate partially overlap.

In at least one embodiment of the present disclosure, the display substrate includes a first conductive layer, an insulating layer, and a second conductive layer, and the insulating layer is arranged between the first conductive layer and the second conductive layer;

At least one signal line of the plurality of signal lines is arranged on the first conductive layer, and at least one signal line of the plurality of signal lines is arranged on the second conductive layer.

In specific implementation, at least one signal line is arranged on the first conductive layer, and at least one signal line is arranged on the second conductive layer, so as to reduce the lateral space occupied by the shift register unit and facilitate the realization of narrow frame.

In specific implementation, the display substrate may include an active layer, a gate insulating layer, a first gate metal layer, an interlayer dielectric layer, a second gate metal layer, a passivation layer, a first source-drain metal layer, a planarization layer and a second source-drain metal layer arranged on the base substrate successively.

As shown in FIG. 2A, FIG. 3A, FIG. 4A, FIG. 5A, FIG. 6A and FIG. 7A, the second source-drain metal layer is used to form the first voltage line VGH, a first second voltage line VGL-1, a second second voltage line VGL-2, the first start signal line GSTVN, the second start signal line GSTVP and the third start signal line ESTV;

the first source-drain metal layer is used to form the first clock signal line CK1, the second clock signal line CK2, the third clock signal line CK3 and the input terminal INPUT;

That is, the first conductive layer may be a first source-drain metal layer, and the second conductive layer may be a second source-drain metal layer, but not limited thereto.

Optionally, the first start signal line GSTVN is coupled to the input terminal of a first stage of first shift register unit in the first scan driving module, and is configured to provide an input signal for the first stage of first shift register unit; the second start signal line GSTVP is coupled to the input terminal of the first stage of second shift register unit in the second scan driving module, and is configured to provide an input signal for the first stage of second shift register unit in the second scan driving module; the third start signal line ESTV is coupled to the input terminal of the first stage of third shift register unit in the third scan driving module, and is configured to provide the input signal for the first stage of third shift register unit in the third scan driving module.

The first scan driving module may include a plurality of stages of the first shift register units, the second scan driving module may include a plurality of stages of the second shift register units, and the third scan driving module may include a plurality of stages of the third shift register units.

In at least one embodiment of the present disclosure, the shift register unit may include at least one transistor arranged in the driving circuit area, the first electrode of the transistor, the second electrode of the transistor and the plurality of signals lines are arranged on the same layer.

In specific implementation, the first electrode and the second electrode of the at least one transistor in the shift register unit can be located on the same layer as the plurality of signal lines, so that the first electrode and the second electrode of the at least one transistor and the plurality of signal lines can be formed using the same metal layer, which is facilitate to realize a narrow frame.

As shown in FIG. 2A, FIG. 3A, FIG. 4A, FIG. 5A, FIG. 6A and FIG. 7A, the first electrode of at least one transistor in the shift register unit, the second electrode of the at least one transistor, a first clock signal line CK1, a second clock signal line CK2 and a third clock signal line CK3 are made by using the first source-drain metal layer.

In at least one embodiment of the present disclosure, the shift register unit includes at least one transistor arranged in the driving circuit area, the first electrode of the transistor is arranged on the same layer as the second electrode of the transistor, and the plurality of signal lines and the first electrode of the transistor are arranged at different layers.

In a specific implementation, the first electrode of the at least one transistor included in the shift register unit and the second electrode of the at least one transistor may be arranged on the same layer, and the plurality of signal lines and the first electrode of the at least one transistor can be arranged on different layers.

As shown in FIG. 2A, FIG. 3A, FIG. 4A, FIG. 5A, FIG. 6A and FIG. 7A, the first electrode of at least one transistor in the shift register unit and the second electrode of the at least one transistor are made by using the first source-drain metal layer, the first voltage line VGH, the first second voltage line VGL-1, the second second voltage line VGL-2, the first start signal line GSTVN, the second start signal line GSTVP and the third start signal line ESTV are made by using the second source-drain metal layer.

In at least one embodiment of the present disclosure, the shift register unit includes at least one signal line arranged in the driving circuit area, and the at least one signal line is configured to provide a DC power supply signal;

The ratio W3/W2 of the width W3 of the at least one signal line in the second direction to the width W2 of the shift register unit in the second direction is greater than or equal to 0.15; for example, W3/W2 may be equal to 0.15, 0.16, 0.17, 0.18, 0.19, 0.2, 0.21, 0.22, 0.23, 0.24, 0.25, 0.26, 0.27, 0.28, 0.29 or 0.3, but not limited thereto.

In specific implementation, in order to reduce the IR voltage drop on the signal line used to provide the DC power signal (IR voltage drop refers to a phenomenon in which the voltage drops or rises on the power supply and ground networks in integrated circuits), the width of at least one signal line configured to provide a DC power supply signal in the second direction is set to be larger.

As shown in FIG. 2A, FIG. 3A, FIG. 4A, FIG. 5A, FIG. 6A and FIG. 7A, the signal lines for providing DC power supply signals may include: a first voltage line VGH, a first second voltage line VGL-1 and a second second voltage line VGL-2;

A ratio of at least one of the width of the first voltage line VGH in the horizontal direction, the width of the first second voltage line VGL-1 in the horizontal direction, and the width of the second second voltage line VGL-2 in the horizontal direction, to the width W2 of the shift register unit in the horizontal direction may be greater than or equal to 0.15; for example, the ratio may be equal to 0.15, 0.16, 0.17, 0.18, 0.19, 0.2, 0.21, 0.22, 0.23, 0.24, 0.25, 0.26, 0.27, 0.28, 0.29 or 0.3, but not limited thereto.

In at least one embodiment of the present disclosure, the shift register unit includes at least one signal line arranged in the driving circuit area, and the at least one signal line is configured to provide a DC power supply signal;

The ratio W3/W2 of the width W3 of the at least one signal line in the second direction to the width W2 of the shift register unit in the second direction is greater than or equal to 0.3; for example, W3/W2 may be equal to 0.3, 0.31, 0.32, 0.33, 0.34, 0.35, 0.36, 0.37, 0.38, 0.39, 0.4, 0.41, 0.42, 0.43, 0.44, 0.45, 0.46, 0.47, 0.48, 0.49 or 0.5, but not limited thereto.

As shown in FIG. 2A, FIG. 3A, FIG. 4A, FIG. 5A, FIG. 6A and FIG. 7A, the signal lines for providing DC power supply signals may include: a first voltage line VGH, a first second voltage line VGL-1 and a second second voltage line VGL-2;

A ratio of at least one of the width of the first voltage line VGH in the horizontal direction, the width of the first second voltage line VGL-1 in the horizontal direction, and the width of the second second voltage line VGL-2 in the horizontal direction to the width W2 of the shift register unit in the horizontal direction may be greater than or equal to 0.3; for example, the ratio may be equal to 0.3, 0.31, 0.32, 0.33, 0.34, 0.35, 0.36, 0.37, 0.38, 0.39, 0.4, 0.41, 0.42, 0.43, 0.44, 0.45, 0.46, 0.47, 0.48, 0.49 or 0.5, but not limited thereto.

In at least one embodiment of the present disclosure, the first voltage line VGH, the first second voltage line VGL-1 and the second second voltage line VGL-2 may be arranged on the second source-drain metal layer, the first electrode of each transistor and the second electrode of each transistor can be arranged on the first source-drain metal layer, there is enough space on the second source-drain metal layer to set the first voltage line VGH, the first second voltage line VGL-1 and the second second voltage line VGL-2, so that at least one signal line providing a DC power signal has a smaller IR drop.

In at least one embodiment of the present disclosure, the shift register unit includes at least one signal line arranged in the driving circuit area, and the at least one signal line is configured to provide a clock signal;

The ratio W4/W2 of the width W4 of the at least one signal line in the second direction to the width W2 of the shift register unit in the second direction is greater than or equal to 0.015; for example, W4/W2 may be equal to 0.015, 0.016, 0.017, 0.018, 0.019, 0.02, 0.021, 0.022, 0.023, 0.024, 0.025, 0.026, 0.027, 0.028, 0.029 or 0.03, but not limited thereto.

In specific implementation, in order to reduce the IR voltage drop on the signal line used to provide the clock signal (IR voltage drop refers to a phenomenon in which the voltage drops or rises on the power supply and ground networks in integrated circuits), the width of at least one signal line configured to provide a clock signal in the second direction is set to be larger.

As shown in FIG. 2A, FIG. 3A, FIG. 4A, FIG. 5A, FIG. 6A and FIG. 7A, at least one signal line for providing a clock signal may include: a first clock signal line CK1, a second clock signal line CK2 and the third clock signal line CK3;

The ratio of at least one of the width of the first clock signal line CK1 in the horizontal direction, the width of the second clock signal line CK2 in the horizontal direction, and the width of the third clock signal line CK3 in the horizontal direction, to the width W2 of the shift register unit in the horizontal direction is greater than or equal to 0.015; for example, the ratio may be 0.015, 0.016, 0.017, 0.018, 0.019, 0.02, 0.021, 0.022, 0.023, 0.024, 0.025, 0.026, 0.027, 0.028, 0.029 or 0.03, but not limited thereto.

In at least one embodiment of the present disclosure, the shift register unit includes at least one signal line arranged in the driving circuit area, and the at least one signal line is configured to provide a clock signal;

The ratio W4/W2 of the width W4 of the at least one signal line in the second direction to the width W2 of the shift register unit in the second direction is greater than or equal to 0.03; for example, W4/W2 may be equal to 0.03, 0.031, 0.032, 0.033, 0.034, 0.035, 0.036, 0.037, 0.038, 0.039, 0.04, 0.041, 0.042, 0.043, 0.044, 0.045, 0.046, 0.047, 0.048, 0.049, 0.05, 0.051, 0.052, 0.053, 0.054, 0.055, 0.056, 0.057, 0.058, 0.059 or 0.06, but not limited thereto.

As shown in FIG. 2A, FIG. 3A, FIG. 4A, FIG. 5A, FIG. 6A and FIG. 7A, at least one signal line for providing a clock signal may include: a first clock signal line CK1, a second clock signal line CK2 and the third clock signal line CK3;

The ratio of at least one of the width of the first clock signal line CK1 in the horizontal direction, the width of the second clock signal line CK2 in the horizontal direction, and the width of the third clock signal line CK3 in the horizontal direction, to the width W2 of the shift register unit in the horizontal direction is greater than or equal to 0.03; for example, the ratio may be 0.03, 0.031, 0.032, 0.033, 0.034, 0.035, 0.036, 0.037, 0.038, 0.039, 0.04, 0.041, 0.042, 0.043, 0.044, 0.045, 0.046, 0.047, 0.048, 0.049, 0.05, 0.051, 0.052, 0.053, 0.054, 0.055, 0.056, 0.057, 0.058, 0.059 or 0.06, but not limited thereto.

Optionally, the shift register unit includes at least two transistors arranged in the driving circuit area;

The active layers of the at least two transistors are formed by a continuous semiconductor layer, and the orthographic projection of one signal line in the plurality of signal lines on the base substrate at least partially overlaps the orthographic projection of the semiconductor layer on the base substrate.

As shown in FIG. 2A, the first voltage line VGH, the first second voltage line VGL-1, the second second voltage line VGL-2, the first start signal line GSTVN, the second start signal line GSTVP and the third start signal line ESTV are formed by using the second source-drain metal layer;

the first clock signal line CK1, the second clock signal line CK2 and the third clock signal line CK3 are formed by using the first source-drain metal layer;

As shown in FIG. 2A, FIG. 2B, FIG. 3A, FIG. 3B, FIG. 4A and FIG. 4B, the active layer of the fourth transistor T4, the active layer of the fifth transistor T5, the active layer of the thirteenth transistor T13 and the active layer of the eighth transistor T8 are formed by a continuous first semiconductor layer 100, and the orthographic projection of the first voltage line VGH on the base substrate partially overlap the orthographic projection of the first semiconductor layer 100 on the base substrate, and the orthographic projections of the second clock signal line CK2 on the base substrate partially overlaps the orthographic projections of the first semiconductor layer 100 on the base substrate, so as to reduce the width of the driving circuit area in the second direction.

In FIG. 2B, FIG. 3B and FIG. 4B, the one labeled 40 is the channel of T4, the one labeled 50 is the channel of T5, the one labeled 130 is the channel of T13, and the one labeled 80 is the channel of T8.

As shown in FIG. 5A, the orthographic projection of the second clock signal line CK2 on the base substrate partially overlaps the orthographic projection of the first voltage line VGH on the base substrate;

As shown in FIG. 5B, the active layer of the fourth transistor T4, the active layer of the fifth transistor T5, the active layer of the thirteenth transistor T13 and the active layer of the eighth transistor T8 are formed by a continuous first semiconductor layer 100. As shown in FIG. 5A, the orthographic projection of the first semiconductor layer 100 on the base substrate partially overlaps the orthographic projection of the second clock signal line CK2 on the base substrate, and the orthographic projection of the first semiconductor layer 100 on the base substrate partially overlaps the orthographic projection of the first voltage line VGH on the base substrate.

In FIG. 5B, the one labeled 40 is the channel of T4, the one labeled 50 is the channel of T5, the one labeled 130 is the channel of T13, and the one labeled 80 is the channel of T8.

As shown in FIG. 6A and FIG. 6B, the active layer of the fourth transistor T4, the active layer of the fifth transistor T5, the active layer of the thirteenth transistor T13, the active layer of the eighth transistor T8, the active layer of the seventh transistor T7 and the active layer of the sixth transistor T6 are formed by a continuous second semiconductor layer 200, as shown in FIG. 6A, the orthographic projection of the second semiconductor layer 200 on the base substrate partially overlaps the orthographic projection of the second clock signal line CK2 on the base substrate, and the orthographic projection of the second semiconductor layer 200 on the base substrate partially overlaps the orthographic projection of the first voltage line VGH on the base substrate.

In FIG. 6B, the one labeled 40 is the channel of T4, the one labeled 50 is the channel of T5, the one labeled 130 is the channel of T13, the one labeled 80 is the channel of T8, and the one labeled 70 is the channel of T7, the one labeled 60 is the channel of T6.

As shown in FIGS. 7A and 7B, the active layer of the first transistor T1, the active layer of the fourth transistor T4, the active layer of the fifth transistor T5, the active layer of the thirteenth transistor T13, the active layer of the twelfth transistor T12, the active layer of the eighth transistor T8, the active layer of the seventh transistor T7 and the active layer of the sixth transistor T6 are formed by a continuous third semiconductor layer 300; the orthographic projection of third semiconductor layer 300 on the base substrate partially overlaps the orthographic projection of the second clock signal line CK2 on the base substrate, and the orthographic projection of the third semiconductor layer 300 on the base substrate partially overlaps the orthographic projection of the first voltage line VGH on the base substrate. In FIG. 7B, the one labeled 10 is the channel of T1, the one labeled 40 is the channel of T4, the one labeled 50 is the channel of T5, the one labeled 130 is the channel of T13, and the one labeled 120 is the channel of T12, the one labeled 80 is the channel of T8, the one labeled 70 is the channel of T7, and the one labeled 60 is the channel of T6.

In at least one embodiment of the present disclosure, the shift register unit may include at least two transistors arranged in the driving circuit area;

The active layers of the at least two transistors are formed by a continuous semiconductor layer, and the at least two transistors are connected in series.

Optionally, the shift register unit includes at least two transistors arranged in the driving circuit area;

The active layers of the at least two transistors are formed by a continuous semiconductor layer, and the at least two transistors are connected in parallel with each other.

As shown in FIG. 2A, FIG. 3A, FIG. 4A, FIG. 5A, FIG. 6A and FIG. 7A, the active layer of the fourth transistor T4 and the active layer of the fifth transistor T5 are formed by a continuous semiconductor layer, the fourth transistor T4 and the fifth transistors T5 are connected in series.

As shown in FIG. 2A, FIG. 3A, FIG. 4A, FIG. 5A, FIG. 6A and FIG. 7A, the active layer of the fifth transistor T5, the active layer of the eighth transistor T8 and the active layer of the thirteenth transistor T13 are formed by a continuous semiconductor layer;

The first electrode of the fifth transistor T5 is coupled to the second electrode of the eighth transistor T8, and the eighth transistor T8 and the thirteenth transistor T13 are connected in series.

Optionally, the shift register unit includes at least two transistors arranged in the driving circuit area; active layers of the at least two transistors are formed by a continuous semiconductor layer;

Channel directions of the at least two transistors are the same.

In a specific implementation, the active layers of the at least two transistors included in the shift register unit may be formed by a continuous semiconductor layer, and the channel directions of the at least two transistors may be the same.

For example, as shown in FIG. 3B, the active layer of the second transistor T2 and the active layer of the third transistor T3 are formed by a continuous fourth semiconductor layer 400, and the direction of the channel 20 of the second transistor T2 and the direction of the channel 30 of the third transistor T3 is the vertical direction.

In at least one embodiment of the present disclosure, the shift register unit may include at least two transistors arranged in the driving circuit area; active layers of the at least two transistors are formed by a continuous semiconductor layer;

Channel directions of the at least two transistors are different.

In a specific implementation, the active layers of the at least two transistors included in the shift register unit may be formed by a continuous semiconductor layer, and the channel directions of the at least two transistors may be different.

For example, as shown in FIG. 6B, the active layer of the sixth transistor T6 and the active layer of the seventh transistor T7 are formed by a continuous semiconductor, and the direction of the channel 60 of the sixth transistor T6 and the direction of the channel 70 of the seventh transistor T7 are different.

Optionally, the shift register unit includes at least two transistors arranged in the driving circuit area; active layers of the at least two transistors are formed by a continuous semiconductor layer;

A channel of one of the transistors extends along the first direction, and a channel of the other transistor extends along the second direction.

In at least one embodiment of the present disclosure, the first direction may be a vertical direction, and the second direction may be a horizontal direction, but not limited thereto.

In a specific implementation, the active layers of the at least two transistors included in the shift register unit may be formed by a continuous semiconductor layer, and the channels of the two transistors extend along the first direction and the second direction respectively.

For example, the active layer of the sixth transistor T6 and the active layer of the seventh transistor T7 are formed by a continuous semiconductor, the direction of the channel 60 of the sixth transistor T6 may be a horizontal direction, and the direction of the channel 70 of the seventh transistor T7 may be a vertical direction.

In a specific implementation, the shift register unit may include at least two transistors arranged in the driving circuit area; the active layers of the at least two transistors are formed by a continuous semiconductor layer;

The shape of at least part of the semiconductor patterns included in the semiconductor layer is at least one pattern of I-type, L-type, T-type, F-type, E-type, N-type, π-type, and H-type.

In at least one embodiment of the present disclosure, the shift register unit may include a fourth transistor T4, a fifth transistor T5, an eighth transistor T8, and a thirteenth transistor T13; the second electrode of the fourth transistor T4 is connected to the second electrode of the fifth transistor T5, the second electrode of the eighth transistor T8, the first electrode of the fifth transistor T5 and the first electrode of the thirteenth transistor T13 are coupled to each other;

As shown in FIG. 2B, FIG. 3B and FIG. 4B, the active layer of the fourth transistor T4, the active layer of the fifth transistor T5, the active layer of the thirteenth transistor T13 and the active layer of the eighth transistor T8 are formed by the continuous first semiconductor layer 100;

The orthographic projection of the active layer of the fourth transistor T4 on the base substrate, the orthographic projection of the active layer of the fifth transistor T5 on the base substrate, the orthographic projection of the active layer of the eighth transistor T8 on the base substrate and the orthographic projection of a part of the active layer of the thirteenth transistor T13 on the base substrate form an E-type pattern together;

The orthographic projection of the active layer of the fourth transistor T4 on the base substrate and the orthographic projection of the active layer of the fifth transistor T5 on the base substrate form an L-type pattern together.

As shown in FIGS. 2A-2F, 3A-3F, and 4A-4F, the shift register unit includes a first voltage line VGH and a second clock signal line CK2;

The orthographic projection of the first voltage line VGH on the base substrate partially overlaps the orthographic projection of the first semiconductor layer 100 on the base substrate, and the orthographic projection of the second clock signal line CK2 on the base substrate partially overlaps the orthographic projection of the first semiconductor layer 100 on the base substrate.

As shown in FIG. 2B, FIG. 3B and FIG. 4B, the channel 40 of the fourth transistor T4 extends in the horizontal direction, the channel 50 of the fifth transistor T5 extends in the vertical direction, and the channel 130 of the thirteenth transistor T13 extends along the horizontal direction, and the channel 80 of the eighth transistor T8 extends along the vertical direction.

In at least one embodiment of the present disclosure, the shift register unit may include a second transistor T2 and a third transistor T3; the second electrode of the second transistor T2 is coupled to the second electrode of the third transistor T3;

As shown in FIG. 3B, the active layer of the second transistor T2 and the active layer of the third transistor T3 are formed by a fourth semiconductor layer 400, and the orthographic projection of the active layer of the second transistor T2 on the base substrate and the orthographic projection of the active layer of the third transistor T3 on the base substrate together form an I-type pattern.

As shown in FIG. 3B, the channel 20 of the second transistor T2 extends along the vertical direction, and the channel 30 of the third transistor T3 extends along the vertical direction.

In at least one embodiment of the present disclosure, the shift register unit includes a second transistor T2, a third transistor T3, and an eleventh transistor T11; the second electrode of the second transistor T2 is coupled to the second electrode of the third transistor T3; the first electrode of the eleventh transistor T11 is coupled to the second electrode of the third transistor T3;

As shown in FIG. 4B, the active layer of the second transistor T2, the active layer of the third transistor T3 and the active layer of the eleventh transistor T11 are formed by the fifth semiconductor layer 500, and the orthographic projection of the active layer of the second transistor T2 on the base substrate, the orthographic projection of the active layer of the third transistor T3 on the base substrate, and the orthographic projection of the active layer of the eleventh transistor T11 on the base substrate together form a T-type pattern.

As shown in FIGS. 4A-4F, the plurality of signal lines include a third start signal line ESTV; the orthographic projection of the fifth semiconductor layer 500 on the base substrate partially overlaps the orthographic projection of the third start signal line ESTV on the base substrate.

As shown in FIG. 4B, the channel 20 of the second transistor T2 and the channel 130 of the thirteenth transistor T13 both extend along the vertical direction, and the channel of the eleventh transistor T11 extends along the horizontal direction.

As shown in FIG. 5B, the active layer of the fourth transistor T4, the active layer of the fifth transistor T5, the active layer of the thirteenth transistor T13 and the active layer of the eighth transistor T8 are formed by a continuous first semiconductor layer 100 form;

The orthographic projections of the active layer of the fourth transistor T4, the active layer of the fifth transistor T5, and the active layer of the eighth transistor T8 on the base substrate and the orthographic projection of a part of the active layer of the thirteenth transistor T13 on the base substrate together forms an F-type pattern;

The orthographic projection of the active layer of the fourth transistor T4 on the base substrate and the orthographic projection of the active layer of the fifth transistor T5 on the base substrate together form an L-type pattern.

As shown in FIGS. 5A-5F, the shift register unit includes a first voltage line VGH and a second clock signal line CK2;

The orthographic projection of the first voltage line VGH on the base substrate partially overlaps the orthographic projection of the first semiconductor layer 100 on the base substrate, and the orthographic projection of the second clock signal line CK2 on the base substrate partially overlaps the orthographic projection of the first semiconductor layer 100 on the base substrate.

As shown in FIG. 5B, the channel 40 of the fourth transistor T4 extends along the horizontal direction, the channel 50 of the fifth transistor T5 extends along the vertical direction, and the channel 130 of the thirteenth transistor T13 extends along the horizontal direction, the channel 80 of the eighth transistor T8 extends along the vertical direction.

In at least one embodiment of the present disclosure, the shift register unit includes a sixth transistor T6, a seventh transistor T7, an eighth transistor T8, a fourth transistor T4, a fifth transistor T5, and a thirteenth transistor T13;

The second electrode of the sixth transistor T6 is coupled to the first electrode of the seventh transistor T7, and the second electrode of the eighth transistor T8 is coupled to the first electrode of the fifth transistor T5; the first electrode of the eighth transistor T8 is coupled to the second electrode of the seventh transistor T7; the second electrode of the fourth transistor T4 is coupled to the second electrode of the fifth transistor T5, and the second electrode of the eighth transistor T8, the first electrode of the fifth transistor T5 and the first electrode of the thirteenth transistor T13 are coupled to each other;

As shown in FIG. 6B, the active layer of the fourth transistor T4, the active layer of the fifth transistor T5, the active layer of the thirteenth transistor T13, the active layer of the eighth transistor T8, the active layer of the seventh transistor T7, the active layer of the sixth transistor T6 are formed by a continuous second semiconductor layer 200;

The orthographic projection of the active layer of the eighth transistor T8 on the base substrate, the orthographic projection of the active layer of the seventh transistor T7 on the base substrate, and the orthographic projections of the active layer of the sixth transistor T6 on the base substrates together form an n-type pattern.

As shown in FIGS. 6A-6F, the shift register unit includes a plurality of signal lines, and the plurality of signal lines include a first voltage line VGH;

The orthographic projection of the first voltage line VGH on the base substrate partially overlaps the orthographic projection of the second semiconductor layer 200 on the base substrate.

As shown in FIGS. 6A-6F, the shift register unit includes a plurality of signal lines, and the plurality of signal lines include a second clock signal line CK2;

The orthographic projection of the second clock signal line CK2 on the base substrate partially overlaps the orthographic projection of the second semiconductor layer 200 on the base substrate.

As shown in FIG. 6B, the channel 40 of the fourth transistor T4 extends along the horizontal direction, the channel 50 of the fifth transistor T5 extends along the vertical direction, and the channel 130 of the thirteenth transistor T13 extends along the horizontal direction, the channel 80 of the eighth transistor T8 extends along the vertical direction, the channel 70 of the seventh transistor T7 extends along the vertical direction, and the channel 60 of the sixth transistor T6 extends along the horizontal direction.

In at least one embodiment of the present disclosure, the shift register unit includes a first transistor T1, a fifth transistor T5, an eighth transistor T8, a twelfth transistor T12, a thirteenth transistor T13, a fourth transistor T4, a seventh transistor T7 and a sixth transistor T6;

The second electrode of the eighth transistor T8, the first electrode of the fifth transistor T5 and the first electrode of the thirteenth transistor T13 are coupled to each other; the first electrode of the twelfth transistor T12 is coupled to the second electrode of the first transistor T1, the second electrode of the twelfth transistor T12 is coupled to the second electrode of the thirteenth transistor T13; the second electrode of the fourth transistor is coupled to the second electrode of the fifth transistor; the first electrode of the sixth transistor is coupled to the first electrode of the seventh transistor; the first electrode of the fourth transistor is coupled to the first electrode of the sixth transistor;

As shown in FIG. 7B, the active layer of the first transistor T1, the active layer of the fourth transistor T4, the active layer of the fifth transistor T5, the active layer of the thirteenth transistor T13, the active layer of the twelfth transistor T12, the active layer of the eighth transistor T8, the active layer of the seventh transistor T7 and the active layer of the sixth transistor T6 are formed by a continuous third semiconductor layer 300; the orthographic projection of the active layer of the first transistor T1 on the base substrate, the orthographic projection of the active layer of the fifth transistor T5 on the base substrate, the orthographic projection of the active layer of the eighth transistor T8 on the base substrate, the orthographic projection of the active layer of the twelfth transistor T12 on the base substrate and the orthographic projection of the active layer of the thirteenth transistor T13 on the base substrate form an H-type pattern.

As shown in FIG. 7A-FIG. 7F, the shift register unit includes a plurality of signal lines, and the plurality of signal lines include a first voltage line VGH;

The orthographic projection of the first voltage line VGH on the base substrate partially overlaps the orthographic projection of the third semiconductor layer 300 on the base substrate.

As shown in FIGS. 7A-7F, the plurality of signal lines include a second start signal line GSTVP, and the shift register unit further includes a second clock signal line CK2;

The orthographic projection of the second start signal lines GSTVP on the base substrate partially overlaps the orthographic projection of the third semiconductor layer 300 on the base substrate, and the orthographic projection of the second clock signal line CK2 on the base substrate partially overlaps the orthographic projection of the third semiconductor layer 300 on the base substrate.

As shown in FIG. 7B, the channel 40 of the fourth transistor T4 extends along the horizontal direction, the channel 50 of the fifth transistor T5 extends along the vertical direction, and the channel 130 of the thirteenth transistor T13 extends along the horizontal direction, the channel 120 of the twelfth transistor T12 and the channel 10 of the first transistor T1 extend along the vertical direction, the channel of the eighth transistor T8 and the channel of the seventh transistor T7 extend along the vertical direction, the channel 60 of the sixth transistor T6 extends along the horizontal direction.

Figure 8A:
FIG. 8A is a schematic diagram of I-type pattern formed by an orthographic projection of the active layers of at least two transistors included in the shift register unit on the base substrate.
Figure 8B:
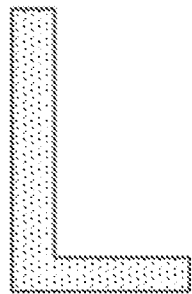
FIG. 8B is a schematic diagram of an L-type pattern formed by an orthographic projection of the active layers of at least two transistors included in the shift register unit on the base substrate.
Figure 8C:
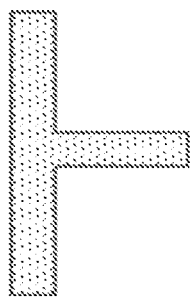
FIG. 8C is a schematic diagram of a T-type pattern formed by an orthographic projection of the active layers of at least two transistors included in the shift register unit on the base substrate.
Figure 8D:
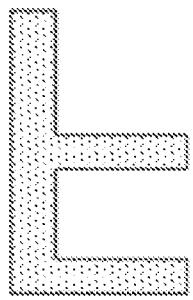
FIG. 8D is a schematic diagram of an F-type pattern formed by an orthographic projection of the active layers of at least two transistors included in the shift register unit on the base substrate.
Figure 8E:
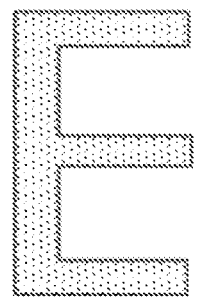
FIG. 8E is a schematic diagram of an E-type pattern formed by an orthographic projection of the active layers of at least two transistors included in the shift register unit on the base substrate.
Figure 8F:
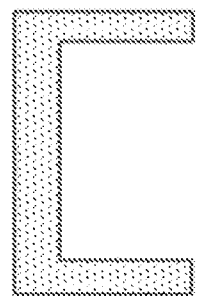
FIG. 8F is a schematic diagram of an n-type pattern formed by an orthographic projection of the active layers of at least two transistors included in the shift register unit on the base substrate.
Figure 8G:
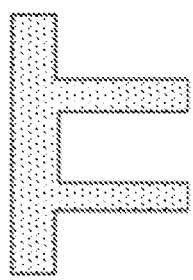
FIG. 8G is a schematic diagram of a π-type pattern formed by an orthographic projection of the active layers of at least two transistors included in the shift register unit on the base substrate.
Figure 8H:
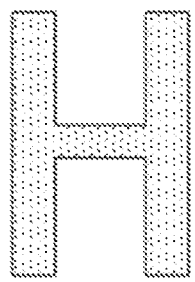
FIG. 8H is a schematic diagram of an H-type pattern formed by an orthographic projection of the active layers of at least two transistors included in the shift register unit on the base substrate.

As shown in FIG. 8A, the orthographic projection of the active layers of the at least two transistors included in the shift register unit on the base substrate forms an I-type pattern;

As shown in FIG. 8B, the orthographic projection of the active layers of the at least two transistors included in the shift register unit on the base substrate forms an L-type pattern;

As shown in FIG. 8C, the orthographic projection of the active layers of the at least two transistors included in the shift register unit on the base substrate forms a T-type pattern;

As shown in FIG. 8D, the orthographic projection of the active layers of the at least two transistors included in the shift register unit on the base substrate forms an F-type pattern;

As shown in FIG. 8E, the orthographic projection of the active layers of the at least two transistors included in the shift register unit on the base substrate forms an E-type pattern;

As shown in FIG. 8F, the orthographic projection of the active layers of the at least two transistors included in the shift register unit on the base substrate forms an n-type pattern;

As shown in FIG. 8G, the orthographic projection of the active layers of the at least two transistors included in the shift register unit on the base substrate forms a π-type pattern;

As shown in FIG. 8H, the orthographic projection of the active layers of the at least two transistors included in the shift register unit on the base substrate forms an H-type pattern.

FIG. 2B is a layout diagram of the active layer in FIG. 2A, FIG. 2C is a layout diagram of the first gate metal layer in FIG. 2A, FIG. 2D is a layout diagram of the second gate metal layer in FIG. 2A, FIG. 2E is a layout diagram of the first source-drain metal layer in FIG. 2A, and FIG. 2F is a layout diagram of the second source-drain metal layer in FIG. 2A.

FIG. 3B is a layout diagram of the active layer in FIG. 3A, FIG. 3C is a layout diagram of the first gate metal layer in FIG. 3A, FIG. 3D is a layout diagram of the second gate metal layer in FIG. 3A, FIG. 3E is a layout diagram of the first source-drain metal layer in FIG. 3A, and FIG. 3F is a layout diagram of the second source-drain metal layer in FIG. 3A.

FIG. 4B is a layout diagram of the active layer in FIG. 4A, FIG. 4C is a layout diagram of the first gate metal layer in FIG. 4A, FIG. 4D is a layout diagram of the second gate metal layer in FIG. 4A, FIG. 4E is a layout diagram of the first source-drain metal layer in FIG. 4A, and FIG. 4F is a layout diagram of the second source-drain metal layer in FIG. 4A.

As shown in FIG. 2B, FIG. 3B and FIG. 4B, the one labeled 10 is the channel of T1, the one labeled 20 is the channel of T2, the one labeled 30 is the channel of T3, and the one labeled 40 is the channel of T4, the one labeled 50 is the channel of T5, the one labeled 60 is the channel of T6, the one labeled 70 is the channel of T7, the one labeled 80 is the channel of T8, and the one labeled 90 is the channel of T9, the one labeled C10 is the channel T10, the one labeled 110 is the channel T11, the one labeled 120 is the channel T12, and the one labeled 130 is the channel T13.

As shown in FIG. 2C, FIG. 3C and FIG. 4C, the one labeled C1a is the first electrode plate of the first capacitor C1, the one labeled C2a is the first electrode plate of the second capacitor C2, and the one labeled C3a is the first electrode plate of the third capacitor C3;

The one labeled G1 is the gate electrode of T1, the one labeled G2-1 is the first gate electrode of T2, the one labeled G2-2 is the second gate electrode of T2, and the one labeled G3 is the gate electrode of T3, the one labeled G4 is the gate electrode of T4, the one labeled G5 is the gate electrode of T5, the one labeled G6 is the gate electrode of T6, the one labeled G7 is the gate electrode of T7, and the one labeled G8 is the gate electrode of T8, the one labeled G9 is the gate electrode of T9, the one labeled G10 is the gate electrode of T10, the one labeled G11 is the gate electrode of T11, the one labeled G12 is the gate electrode of T12, and the one labeled G13 is the gate electrode of T13.

As shown in FIG. 2D, FIG. 3D and FIG. 4D, the one labeled C1b is the second electrode plate of the first capacitor C1, the one labeled C2b is the second electrode plate of the second capacitor C2, and the one labeled C3b is the second electrode plate of the third capacitor C3;

The one labeled L1 is the first conductive connection portion.

As shown in FIG. 2E, FIG. 3E and FIG. 4E, the one labeled INPUT is the input terminal, and the one labeled OUTPUT is the driving signal output terminal;

The one labeled S1 is the first electrode of T1, the one labeled D1 is the second electrode of T1; the one labeled S2 is the first electrode of T2, and the one labeled D2 is the second electrode of T2;

The one labeled S3 is the first electrode of T3;

The one labeled S4 is the first electrode of T4, and the one labeled D4 is the second electrode of T4;

The one labeled S6 is the first electrode of T6, the one labeled D6 is the second electrode of T6; the one labeled S7 is the first electrode of T7, the one labeled D7 is the second electrode of T7; the one labeled S8 is the first electrode of T8, the one labeled S9 is the first electrode of T9, the one labeled D9 is the second electrode of T9; the one labeled S10 is the first electrode of T10, and the one labeled D10 is the second electrode of T10; the one labeled D11 is the second electrode of T11; the one labeled S12 is the first electrode of T12, the one labeled D12 is the second electrode of T12; the one labeled S13 is the first electrode of T13, and the one labeled D13 is the second electrode of T13; the first electrode S13 of T13 is multiplexed as the first electrode of T5 and the second electrode of T8; the second electrode D4 of T4 is multiplexed as the second electrode D5 of T5;

The one labeled CK1 is the first clock signal line, the one labeled CK2 is the second clock signal line, and the one labeled CK3 is the third clock signal line;

In FIG. 2E, the one labeled S11 is the first electrode of T11, and in FIG. 3E and FIG. 4E, the second electrode D3 of T3 is multiplexed as the first electrode of T11;

In FIG. 2E and FIG. 3E, the one labeled D3 is the second electrode of T3; in FIG. 4E, the second electrode D2 of T2 is multiplexed as the second electrode of T3.

In FIG. 2F, FIG. 3F and FIG. 4F, the one labeled VGL-1 is the first second voltage line, the one labeled ESTV is the third start signal line, and the one labeled GSTVN is the first start signal line, and the one labeled GSTVP is the second start signal line, the one labeled VGH is the first voltage line, and the one labeled VGL-2 is the second second voltage line.

In FIG. 2A, FIG. 2G, FIG. 3A, FIG. 3G and FIG. 4A, FIG. 4G, there are shown via holes penetrating through the interlayer dielectric layer for connecting the active layer and the first source-drain metal layer, and, via holes penetrating through the passivation layer for connecting the gate metal layer and the first source-drain metal layer, and via holes penetrating through the planarization for connecting the first source-drain metal layer and the second source-drain metal layer;

Wherein, the via holes penetrating through the interlayer dielectric layer are marked with black circles, the via holes penetrating through the passivation layer are marked with black squares, and the via holes penetrating through the planarization layer are marked with a multiplication sign in a rectangular box.

As shown in FIG. 2A-FIG. 2G, FIG. 3A-FIG. 3G, FIG. 4A-FIG. 4G, the third clock signal line CK3, the first clock signal line CK1, the first second voltage line VGL-1, the third start signal line ESTV, the first start signal line GSTVN, the second start signal line GSTVP, the second clock signal line CK2, the first voltage line VGH and the second second voltage line VGL-2 are sequentially arranged along the direction close to the display area;

The third clock signal line CK3, the first clock signal line CK1, the first second voltage line VGL-1, the third start signal line ESTV, the first start signal line GSTVN, the second start signal line GSTVP, the second clock signal line CK2, the first voltage line VGH and the second second voltage line VGL-2 all extend along the vertical direction;

The sum of the width of the third clock signal line CK3 in the horizontal direction, the width of the first clock signal line CK1 in the horizontal direction, the width of the first second voltage line VGL-1 in the horizontal direction, the width of the third start signal line ESTV in the horizontal direction, the width of the first start signal line GSTVN in the horizontal direction, the width of the second start signal line GSTVP in the horizontal direction, the width of the second clock signal line CK2 along the horizontal direction, the width of the first voltage line VGH in the horizontal direction and the width of the second second voltage line VGL-2 in the horizontal direction is W1;

The product of W1/W2 and the pixel pitch value P0 is greater than 18 um and less than 40 um;

The ratio of at least one the width of the first second voltage line VGL-1 in the horizontal direction, the width of the first voltage line VGH in the horizontal direction, and the width of the second second voltage line VGL-2 in the horizontal direction, to W2 is greater than or equal to 0.15; for example, the ratio may be 0.15, 0.16, 0.17, 0.18, 0.19, 0.2, 0.21, 0.22, 0.23, 0.24, 0.25, 0.26, 0.27, 0.28, 0.29 or 0.3, but not limited to;

The ratio of at least one of the width of the third clock signal line CK3 in the horizontal direction, the width of the first clock signal line CK1 in the horizontal direction, and the width of the second clock signal line CK2 in the horizontal direction, to W2 is greater than or equal to 0.015; for example, the ratio may be equal to 0.015, 0.016, 0.017, 0.018, 0.019, 0.02, 0.021, 0.022, 0.023, 0.024, 0.025, 0.026, 0.027, 0.028, 0.029 or 0.03, but not limited thereto.

In the embodiments shown in FIG. 2A-FIG. 2G, FIG. 3A-FIG. 3G, FIG. 4A-FIG. 4G, the ratio of at least one of the width of the first second voltage line VGL-1 in the horizontal direction, the width of the first voltage line VGH in the horizontal direction, the width in the horizontal direction of the second second voltage line VGL-2 in the horizontal direction, to W2 may also be greater than or equal to 0.3; for example, the ratio may be equal to 0.3, 0.31, 0.32, 0.33, 0.34, 0.35, 0.36, 0.37, 0.38, 0.39, 0.4, 0.41, 0.42, 0.43, 0.44, 0.45, 0.46, 0.47, 0.48, 0.49 or 0.5, but not limited thereto;

The ratio of at least one of the width of the third clock signal line CK3 in the horizontal direction, the width of the first clock signal line CK1 in the horizontal direction, and the width of the second clock signal line CK2 in the horizontal direction to W2 can also be greater than 0.03; for example, the ratio can be equal to 0.03, 0.031, 0.032, 0.033, 0.034, 0.035, 0.036, 0.037, 0.038, 0.039, 0.04, 0.041, 0.042, 0.043, 0.044, 0.045, 0.046, 0.047, 0.048, 0.049, 0.05, 0.051, 0.052, 0.053, 0.054, 0.055, 0.056, 0.057, 0.058, 0.059 or 0.06; but not limited thereto.

As shown in FIG. 2A-FIG. 2G, FIG. 3A-FIG. 3G, FIG. 4A-FIG. 4G, T1, T12, T11, T2 and T3 are arranged between CK1 and GSTVP, and T12, T3 and T1 are arranged in order from top to bottom, T11 and T2 are arranged sequentially from top to bottom;

The orthographic projection of the first electrode plate C2a of C2 on the base substrate partially overlaps the orthographic projection of the first voltage line VGH on the base substrate, and the orthographic projection of the second electrode plate C2b of C2 on the base substrate partially overlaps the orthographic projection of the first voltage line VGH on the base substrate;

T4, T5, T13, T8, T7 and T6 are arranged between GSTVN and VGL-2.

As shown in FIG. 2E, FIG. 3E and FIG. 4E, the second electrode D9 of T9 is connected to the first electrode S10 of T10, and the first electrode S10 of T10 is coupled to the first conductive connection portion L1 through a via hole. The first conductive connection portion L1 is coupled to the driving signal output terminal OUTPUT through a via hole, so that both the second electrode D9 of T9 and the first electrode S10 of T10 are coupled to the driving signal output terminal OUTPUT.

In FIG. 2C, FIG. 3C, and FIG. 4C, the one labeled L2 is the second conductive connection portion, and the second conductive connection portion L2 is connected to the gate electrode G10 of T10; the second conductive connection portion L2 is coupled to the second electrode D12 of T12 through a via hole, so that the gate electrode G10 of T10 is coupled to the second electrode D12 of T12;

As shown in FIG. 2A-FIG. 2G, FIG. 3A-FIG. 3G, FIG. 4A-FIG. 4G, the one labeled L3 is the third conductive connection portion;

The third conductive connection portion L3 is coupled to the first electrode S12 of T12 through the via hole, and the third conductive connection portion L3 is coupled to the second electrode D13 of T13 through the via hole, so that the first electrode S12 of T12 is coupled to the second electrode D13 of T13;

The one labeled L4 is the fourth conductive connection portion;

The fourth conductive connection portion L4 is coupled to the third conductive connection portion L3, and the fourth conductive connection portion L4 is coupled to the second electrode D1 of T1 through a via hole, so that the first electrode S12 of T12 is coupled to the second electrode D1 of T1;

The one labeled L5 is the fifth conductive connection portion, and the one labeled L6 is the sixth conductive connection portion;

The fifth conductive connection portion L5 is coupled to the first clock signal line CK1 through the via hole, the fifth conductive connection portion L5 is coupled to the first electrode S6 of T6 through the via hole, and the first electrode S6 of T6 is connected to the first electrode S6 of T4, so that the first electrode S6 of T6 is coupled to the first clock signal line CK1, and the first electrode S4 of T4 is coupled to the first clock signal line CK1.

As shown in FIG. 2A-FIG. 2G, FIG. 3A-FIG. 3G, and FIG. 4A-FIG. 4G, the first electrode S13 of T13 is coupled to the sixth conductive connection portion L6.

As shown in FIG. 2A-FIG. 2G, FIG. 3A-FIG. 3G, FIG. 4A-FIG. 4G, the second electrode D10 of T10 is coupled to the second second voltage line VGL-2 through a via hole;

The first electrode S13 of T13 is coupled to the first voltage line VGH through a via hole;

The first electrode S9 of T9 is coupled to the sixth conductive connection portion L6, and the sixth conductive connection portion L6 is coupled to the second electrode plate C2b of C2 through a via hole.

FIG. 5B is a layout diagram of the active layer in FIG. 5A, FIG. 5C is a layout diagram of the first gate metal layer in FIG. 5A, FIG. 5D is a layout diagram of the second gate metal layer in FIG. 5A, FIG. 5E is a layout diagram of the first source-drain metal layer in FIG. 5A, and FIG. 5F is a layout diagram of the second source-drain metal layer in FIG. 5A.

As shown in FIG. 5B, the one labeled 10 is the channel of T1, the one labeled 20 is the channel of T2, the one labeled 30 is the channel of T3, the one labeled 40 is the channel of T4, and the one labeled 50 is the channel of T5, the one labeled 60 is the channel of T6, the one labeled 70 is the channel of T7, the one labeled 80 is the channel of T8, the one labeled 90 is the channel of T9, and the one labeled C10 is the channel of T10, the one labeled 110 is the channel of T11, the one labeled 120 is the channel of T12, the one labeled 130 is the channel of T13.

As shown in FIG. 5C, the one labeled C1a is the first electrode plate of the first capacitor C1, the one labeled C2a is the first electrode plate of the second capacitor C2, and the one labeled C3a is the first electrode plate of the third capacitor C3;

The one labeled G1 is the gate electrode of T1, the one labeled G2-1 is the first gate electrode of T2, the one labeled G2-2 is the second gate electrode of T2, and the one labeled G3 is the gate electrode of T3, the one labeled G4 is the gate electrode of T4, the one labeled G5 is the gate electrode of T5, the one labeled G6 is the gate electrode of T6, the one labeled G7 is the gate electrode of T7, and the one labeled G8 is the gate electrode of T8, the one labeled G9 is the gate electrode of T9, the one labeled G10 is the gate electrode of T10, the one labeled G11 is the gate electrode of T11, the one labeled G12 is the gate electrode of T12, and the one labeled G13 is the gate electrode of T13.

As shown in FIG. 5D, the one labeled C1b is the second electrode plate of the first capacitor C1, the one labeled C2b is the second electrode plate of the second capacitor C2, and the one labeled C3b is the second electrode plate of the third capacitor C3;

The one labeled L1 is the first conductive connection portion.

As shown in FIG. 5E, the one labeled INPUT is the input terminal, and the one labeled OUTPUT is the driving signal output terminal;

The one labeled S1 is the first electrode of T1, and the one labeled D1 is the second electrode of T1;

The one labeled S2 is the first electrode of T2, and the one labeled D2 is the second electrode of T2;

The one labeled S3 is the first electrode of T3, and the one labeled D3 is the second electrode of T3;

The one labeled S4 is the first electrode of T4, and the one labeled D4 is the second electrode of T4;

The one labeled S6 is the first electrode of T6, and the one labeled D6 is the second electrode of T6;

The one labeled S7 is the first electrode of T7, the one labeled D7 is the second electrode of T7; the one labeled S8 is the first electrode of T8;

The one labeled S9 is the first electrode of T9, and the one labeled D9 is the second electrode of T9;

The one labeled S10 is the first electrode of T10, and the one labeled D10 is the second electrode of T10;

The one labeled S11 is the first electrode of T11, and the one labeled D11 is the second electrode of T11;

The one labeled S12 is the first electrode of T12, and the one labeled D12 is the second electrode of T12;

The one labeled S13 is the first electrode of T13, and the one labeled D13 is the second electrode of T13;

The first electrode S13 of T13 is multiplexed as the first electrode of T5 and the second electrode of T8; the second electrode D4 of T4 is multiplexed as the second electrode D5 of T5;

The one labeled CK1 is the first clock signal line, the one labeled CK2 is the second clock signal line, and the one labeled CK3 is the third clock signal line.

In FIG. 5F, the one labeled VGL-1 is the first second voltage line, the one labeled ESTV is the third start signal line, the one labeled GSTVN is the first start signal line, and the one labeled GSTVP is the second start signal line, the one labeled VGH is the first voltage line, and the one labeled VGL-2 is the second second voltage line.

In FIGS. 5A and 5G, there are shown via holes penetrating through the interlayer dielectric layer for connecting the active layer and the first source-drain metal layer, and via holes penetrating the passivation layer for connecting the gate metal layer and the first source-drain metal layer;

Wherein, the via holes penetrating through the interlayer dielectric layer are marked with black circles, and the via holes penetrating through the passivation layer are marked with black square boxes.

As shown in FIGS. 5A-5G, the orthographic projection of the second clock signal line CK2 on the base substrate partially overlaps the orthographic projection of the first voltage line VGH on the base substrate;

As shown in FIG. 5A-FIG. 5G, the third clock signal line CK3, the first clock signal line CK1, the first second voltage line VGL-1, the third start signal line ESTV, the first start signal line GSTVN, the second start signal lines GSTVP, the first voltage line VGH and the second second voltage line VGL-2 are arranged along a direction close to the display area;

The third clock signal line CK3, the first clock signal line CK1, the first second voltage line VGL-1, the third start signal line ESTV, the first start signal line GSTVN, the second start signal line GSTVP, the first voltage line VGH, the second clock signal line CK2 and the second second voltage line VGL-2 extend along the vertical direction.

As shown in FIG. 5A-FIG. 5G, a sum of the width of the first voltage line VGH in the horizontal direction, the width of the second clock signal line CK2 in the horizontal direction, the width of the third clock signal line CK3 in the horizontal direction, the width of the first clock signal line CK1 in the horizontal direction, the width of the first second voltage line VGL-1 in the horizontal direction, the width of the third start signal line ESTV in the horizontal direction, the width of the first start signal line GSTVN in the horizontal direction, the width of the second start signal line GSTVP in the horizontal direction and the width of the second clock signal line CK2 in the horizontal direction is W1;

The product of W1/W2 and the pixel pitch value P0 is greater than 18 um and less than 40 um;

The sum of the width of the first second voltage line VGL-1 in the horizontal direction, the width of the first voltage line VGH in the horizontal direction, and the width of the second second voltage line VGL-2 in the horizontal direction is W3;

W3/W2 is greater than or equal to 0.15; or, W3/W2 is greater than or equal to 0.3; for example, W3/W2 can be equal to 0.015, 0.16, 0.17, 0.18, 0.19, 0.2, 0.21, 0.22, 0.23, 0.24, 0.25, 0.26, 0.27, 0.28, 0.29, 0.3, 0.31, 0.32, 0.33, 0.34, 0.35, 0.36, 0.37, 0.38, 0.39, 0.4, 0.41, 0.42, 0.43, 0.44, 0.45, 0.46, 0.47, 0.48, 0.49 or 0.5, but not limited thereto;

The sum of the width of the third clock signal line CK3 in the horizontal direction, the width of the first clock signal line CK1 in the horizontal direction and the width of the second clock signal line CK2 in the horizontal direction is W4;

W4/W2 is greater than or equal to 0.015; or, W4/W2 is greater than or equal to 0.03; for example, W4/W2 can be equal to 0.015, 0.016, 0.017, 0.018, 0.019, 0.02, 0.021, 0.022, 0.023, 0.024, 0.025, 0.026, 0.027, 0.028, 0.029, 0.03, 0.031, 0.032, 0.033, 0.034, 0.035, 0.036, 0.037, 0.038, 0.039, 0.04, 0.041, 0.042, 0.043, 0.044, 0.045, 0.046, 0.047, 0.048, 0.049 or 0.05, but not limited thereto.

As shown in FIG. 5A-FIG. 5G, T1, T12, T11, T2 and T3 are arranged between CK1 and GSTVP, T12, T3 and T1 are arranged sequentially from top to bottom, and T11 and T2 are arranged sequentially from top to bottom;

The orthographic projection of the first electrode plate C2a of C2 on the base substrate partially overlaps the orthographic projection of the first voltage line VGH on the base substrate, and the orthographic projection of the second electrode plate C2b of C2 on the base substrate partially overlaps the orthographic projection of the first voltage line VGH on the base substrate;

T4, T5, T13, T8, T7 and T6 are set between GSTVN and VGL-2.

As shown in FIG. 5E, the second electrode D9 of T9 is connected to the first electrode S10 of T10, and the first electrode S10 of T10 is coupled to the first conductive connection portion L1 through the via hole, and the first conductive connection portion L1 is coupled to the driving signal output terminal OUTPUT through a via hole, so that both the second electrode D9 of T9 and the first electrode S10 of T10 are coupled to the driving signal output terminal OUTPUT.

In FIG. 5C, the one labeled L2 is the second conductive connection portion L2, and the second conductive connection portion L2 is connected to the gate electrode G10 of T10; the second conductive connection portion L2 is coupled to the second electrode D12 of T12 through a via hole, so that the gate electrode G10 of T10 is coupled to the second electrode D12 of T12;

As shown in FIG. 5G, the one labeled L3 is the third conductive connection portion;

The third conductive connection portion L3 is coupled to the first electrode S12 of T12 through the via hole, and the third conductive connection portion L3 is coupled to the second electrode D13 of T13 through the via hole, so that the first electrode S12 of T12 and the second electrode D13 of T13 are coupled;

The one labeled L4 is the fourth conductive connection portion;

The fourth conductive connection portion L4 is coupled to the third conductive connection portion L3, and the fourth conductive connection portion L4 is coupled to the second electrode D1 of T1 through a via hole, so that the first electrode S12 of T12 is coupled to the second electrode D1 of T1;

The one labeled L5 is the fifth conductive connection portion;

The fifth conductive connection portion L5 is coupled to the first clock signal line CK1 through the via hole, the fifth conductive connection portion L5 is coupled to the first electrode S6 of T6 through the via hole, and the first electrode S6 of T6 is connected to the first electrode S4 of T4, so that the first electrode S6 of T6 is coupled to the first clock signal line CK1, and the first electrode S4 of T4 is coupled to the first clock signal line CK1.

As shown in FIGS. 5A-5G, the first electrode S13 of T13 is coupled to the sixth conductive connection portion L6.

As shown in FIGS. 5A-5G, the second electrode D10 of T10 is coupled to the second second voltage line VGL-2 through a via hole;

The first electrode S13 of T13 is coupled to the first voltage line VGH through a via hole;

The first electrode S9 of T9 is coupled to the sixth conductive connection portion L6, and the sixth conductive connection portion L6 is coupled to the second electrode plate C2b of C2 through a via hole, so that the first electrodes S9 and the first electrode S13 of T13, the second electrode plate C2b of C2 and the first voltage line VGH are coupled to each other.

FIG. 6B is a layout diagram of the active layer in FIG. 6A, FIG. 6C is a layout diagram of the first gate metal layer in FIG. 6A, FIG. 6D is a layout diagram of the second gate metal layer in FIG. 6A, FIG. 6E is a layout diagram of the first source-drain metal layer in FIG. A, and FIG. 6F is a layout diagram of the second source-drain metal layer in FIG. 6A.

As shown in FIG. 6B, the one labeled 10 is the channel of T1, the one labeled 20 is the channel of T2, the one labeled 30 is the channel of T3, the one labeled 40 is the channel of T4, and the one labeled 50 is the channel of T5, the one labeled 60 is the channel of T6, the one labeled 70 is the channel of T7, the one labeled 80 is the channel of T8, the one labeled 90 is the channel of T9, and the one labeled C10 is the channel of T10, the one labeled 110 is the channel of T11, the one labeled 120 is the channel of T12, the one labeled 130 is the channel of T13.

As shown in FIG. 6C, the one labeled C1a is the first electrode plate of the first capacitor C1, the one labeled C2a is the first electrode plate of the second capacitor C2, and the one labeled C3a is the first electrode plate of the third capacitor C3;

The one labeled G1 is the gate electrode of T1, the one labeled G2-1 is the first gate electrode of T2, the one labeled G2-2 is the second gate electrode of T2, and the one labeled G3 is the gate electrode of T3, the one labeled G4 is the gate electrode of T4, the one labeled G5 is the gate electrode of T5, the one labeled G6 is the gate electrode of T6, the one labeled G7 is the gate electrode of T7, and the one labeled G8 is the gate electrode of T8, the one labeled G9 is the gate electrode of T9, the one labeled G10 is the gate electrode of T10, the one labeled G11 is the gate electrode of T11, the one labeled G12 is the gate electrode of T12, and the one labeled G13 is the gate electrode of T13.

As shown in FIG. 6D, the one labeled C1b is the second electrode plate of the first capacitor C1, the one labeled C2b is the second electrode plate of the second capacitor C2, and the one labeled C3b is the second electrode plate of the third capacitor C3;

The one labeled L1 is the first conductive connection portion.

As shown in FIG. 6E, the one labeled INPUT is the input terminal, and the one labeled OUTPUT is the driving signal output terminal;

The one labeled S1 is the first electrode of T1, and the one labeled D1 is the second electrode of T1;

The one labeled S2 is the first electrode of T2, and the one labeled D2 is the second electrode of T2;

The one labeled S3 is the first electrode of T3, and the one labeled D3 is the second electrode of T3;

The one labeled S4 is the first electrode of T4, and the one labeled D4 is the second electrode of T4;

The one labeled S6 is the first electrode of T6, and the one labeled D6 is the second electrode of T6;

The one labeled S8 is the first electrode of T8;

The second electrode D6 of T6 is multiplexed as the first electrode of T7, and the first electrode S8 of T8 is multiplexed as the second electrode of T7;

The one labeled S9 is the first electrode of T9, and the one labeled D9 is the second electrode of T9;

The one labeled S10 is the first electrode of T10, and the one labeled D10 is the second electrode of T10;

The one labeled S11 is the first electrode of T11, and the one labeled D11 is the second electrode of T11;

The one labeled S12 is the first electrode of T12, and the one labeled D12 is the second electrode of T12;

The one labeled S13 is the first electrode of T13, and the one labeled D13 is the second electrode of T13;

The first electrode S13 of T13 is multiplexed as the first electrode of T5 and the second electrode of T8; the second electrode D4 of T4 is multiplexed as the second electrode D5 of T5;

The one labeled CK1 is the first clock signal line, the one labeled CK2 is the second clock signal line, and the one labeled CK3 is the third clock signal line.

In FIG. 6F, the one labeled VGL-1 is the first second voltage line, the one labeled ESTV is the third start signal line, the one labeled GSTVN is the first start signal line, and the one labeled GSTVP is the second start signal line, the one labeled VGH is the first voltage line, and the one labeled VGL-2 is the second second voltage line.

In FIG. 6A and FIG. 6G, there are shown the via holes penetrating through the interlayer dielectric layer for connecting the active layer and the first source-drain metal layer, and the via holes penetrating through the passivation layer for connecting the gate metal layer and the first source-drain metal layer;

Wherein, the via holes penetrating through the interlayer dielectric layer are marked with black circles, and the via holes penetrating through the passivation layer are marked with black square boxes.

As shown in FIGS. 6A-6G, the third clock signal line CK3, the first clock signal line CK1, the first second voltage line VGL-1, the third start signal line ESTV, the first start signal line GSTVN, the second start signal lines GSTVP, the second clock signal line CK2, the first voltage line VGH and the second second voltage line VGL-2 are sequentially arranged along a direction close to the display area;

The third clock signal line CK3, the first clock signal line CK1, the first second voltage line VGL-1, the third start signal line ESTV, the first start signal line GSTVN, the second start signal line GSTVP, the second clock signal line CK2, the first voltage line VGH and the second second voltage line VGL-2 all extend along the vertical direction;

The sum of the width of the third clock signal line CK3 in the horizontal direction, the width of the first clock signal line CK1 in the horizontal direction, the width of the first second voltage line VGL-1 in the horizontal direction, the width the third start signal line ESTV in the horizontal direction, the width of the first start signal line GSTVN in the horizontal direction, the width of the second start signal line GSTVP in the horizontal direction, the width of the second clock signal line CK2 in the horizontal direction, the width of the first voltage line VGH in the horizontal direction and the width of the second second voltage line VGL-2 in the horizontal direction is W1;

The product of W1/W2 and the pixel pitch value P0 is greater than 18 um and less than 40 um;

The sum of the width of the first second voltage line VGL-1 in the horizontal direction, the width of the first voltage line VGH in the horizontal direction, and the width of the second second voltage line VGL-2 in the horizontal direction is W3;

W3/W2 is greater than or equal to 0.15; alternatively, W3/W2 is greater than 0.3; for example, W3/W2 can be equal to 0.015, 0.16, 0.17, 0.18, 0.19, 0.2, 0.21, 0.22, 0.23, 0.24, 0.25, 0.26, 0.27, 0.28, 0.29, 0.3, 0.31, 0.32, 0.33, 0.34, 0.35, 0.36, 0.37, 0.38, 0.39, 0.4, 0.41, 0.42, 0.43, 0.44, 0.45, 0.46, 0.47, 0.48, 0.49 or 0.5, but not limited thereto;

The sum of the width of the third clock signal line CK3 in the horizontal direction, the width of the first clock signal line CK1 in the horizontal direction and the width of the second clock signal line CK2 in the horizontal direction is W4;

W4/W2 is greater than or equal to 0.015; alternatively, W4/W2 is greater than or equal to 0.03; for example, W4/W2 can be equal to 0.015, 0.016, 0.017, 0.018, 0.019, 0.02, 0.021, 0.022, 0.023, 0.024, 0.025, 0.026, 0.027, 0.028, 0.029, 0.03, 0.031, 0.032, 0.033, 0.034, 0.035, 0.036, 0.037, 0.038, 0.039, 0.04, 0.041, 0.042, 0.043, 0.044, 0.045, 0.046, 0.047, 0.048, 0.049 or 0.05, but not limited thereto.

As shown in FIGS. 6A-6G, T1, T12, T11, T2 and T3 are arranged between CK1 and GSTVP, T12, T3 and T1 are arranged in sequence from top to bottom, and T11 and T2 are arranged in sequence from top to bottom;

The orthographic projection of the first electrode plate C2a of C2 on the base substrate partially overlaps the orthographic projection of the first voltage line VGH on the base substrate, and the orthographic projection of the second electrode plate C2b of C2 on the base substrate partially overlaps with the orthographic projection of the first voltage line VGH on the base substrate;

T4, T5, T13, T8, T7 and T6 are arranged between GSTVN and VGL-2.

As shown in FIG. 6E, the second electrode D9 of T9 is connected to the first electrode S10 of T10, and the first electrode S10 of T10 is coupled to the first conductive connection portion L1 through the via hole, and the first conductive connection portion L1 is coupled to the driving signal output terminal OUTPUT through the via hole, so that both the second electrode D9 of T9 and the first electrode S10 of T10 are coupled to the driving signal output terminal OUTPUT.

In FIG. 6C, the one labeled L2 is the second conductive connection portion, and the second conductive connection portion L2 is connected to the gate electrode G10 of T10; the second conductive connection portion L2 is coupled to the second electrode D12 of T12 through a via hole, so that the gate electrode G10 of T10 is coupled to the second electrode D12 of T12;

As shown in FIG. 6A-FIG. 6G, the one labeled L3 is the third conductive connection portion;

The third conductive connection portion L3 is coupled to the first electrode S12 of T12 through the via hole, and the third conductive connection portion L3 is coupled to the second electrode D13 of T13 through the via hole, so that the first electrode S12 of T12 and the second electrode D13 of T13 are coupled;

The one labeled L4 is the fourth conductive connection portion;

The fourth conductive connection portion L4 is coupled to the third conductive connection portion L3, and the fourth conductive connection portion L4 is coupled to the second electrode D1 of T1 through a via hole, so that the first electrode S12 of T12 is coupled to the second electrode D1 of T1;

The one labeled L5 is the fifth conductive connection portion, and the one labeled L6 is the sixth conductive connection portion;

The fifth conductive connection portion L5 is coupled to the first clock signal line CK1 through a via hole, the fifth conductive connection portion L5 is coupled to the sixth conductive connection portion L6 through a via hole, and the sixth conductive connection portion L6 is connected to the first electrode S4 of T4, so that the first electrode S4 of T4 is coupled to the first clock signal line CK1;

The fifth conductive connection portion L5 is also coupled to the first electrode S6 of T6 through a via hole, so that the first electrode S6 of T6 is coupled to the first clock signal line CK1;

The second electrode D6 of T6 is coupled to the second electrode plate C1b of C1 through a via hole.

As shown in FIGS. 6A-6G, the first electrode S13 of T13 is coupled to the seventh conductive connection portion L7.

As shown in FIGS. 6A-6G, the second electrode D10 of T10 is coupled to the second second voltage line VGL-2 through a via hole;

The first electrode S13 of T13 is coupled to the first voltage line VGH through a via hole;

The first electrode S9 of T9 is coupled to the seventh conductive connection portion L7, and the seventh conductive connection portion L7 is coupled to the second electrode plate C2b of C2 through a via hole, so that the first electrode S9 of T9, the first electrode S13 of T13, the second electrode plate C2b of C2 and the first voltage line VGH are coupled to each other.

FIG. 7B is a layout diagram of the active layer in FIG. 7A, FIG. 7C is a layout diagram of the first gate metal layer in FIG. 7A, FIG. 7D is a layout diagram of the second gate metal layer in FIG. 7A, FIG. 7E is a layout diagram of the first source-drain metal layer in FIG. 7A, and FIG. 7F is a layout diagram of the second source-drain metal layer in FIG. 7A.

As shown in FIG. 7B, the one labeled 10 is the channel of T1, the one labeled 20 is the channel of T2, the one labeled 30 is the channel of T3, the one labeled 40 is the channel of T4, and the one labeled 50 is the channel of T5, the one labeled 60 is the channel of T6, the one labeled 70 is the channel of T7, the one labeled 80 is the channel of T8, the one labeled 90 is the channel of T9, and the one labeled C10 is the channel of T10, the one labeled 110 is the channel of T11, the one labeled 120 is the channel of T12, the one labeled 130 is the channel of T13.

As shown in FIG. 7C, the one labeled C1a is the first electrode plate of the first capacitor C1, the one labeled C2a is the first electrode plate of the second capacitor C2, and the one labeled C3a is the first electrode plate of the third capacitor C3;

The one labeled G1 is the gate electrode of T1, the one labeled G2-1 is the first gate electrode of T2, the one labeled G2-2 is the second gate electrode of T2, and the one labeled G3 is the gate electrode of T3, the one labeled G4 is the gate electrode of T4, the one labeled G5 is the gate electrode of T5, the one labeled G6 is the gate electrode of T6, the one labeled G7 is the gate electrode of T7, and the one labeled G8 is the gate electrode of T8, the one labeled G9 is the gate electrode of T9, the one labeled G10 is the gate electrode of T10, the one labeled G11 is the gate electrode of T11, the one labeled G12 is the gate electrode of T12, and the one labeled G13 is the gate electrode of T13.

As shown in FIG. 7D, the one labeled C1b is the second electrode plate of the first capacitor C1, the one labeled C2b is the second electrode plate of the second capacitor C2, and the one labeled C3b is the second electrode plate of the third capacitor C3;

The one labeled L1 is the first conductive connection portion.

As shown in FIG. 7E, the one labeled INPUT is the input terminal, and the one labeled OUTPUT is the driving signal output terminal;

The one labeled S1 is the first electrode of T1; the first electrode S12 of T12 is multiplexed as the second electrode of T1;

The one labeled S2 is the first electrode of T2, and the one labeled D2 is the second electrode of T2;

The one labeled S3 is the first electrode of T3, and the one labeled D3 is the second electrode of T3;

The one labeled S4 is the first electrode of T4, and the one labeled D4 is the second electrode of T4;

The one labeled S6 is the first electrode of T6, and the one labeled D6 is the second electrode of T6;

The second electrode D6 of T6 is multiplexed as the first electrode of T7, and the first electrode of T8 is multiplexed as the second electrode of T7;

The one labeled S9 is the first electrode of T9, and the one labeled D9 is the second electrode of T9;

The one labeled S10 is the first electrode of T10, and the one labeled D10 is the second electrode of T10;

The one labeled S11 is the first electrode of T11, and the one labeled D11 is the second electrode of T11;

The one labeled S12 is the first electrode of T12, and the one labeled D12 is the second electrode of T12;

The one labeled S13 is the first electrode of T13, and the one labeled D13 is the second electrode of T13;

The first electrode S13 of T13 is multiplexed as the first electrode of T5 and the second electrode of T8; the second electrode D4 of T4 is multiplexed as the second electrode of T5;

The one labeled CK1 is the first clock signal line, the one labeled CK2 is the second clock signal line, and the one labeled CK3 is the third clock signal line.

In FIG. 7F, the one labeled VGL-1 is the first second voltage line, the one labeled ESTV is the third start signal line, the one labeled GSTVN is the first start signal line, and the one labeled GSTVP is the second start signal line, the one labeled VGH is the first voltage line, and the one labeled VGL-2 is the second second voltage line.

In FIG. 7A and FIG. 7G, there are shown the via holes penetrating through the interlayer dielectric layer for connecting the active layer and the first source-drain metal layer, and the via holes penetrating through the passivation layer for connecting the gate metal layer and the first source-drain metal layer;

Wherein, the via holes penetrating through the interlayer dielectric layer are marked with black circles, and the via holes penetrating through the passivation layer are marked with black square boxes.

As shown in FIG. 7A-FIG. 7G, the third clock signal line CK3, the first clock signal line CK1, the first second voltage line VGL-1, the third start signal line ESTV, the first start signal line GSTVN, the second start signal line GSTVP, a second clock signal line CK2, a first voltage line VGH and a second second voltage line VGL-2 are sequentially arranged along a direction close to the display area;

The third clock signal line CK3, the first clock signal line CK1, the first second voltage line VGL-1, the third start signal line ESTV, the first start signal line GSTVN, the second start signal line GSTVP, the second clock signal line CK2, the first voltage line VGH and the second second voltage line VGL-2 all extend along the vertical direction;

The sum of the width of the third clock signal line CK3 in the horizontal direction, the width of the first clock signal line CK1 in the horizontal direction, the width of the first second voltage line VGL-1 in the horizontal direction, the width of the third start signal line ESTV in the horizontal direction, the width of the first start signal line GSTVN in the horizontal direction, the width of the second start signal line GSTVP in the horizontal direction, the width of the second clock signal line CK2 in the horizontal direction, the width of the first voltage line VGH in the horizontal direction and the width of the second second voltage line VGL-2 in the horizontal direction is W1;

The product of W1/W2 and the pixel pitch value P0 is greater than 18 um and less than 40 um;

The sum of the width of the first second voltage line VGL-1 in the horizontal direction, the width of the first voltage line VGH in the horizontal direction, and the width of the second second voltage line VGL-2 in the horizontal direction is W3;

W3/W2 is greater than or equal to 0.15; alternatively, W3/W2 is greater than or equal to 0.3; for example, W3/W2 can be equal to 0.15, 0.16, 0.17, 0.18, 0.19, 0.2, 0.21, 0.22, 0.23, 0.24, 0.25, 0.26, 0.27, 0.28, 0.29, 0.3, 0.31, 0.32, 0.33, 0.34, 0.35, 0.36, 0.37, 0.38, 0.39, 0.4, 0.41, 0.42, 0.43, 0.44, 0.45, 0.46, 0.47, 0.48, 0.49 or 0.5, but not limited thereto;

The sum of the width of the third clock signal line CK3 in the horizontal direction, the width of the first clock signal line CK1 in the horizontal direction and the width of the second clock signal line CK2 in the horizontal direction is W4;

W4/W2 is greater than or equal to 0.015; alternatively, W4/W2 is greater than or equal to 0.03; for example, W4/W2 can be equal to 0.015, 0.016, 0.017, 0.018, 0.019, 0.02, 0.021, 0.022, 0.023, 0.024, 0.025, 0.026, 0.027, 0.028, 0.029, 0.03, 0.031, 0.032, 0.033, 0.034, 0.035, 0.036, 0.037, 0.038, 0.039, 0.04, 0.041, 0.042, 0.043, 0.044, 0.045, 0.046, 0.047, 0.048, 0.049 or 0.05, but not limited thereto.

As shown in FIG. 7A-FIG. 7G, T12, T11, T2 and T3 are arranged between CK1 and GSTVP, T12, T3 and T1 are arranged sequentially from top to bottom, and T11 and T2 are arranged sequentially from top to bottom;

The orthographic projection of the first electrode plate C2a of C2 on the base substrate partially overlaps the orthographic projection of the first voltage line VGH on the base substrate, and the orthographic projection of the second electrode plate C2b of C2 on the base substrate partially overlaps the orthographic projection of the first voltage line VGH on the base substrate;

T1, T4, T5, T13, T8, T7 and T6 are arranged between GSTVN and VGL-2.

As shown in FIG. 7E, the second electrode D9 of T9 is connected to the first electrode S10 of T10, and the first electrode S10 of T10 is coupled to the first conductive connection portion L1 through the via hole, and the first conductive connection portion L1 is coupled to the driving signal output terminal OUTPUT through the via hole, so that both the second electrode D9 of T9 and the first electrode S10 of T10 are coupled to the driving signal output terminal OUTPUT.

In FIG. 7C, the one labeled L2 is the second conductive connection portion, and the second conductive connection portion L2 is connected to with the gate electrode G10 of T10; the second conductive connection portion L2 is coupled to the first electrode plate C3b of C3, so that the gate electrode G10 of T10 is coupled to the first electrode plate C3b of C3;

The gate electrode G4 of T4 is coupled to the second conductive connection portion L2, so that the gate electrode G4 of T4 is coupled to the gate electrode G10 of T10;

The second electrode D12 of T12 is coupled to the gate electrode G4 of T4 through a via hole;

As shown in FIGS. 7A-7G, the first electrode S12 of T12 is coupled to the second electrode D13 of T13;

The one labeled L5 is the fifth conductive connection portion, and the one labeled L6 is the sixth conductive connection portion;

The fifth conductive connection portion L5 is coupled to the first clock signal line CK1 through a via hole, the fifth conductive connection portion L5 is coupled to the sixth conductive connection portion L6 through a via hole, and the sixth conductive connection portion L6 is connected to the first electrode S4 of T4, so that the first electrode S4 of T4 is coupled to the first clock signal line CK1;

The fifth conductive connection portion L5 is also coupled to the first electrode S6 of T6 through a via hole, so that the first electrode S6 of T6 is coupled to the first clock signal line CK1;

The second electrode D6 of T6 is coupled to the eighth conductive connection portion L8 through the via hole, and the eighth conductive connection portion L8 is coupled to the ninth conductive connection portion L9 through the via hole, and the ninth conductive connection portion L9 is coupled to the second electrode plate C1b of C1 through a via hole, so that the second electrode D6 of T6 is coupled to the second electrode plate C1b of C1; the second electrode plate C1b of C1 is connected to the gate electrode G6 of T6.

As shown in FIGS. 7A-7G, the first electrode S13 of T13 is coupled to the seventh conductive connection portion L7.

As shown in FIGS. 7A-7G, the second electrode D10 of T10 is coupled to the second second voltage line VGL-2 through a via hole;

The first electrode S13 of T13 is coupled to the first voltage line VGH through a via hole, the first electrode S9 of T9 is coupled to the seventh conductive connection portion L7, and the seventh conductive connection portion L7 is coupled to the second electrode plate C2b of C2 through via holes, so that the first electrode S9 of T9, the first electrode S13 of T13, the second electrode plate C2b of C2 and the first voltage line VGH are coupled to each other.

Figure 9:
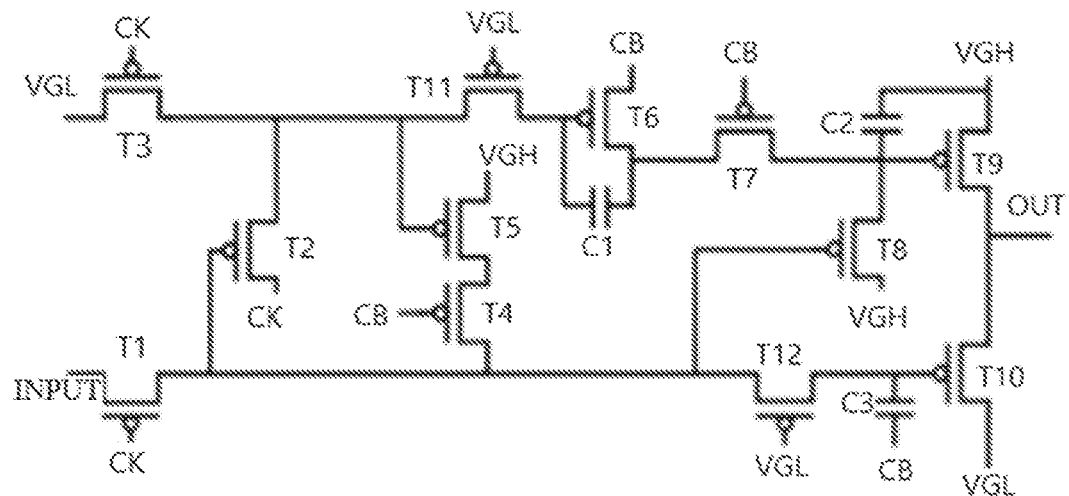
FIG. 9 is a circuit diagram of a shift register unit according to at least one embodiment.

In at least one embodiment of the present disclosure, the shift register unit may include a plurality of signal lines, a plurality of transistors, and a plurality of capacitors;

As shown in FIG. 9, the plurality of signal lines include a first voltage line VGH, a second voltage line VGL, a first clock signal line CK1 and a second clock signal line CK2, and the plurality of transistors include: a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11 and a twelfth transistor T12; the plurality of capacitors include: a first capacitor C1, a second capacitor C2, and a third capacitor C3;

The gate electrode of the first transistor T1 is coupled to the first clock signal line CK1, the first electrode of the first transistor T1 is coupled to the input terminal INPUT, and the second electrode of the first transistor T1 is coupled to the gate electrode of the second transistor T2;

The first electrode of the second transistor T2 is coupled to the first clock signal line CK1, and the second electrode of the second transistor T2 is coupled to the second electrode of the third transistor T3;

The gate electrode of the third transistor T3 is coupled to the first clock signal line, and the first electrode of the third transistor T3 is coupled to the second voltage line VGL;

The gate electrode of the fourth transistor T4 is coupled to the second clock signal line CK2, the first electrode of the fourth transistor T4 is coupled to the second electrode of the fifth transistor T5, and the second electrode of the fourth transistor T4 is coupled to the gate electrode of the second transistor T2;

The gate electrode of the fifth transistor T5 is coupled to the second electrode of the third transistor T3, and the first electrode of the fifth transistor T5 is coupled to the first voltage line VGH;

The gate electrode of the sixth transistor T6 is coupled to the second electrode of the eleventh transistor T11, the first electrode of the sixth transistor T6 is coupled to the second clock signal line CK2, and the second electrode of the sixth transistor T6 is coupled to the first electrode of the seventh transistor T7;

The gate electrode of the seventh transistor T7 is coupled to the second clock signal line CK2, and the second electrode of the seventh transistor T7 is coupled to the gate electrode of the ninth transistor T9;

The gate electrode of the eighth transistor T8 is coupled to the gate electrode of the second transistor T2, the first electrode of the eighth transistor T8 is coupled to the first voltage line VGH, and the second electrode of the eighth transistor T8 is coupled to the gate electrode of the ninth transistor T9;

The first electrode of the ninth transistor T9 is coupled to the first voltage line VGH, and the second electrode of the ninth transistor T9 is coupled to the driving signal output terminal OUT;

The gate electrode of the tenth transistor T10 is coupled to the second electrode of the twelfth transistor T12, the first electrode of the tenth transistor T10 is coupled to the second voltage line VGL, and the second electrode of the tenth transistor T10 is coupled to the driving signal output terminal OUT;

The gate electrode of the eleventh transistor T11 is coupled to the second voltage line VGL, and the first electrode of the eleventh transistor T11 is coupled to the second electrode of the second transistor T2;

The gate electrode of the twelfth transistor T12 is coupled to the second voltage line VGL, and the first electrode of the twelfth transistor T12 is coupled to the gate electrode of the second transistor T2;

The first electrode plate of the first capacitor C1 is coupled to the gate electrode of the sixth transistor T6, and the second electrode plate of the first capacitor C1 is coupled to the second electrode of the sixth transistor T6;

The first electrode plate of the second capacitor C2 is coupled to the gate electrode of the ninth transistor T9, and the second electrode plate of the second capacitor C2 is coupled to the first voltage line VGH;

A first electrode plate of the third capacitor C3 is coupled to the gate electrode of the tenth transistor T10, and a second electrode plate of the third capacitor C3 is coupled to the second clock signal line CK2.

In the embodiment of the present disclosure, the structure of the shift register unit is not limited to that shown in FIG. 1 and FIG. 9, and the structure of the shift register unit may have other variations.

The display device described in the embodiment of the present disclosure includes the above-mentioned display substrate.

The display device provided by the embodiments of the present disclosure may be any product or component with a display function, such as a mobile phone, a tablet computer, a television, a monitor, a notebook computer, a digital photo frame, a navigator, and the like.

The following are the relationship among the sum W1 of widths of a plurality of signal lines set in the driving circuit area where the shift register unit is located in the second direction in various display products, the width W2 of the shift register unit in the second direction, and the pixel pitch values P0.

For display product 1, the shift register unit is the first shift register unit for providing an n-type driving signal, W1 is equal to 94 um, W2 is equal to 147 um, W1/W2 is equal to 0.64, the resolution is 1440×3088, and the PPI is 494, the pixel pitch value P0 is 51.4 um, 1000×(W1/W2)×PPI is equal to 1.29, P0×(W1/W2) is equal to 32.9 um; PPI is the number of pixels per inch;

For display product 2, the shift register unit is the first shift register unit for providing n-type driving signal, W1 is equal to 101.5 um, W2 is equal to 243 um, W1/W2 is equal to 0.42, the resolution is 1768×2208, and the PPI is 373, the pixel pitch value P0 is 68.01 um, 1000×(W1/W2)×PPI is equal to 1.12, P0×(W1/W2) is equal to 28.56 um;

For display product 3, the shift register unit is the first shift register unit for providing n-type driving signals, W1 is equal to 84.1 um, W2 is equal to 151.6 um, W1/W2 is equal to 0.55, and the resolution is 1440×3200, PPI is 515, the pixel pitch value P0 is 49.32 um, 1000×(W1/W2)×PPI is equal to 1.08, and P0×(W1/W2) is equal to 27.13 um.

For the display product in the further expanded embodiment, the relationship among the sum W1 of widths of the plurality of signal lines set in the driving circuit area where the shift register unit is located in the second direction, the width W2 of the shift register unit in the second direction and the pixel pitch value P0 is as follows:

For display products with higher resolution, W1 is equal to 85 um, W2 is 150 um, W1/W2 is equal to 0.57, PPI is 500, pixel pitch value P0 is equal to 46.2 um, 100×(W1/W2)/PPI is equal to 1.03, P0×(W1/W2) is equal to 26.32 um;

For display products with narrower borders, W1 is equal to 85 um, W2 is 130 um, W1/W2 is equal to 0.65, PPI is 500, pixel pitch value P0 is equal to 50.8 um, 100×(W1/W2)/PPI is equal to 1.3, P0×(W1/W2) is equal to 33.02 um;

For display products with higher resolution and narrower borders, W1 is equal to 85 um, W2 is 130 um, W1/W2 is equal to 0.65, PPI is 500, and the pixel pitch value P0 is equal to 46.2 um, 100×(W1/W2)/PPI is equal to 1.19, and P0×(W1/W2) is equal to 30.02 um.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A display substrate, comprising:
   a base substrate including a display area and a peripheral area located on at least one side of the display area;
   a pixel array, located in the display area and including a plurality of pixel units; and,
   a scan driving module, located in a driving circuit area of the peripheral area, and including a plurality of shift register units, a plurality of signal lines being arranged in one shift register unit of the plurality of shift register units, and the plurality of signal lines extending along a first direction;
   wherein a ratio of a sum W1 of widths of the plurality of signal lines in a second direction to a width W2 of the shift register unit in the second direction is W1/W2, and a length of at least one pixel unit along the first direction is a pixel pitch value; the first direction intersects the second direction;
   a product of W1/W2 and the pixel pitch value is greater than 18 um and less than 40 um.

2. The display substrate according to claim 1, wherein the plurality of signal lines include all signal lines in the shift register unit.

3. The display substrate according to claim 1, wherein the plurality of signal lines include all signal lines overlapping an orthographic projection of the shift register unit on the base substrate.

4. The display substrate according to claim 1, wherein W1/W2 is greater than 0.4 and less than 0.7.

5. The display substrate according to claim 1, wherein a product of W1/W2 and the pixel pitch value is greater than 27 um and less than 36 um;
   or
   the product of W1/W2 and the pixel pitch value is greater than 18 um and less than or equal to 27 um;
   or
   the product of W1/W2 and the pixel pitch value is greater than or equal to 36 um and less than 40 um;
   or
   the product of W1/W2 and the pixel pitch value is greater than 29 um and less than 35 um.

6. The display substrate according to claim 1, wherein the display substrate comprises a first conductive layer, an insulating layer, and a second conductive layer, and the insulating layer is arranged between the first conductive layer and the second conductive layer;
- at least one signal line of the plurality of signal lines is arranged on the first conductive layer, and at least one signal line of the plurality of signal lines is arranged on the second conductive layer.

7. The display substrate according to claim 1, wherein the shift register unit includes at least one transistor arranged in the driving circuit area, a first electrode of the transistor, a second electrode of the transistor and the plurality of signals lines are arranged on a same layer;
or
wherein the shift register unit includes at least one transistor arranged in the driving circuit area, a first electrode of the transistor and a second electrode of the transistor are arranged on a same layer, and the plurality of signal lines and the first electrode of the transistor are arranged at different layers.

8. The display substrate according to claim 1, wherein the shift register unit includes at least one signal line arranged in the driving circuit area, the at least one signal line is configured to provide a DC power signal;
- a ratio W3/W2 of a width W3 of the at least one signal line in the second direction to the width W2 of the shift register unit in the second direction is greater than or equal to 0.15;
or
the ratio W3/W2 of the width W3 of the at least one signal line in the second direction to the width W2 of the shift register unit in the second direction is greater than or equal to 0.3.

9. The display substrate according to claim 1, wherein the shift register unit comprises at least one signal line arranged in the driving circuit area, the at least one signal line is configured to provide a clock signal;
- a ratio W4/W2 of a width W4 of the at least one signal line in the second direction to the width W2 of the shift register unit in the second direction is greater than or equal to 0.015;
or
the ratio W4/W2 of the width W4 of the at least one signal line in the second direction to the width W2 of the shift register unit in the second direction is greater than or equal to 0.03.

10. The display substrate according to claim 1, wherein the shift register unit comprises at least two transistors arranged in the driving circuit area;
- active layers of the at least two transistors are formed by a continuous semiconductor layer, and an orthographic projection of one signal line of the plurality of signal lines on the base substrate partially overlaps an orthographic projection of the semiconductor layer on the base substrate.

11. The display substrate according to claim 1, wherein the shift register unit comprises a fourth transistor, a fifth transistor, an eighth transistor and a thirteenth transistor; a second electrode of the fourth transistor is coupled to a second electrode of the fifth transistor, a second electrode of the eighth transistor, a first electrode of the fifth transistor, and a first electrode of the thirteenth transistor are coupled to each other;
- an active layer of the fourth transistor, an active layer of the fifth transistor, an active layer of the thirteenth transistor, and an active layer of the eighth transistor are formed by a continuous first semiconductor layer;
- an orthographic projection of the active layer of the fourth transistor on the base substrate, an orthographic projection of the active layer of the fifth transistor on the base substrate, an orthographic projection of the active layer of the eighth transistor on the base substrate and an orthographic projection of a part of the active layer of the thirteenth transistor on the base substrate together form an E-type pattern or an F-type pattern;
- the orthographic projection of the active layer of the fourth transistor on the base substrate and the orthographic projection of the active layer of the fifth transistor on the base substrate together form an L-type pattern,
- wherein the shift register unit comprises a plurality of signal lines, and the plurality of signal lines comprises a first voltage line;
- an orthographic projection of the first voltage line on the base substrate partially overlaps an orthographic projection of the first semiconductor layer on the base substrate;
or
wherein the shift register unit comprises the plurality of signal lines, and the plurality of signal lines comprises a second clock signal line;
- an orthographic projection of the second clock signal line on the base substrate partially overlaps the orthographic projection of the first semiconductor layer on the base substrate;
or
wherein a channel of the fourth transistor extends along the second direction, a channel of the fifth transistor extends along the first direction, a channel of the thirteenth transistor extends along the second direction, and a channel of the eighth transistor extends along the first direction.

12. The display substrate according to claim 1, wherein the shift register unit comprises a second transistor and a third transistor; a second electrode of the second transistor is coupled to a second electrode of the third transistor;
- an active layer of the second transistor and an active layer of the third transistor are formed by a continuous fourth semiconductor layer, and an orthographic projection of the active layer of the second transistor on the base substrate and an orthographic projection of the active layer of the third transistor on the base substrate together form an I-type pattern,
- wherein a channel of the second transistor extends along the first direction, and a channel of the third transistor extends along the first direction.

13. The display substrate according to claim 1, wherein the shift register unit comprises a second transistor, a third transistor and an eleventh transistor; a second electrode of the second transistor is coupled to a second electrode of the third transistor; a first electrode of the eleventh transistor is coupled to a second electrode of the third transistor;
- an active layer of the second transistor, an active layer of the third transistor and an active layer of the eleventh transistor are formed by a continuous fifth semiconductor layer, and an orthographic projection of the active layer of the second transistor on the base substrate, an orthographic projection of the active layer of the third transistor on the base substrate, and an orthographic projection of the active layer of the eleventh transistor on the base substrate together form a T-type pattern, wherein the plurality of signal lines comprises a third start signal line;

an orthographic projection of the fifth semiconductor layer on the base substrate partially overlaps an orthographic projection of the third start signal line on the base substrate;

or wherein both a channel of the second transistor and a channel of the third transistor extend along the first direction, and a channel of the eleventh transistor extends along the second direction.

14. The display substrate according to claim 1, wherein the shift register unit comprises a sixth transistor, a seventh transistor and an eighth transistor;

a second electrode of the sixth transistor is coupled to a first electrode of the seventh transistor, and a first electrode of the eighth transistor is coupled to a second electrode of the seventh transistor;

an orthographic projection of the active layer of the eighth transistor on the base substrate, an orthographic projection of the active layer of the seventh transistor on the base substrate, and an orthographic projection of the active layer of the sixth transistor on the base substrate together form an n-type pattern, wherein the shift register unit further comprises a fourth transistor, a fifth transistor, an eighth transistor, and a thirteenth transistor; a second electrode of the fourth transistor is coupled to a second electrode of the fifth transistor, a second electrode of the eighth transistor, a first electrode of the fifth transistor, and a first electrode of the thirteenth transistor are coupled to each other;

an active layer of the fourth transistor, an active layer of the fifth transistor, an active layer of the thirteenth transistor, an active layer of the eighth transistor, an active layer of the seventh transistor and an active layer of the sixth transistor are formed by a continuous second semiconductor layer;

or wherein the shift register unit comprises a plurality of signal lines, and the plurality of signal lines comprises a first voltage line;

an orthographic projection of the first voltage line on the base substrate partially overlaps an orthographic projection of the second semiconductor layer on the base substrate or wherein a channel of the fourth transistor extends along the second direction, a channel of the fifth transistor extends along the first direction, a channel of the thirteenth transistor extends along the second direction, a channel of the eighth transistor extends along the first direction, a channel of the seventh transistor extends along the first direction, and a channel of the sixth transistor extends along the second direction.

15. The display substrate according to claim 1, wherein the shift register unit comprises a first transistor, a fifth transistor, an eighth transistor, a twelfth transistor and a thirteenth transistor;

a second electrode of the eighth transistor, a first electrode of the fifth transistor, and a first electrode of the thirteenth transistor are coupled to each other; a first electrode of the twelfth transistor is coupled to a second electrode of the first transistor, a second electrode of the twelfth transistor is coupled to a second electrode of the thirteenth transistor;

an orthographic projection of the active layer of the first transistor on the base substrate, an orthographic projection of the active layer of the fifth transistor on the base substrate, and an orthographic projection of the active layer of the eighth transistor on the base substrate, an orthographic projection of the active layer of the twelfth transistor on the base substrate, and an orthographic projection of the active layer of the thirteenth transistor on the base substrate together form an H-type pattern.

16. The display substrate according to claim 15, wherein the shift register unit further comprises a fourth transistor, a seventh transistor and a sixth transistor;

a second electrode of the fourth transistor is coupled to a second electrode of the fifth transistor; a first electrode of the sixth transistor is coupled to a first electrode of the seventh transistor; a first electrode of the fourth transistor is coupled to a first electrode of the sixth transistor;

an active layer of the first transistor, an active layer of the fourth transistor, an active layer of the fifth transistor, an active layer of the thirteenth transistor, an active layer of the twelfth transistor, an active layer of the eighth transistor, an active layer of the seventh transistor and an active layer of the sixth transistor are formed by a continuous third semiconductor layer, wherein the shift register unit comprises a plurality of signal lines, and the plurality of signal lines comprises a first voltage line;

an orthographic projection of the first voltage line on the base substrate partially overlaps an orthographic projection of the third semiconductor layer on the base substrate;

or wherein a channel of the fourth transistor extends along the second direction, a channel of the fifth transistor extends along the first direction, a channel of the thirteenth transistor extends along the second direction, a channel of the twelfth transistor and a channel of the first transistor extend along the first direction, a channel of the eighth transistor and a channel of the seventh transistor extend along the first direction, and a channel of the sixth transistor extends along a second direction.

17. The display substrate according to claim 1, wherein the shift register unit includes at least two transistors arranged in the driving circuit area; active layers of the at least two transistors are formed by a continuous semiconductor layer;

a shape of at least part of semiconductor pattern included in the semiconductor layer is a π-type.

18. The display substrate according to claim 1, wherein the shift register unit comprises a plurality of signal lines, a plurality of transistors and a plurality of capacitors;

the plurality of signal lines include: a first voltage line, a second voltage line, a first clock signal line, a second clock signal line, and a third clock signal line, and the plurality of transistors include: a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor and a thirteenth transistor; the plurality of capacitors include: a first capacitor, a second capacitor and a third capacitor;

a gate electrode of the first transistor is coupled to the third clock signal line, a first electrode of the first transistor is coupled to an input terminal, a second electrode of the first transistor is coupled to a gate electrode of the second transistor;

a first electrode of the second transistor is coupled to the third clock signal line, and a second electrode of the second transistor is coupled to a second electrode of the third transistor;

a gate electrode of the third transistor is coupled to the third clock signal line, and a first electrode of the third transistor is coupled to the second voltage line;

a gate electrode of the fourth transistor is coupled to a gate electrode of the tenth transistor, a first electrode of the fourth transistor is coupled to the first clock signal line, a second electrode of the fourth transistor is coupled to a second electrode of the fifth transistor;

a gate electrode of the fifth transistor is coupled to the second electrode of the third transistor, and a first electrode of the fifth transistor is coupled to the first voltage line;

a gate electrode of the sixth transistor is coupled to a second electrode of the eleventh transistor, a first electrode of the sixth transistor is coupled to the first clock signal line, and a second electrode of the sixth transistor is coupled to a first electrode of the seventh transistor;

a gate electrode of the seventh transistor is coupled to the first clock signal line, and a second electrode of the seventh transistor is coupled to a gate electrode of the ninth transistor;

a gate electrode of the eighth transistor is coupled to a gate electrode of the thirteenth transistor, a first electrode of the eighth transistor is coupled to a gate electrode of the ninth transistor, and a second electrode of the eighth transistor is coupled to the first voltage line;

a first electrode of the ninth transistor is coupled to the first voltage line, and a second electrode of the ninth transistor is coupled to a driving signal output terminal;

a first electrode of the tenth transistor is coupled to the driving signal output terminal, and a second electrode of the tenth transistor is coupled to the second voltage line;

a gate electrode of the eleventh transistor is coupled to the second voltage line, and a first electrode of the eleventh transistor is coupled to the gate electrode of the fifth transistor;

a gate electrode of the twelfth transistor is coupled to the second voltage line, a first electrode of the twelfth transistor is coupled to the second electrode of the first transistor, and a second electrode of the twelfth transistor is electrically connected to the gate electrode of the tenth transistor;

a gate electrode of the thirteenth transistor is coupled to the second clock signal line, a first electrode of the thirteenth transistor is coupled to the first voltage line, a second electrode of the thirteenth transistor is coupled to the gate electrode of the second transistor;

a first electrode plate of the first capacitor is coupled to the gate electrode of the sixth transistor, and a second electrode plate of the first capacitor is coupled to the second electrode of the sixth transistor;

a first electrode plate of the second capacitor is coupled to the gate electrode of the ninth transistor, and a second electrode plate of the second capacitor is coupled to the first voltage line;

a first electrode plate of the third capacitor is coupled to the gate electrode of the tenth transistor, and a second electrode plate of the third capacitor is coupled to the second electrode of the fourth transistor.

19. The display substrate according to claim 1, wherein the shift register unit may include a plurality of signal lines, a plurality of transistors, and a plurality of capacitors;

the plurality of signal lines include a first voltage line, a second voltage line, a first clock signal line and a second clock signal line, and the plurality of transistors include: a first transistor, a second transistor, a third transistor, a fourth transistor, a fifth transistor, a sixth transistor, a seventh transistor, an eighth transistor, a ninth transistor, a tenth transistor, an eleventh transistor and a twelfth transistor; the plurality of capacitors include: a first capacitor, a second capacitor, and a third capacitor;

a gate electrode of the first transistor is coupled to the first clock signal line, a first electrode of the first transistor is coupled to an input terminal, and a second electrode of the first transistor is coupled to a gate electrode of the second transistor;

a first electrode of the second transistor is coupled to the first clock signal line, and a second electrode of the second transistor is coupled to a second electrode of the third transistor;

a gate electrode of the third transistor is coupled to the first clock signal line, and a first electrode of the third transistor is coupled to the second voltage line;

a gate electrode of the fourth transistor is coupled to the second clock signal line, a first electrode of the fourth transistor is coupled to a second electrode of the fifth transistor, and a second electrode of the fourth transistor is coupled to the gate electrode of the second transistor;

a gate electrode of the fifth transistor is coupled to the second electrode of the third transistor, and a first electrode of the fifth transistor is coupled to the first voltage line;

a gate electrode of the sixth transistor is coupled to a second electrode of the eleventh transistor, a first electrode of the sixth transistor is coupled to the second clock signal line, and a second electrode of the sixth transistor is coupled to a first electrode of the seventh transistor;

a gate electrode of the seventh transistor is coupled to the second clock signal line, and a second electrode of the seventh transistor is coupled to a gate electrode of the ninth transistor;

a gate electrode of the eighth transistor is coupled to the gate electrode of the second transistor, a first electrode of the eighth transistor is coupled to the first voltage line, and a second electrode of the eighth transistor is coupled to the gate electrode of the ninth transistor;

a first electrode of the ninth transistor is coupled to the first voltage line, and a second electrode of the ninth transistor is coupled to a driving signal output terminal;

a gate electrode of the tenth transistor is coupled to the second electrode of the twelfth transistor, a first electrode of the tenth transistor is coupled to the second voltage line, and a second electrode of the tenth transistor is coupled to the driving signal output terminal;

a gate electrode of the eleventh transistor is coupled to the second voltage line, and a first electrode of the eleventh transistor is coupled to the second electrode of the second transistor;

a gate electrode of the twelfth transistor is coupled to the second voltage line, and a first electrode of the twelfth transistor is coupled to the gate electrode of the second transistor;

a first electrode plate of the first capacitor is coupled to the gate electrode of the sixth transistor, and a second electrode plate of the first capacitor is coupled to the second electrode of the sixth transistor;

a first electrode plate of the second capacitor is coupled to the gate electrode of the ninth transistor, and a second electrode plate of the second capacitor is coupled to the first voltage line;

a first electrode plate of the third capacitor is coupled to the gate electrode of the tenth transistor, and a second electrode plate of the third capacitor is coupled to the second clock signal line.

20. A display device comprising the display substrate according to claim 1.

* * * * *